(12) United States Patent
Koul et al.

(10) Patent No.: US 11,955,946 B2
(45) Date of Patent: Apr. 9, 2024

(54) TUNABLE BANDPASS FILTER FOR MILLIMETER-WAVE SIGNALS

(71) Applicant: Synergy Microwave Corporation, Paterson, NJ (US)

(72) Inventors: Shiban K. Koul, Delhi (IN); Ajay Kumar Poddar, Elmwood Park, NJ (US); Sukomal Dey, Palakkad District (IN); Ulrich L. Rohde, Upper Saddle River, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 257 days.

(21) Appl. No.: 17/221,920

(22) Filed: Apr. 5, 2021

(65) Prior Publication Data
US 2022/0060163 A1 Feb. 24, 2022

Related U.S. Application Data

(60) Provisional application No. 63/066,916, filed on Aug. 18, 2020.

(51) Int. Cl.
*H03H 7/12* (2006.01)
*H03F 3/19* (2006.01)
(Continued)

(52) U.S. Cl.
CPC ............... *H03H 7/12* (2013.01); *H03F 3/19* (2013.01); *H03H 7/0115* (2013.01);
(Continued)

(58) Field of Classification Search
CPC .......... H03H 2015/005; H03H 9/6403; H03H 7/0161; H03H 2007/006; H03H 7/12
(Continued)

(56) References Cited

U.S. PATENT DOCUMENTS 3,368,169 A 2/1968 Carter et al.
5,406,234 A 4/1995 Willems
(Continued)

OTHER PUBLICATIONS

A. S. A. El-Hameed, A. Barakat, A. B. Abdel Rahman, A. Allam, and R. K. Pokharel, "Ultracompact 60-GHz CMOS BPF employing broadside-coupled open-loop resonators," IEEE Microw. Wireless Compon. Lett., vol. 27, No. 9, pp. 818-820, Sep. 2017.
(Continued)

*Primary Examiner* — Rakesh B Patel
(74) *Attorney, Agent, or Firm* — Lerner David LLP

(57) ABSTRACT

A tunable passband filter including a signal input port for receiving an input radio frequency (RF) signal, a signal output port for transmitting a filtered output RF signal, a first high-pass section having a first tunable microelectromechanical system (MEMS) switch array to receive the input RF signal from the signal input port, a second high-pass section having a second tunable MEMS switch array to transmit the output RF signal to the signal output port, and a low pass section operatively coupled between the first high-pass section and the second high-pass section, and having each of a first tunable MEMS bridge array, a second tunable MEMS bridge array, and a high impedance line. The tunable passband filter is configured to filter the input RF signal to yield the filtered output RF signal.

43 Claims, 55 Drawing Sheets

(51) Int. Cl.
H03H 7/01 (2006.01)
H03H 9/64 (2006.01)
H03H 7/00 (2006.01)
H03H 15/00 (2006.01)

(52) U.S. Cl.
CPC ........ *H03H 7/0161* (2013.01); *H03H 9/6403* (2013.01); *H03H 2007/006* (2013.01); *H03H 2015/005* (2013.01)

(58) Field of Classification Search
USPC ........................................ 333/175, 186, 193
See application file for complete search history.

(56) References Cited

U.S. PATENT DOCUMENTS

| | | | |
|---|---|---|---|
| 6,553,216 B1 | 4/2003 | Pugel et al. | |
| 2003/0137284 A1* | 7/2003 | DiPiazza | H03H 7/20 323/212 |
| 2005/0184828 A1 | 8/2005 | Son et al. | |
| 2010/0311383 A1* | 12/2010 | Abbaspour-Tamijani | H01P 5/12 455/340 |

OTHER PUBLICATIONS

A.-L. Franc, E. Pistono, D. Gloria, and P. Ferrari, "High-performance shielded coplanar waveguides for the design of CMOS 60-GHz bandpass filters," IEEE Trans. Electron Devices, vol. 59, No. 5, pp. 1219-1226, May 2012.

Abbaspour-Sani, E., N. Nasirzadeh, and G. R. Dadashzadeh, "Two novel structures for tunable MEMS capacitors with RFapplications," Progress in Electromagnetics Research, vol. 68, pp. 169-183, Jan. 2007.

C.-L. Yang, S.-Y. Shu, and Y.-C. Chiang, "Design of a K-band chip filter with three tunable transmission zeros using a standard 0.13-? mCMOS technology," IEEE Trans. Circuits Syst. II, Exp. Briefs, vol. 57, No. 7, pp. 522-526, Jul. 2010.

Entesari, K. and G. M. Rebeiz, "A differential 4-bit 6.5-10 GHz RF MEMS tunable filter," IEEE Transaction of Microwave Theory and Techniques, vol. 53, No. 3, Part 2, 1103-1110, Mar. 2005.

F. A. C. S. Lucena, C. P. N. Silva, T. L. Pedrosa and M. T. de Melo, "Gain Enhancement of Dual-band Antenna Using Square Loop FSS,"IEEE International Symposium on Antennas and Propagation & USNC/URSI National Radio Science Meeting, pp. 2169-2170, Jul. 2017.

F. Ke, J. Miao and J. Oberhammer, "A ruthenium-based multimetal-contact RF MEMS switch with a corrugated diaphragm", J. Microelectromech. Syst., vol. 17, No. 6, pp. 1447-1459, Dec. 2008.

F. Sun, R. G-Garcia, X. Zhu, H. Zhu, Y. Yang and X. Tong, "Miniaturised millimetre-wave BPF with broad stopband suppression in silicon-germanium technology," IET Microw. Antennas Propag., vol. 14 Iss. 4, pp. 308-313, Jan. 2020.

G. Li, H. S. San, and X. Y. Chen, "Charging and discharging in ion implanted dielectric films used for capacitive radio frequency microelectromechanical systems switch," J. Appl. Phys., vol. 105, No. 12, pp. 124503-1-124503-6, Jun. 2009.

H. Jiang, B. Lacroixet, K. Choi, et al.: 'Ka- and U-band tunable bandpass filters using ferroelectric capacitors', IEEE Trans. Microw. Theory Tech., vol. 59, No. 12, pp. 3068-3075, Dec. 2011.

H. Zhu, X. Zhu, Y. Yang, and Q. Xue, "Design of wideband third order bandpass filters using broadside-coupled resonators in 0.13-?m (Bi)-CMOS technology," IEEE Trans. Microw. Theory Techn., vol. 66, No. 12, pp. 5593-5604, Dec. 2018.

H. Zhu, Y. Yang, X. Zhu, Y. Sun, and S.-W. Wong, "Miniaturized resonator and bandpass filter for silicon-based monolithic microwave and illimeter-wave integrated circuits," IEEE Trans. Circuits Syst. I, Reg. Papers, vol. 65, No. 12, pp. 4062-4071, Dec. 2018.

Jourdain A, Brebels S, De Raedt W and Tilmans H A C, "The influence of 0-level packaging on the performance of RF-MEMS devices" 31st European Microwave Conf. (London, UK, Sep. 24-28, 2001) pp. 403-406, 419.

K. Ma, S. Mou, and K. S. Yeo, "Miniaturized 60-GHz on-chip multimode quasi-elliptical bandpass filter," IEEE Electron. Devices Lett, vol. 34, No. 8, pp. 945-947, Aug. 2013.

L. Martoglio, E. Richalot, G. Lissorgues-Bazin, and O. Picon, "Low-cost inverted line in silicon/glass technology for filter in the ka-band," IEEE Trans. Microw. Theory Tech., vol. 54, No. 7, pp. 3084-3089, Jul. 2006.

L. Nan, K. Mouthaan, Y. Z. Xiong, J. Shi, S. C. Rustagi, and B. L. Ooi, "Design of 60- and 77-GHz narrow-bandpass filters in CMOS technology," IEEE Trans. Circuits Syst. II, Exp. Briefs, vol. 55, No. 8, pp. 738-742, Aug. 2008.

L.-K. Yeh, C.-Y. Chen, and H.-R. Chuang, "A millimeter-wave CPW CMOS on-chip bandpass filter using conductor-backed resonators," IEEE Electron Device Lett., vol. 31, No. 5, pp. 399-401, May 2010.

M. G. Bautista, H. Zhu, X. Zhu, Y. Yang, Y. Sung, and E. Dutkiewicz, "Compact millimeter-wave bandpass filters using quasi-lumped elements in 0.13-? m (Bi)-CMOS technology for 5G wireless systems," IEEE Trans. Microw. Theory Techn., vol. 67, No. 7, pp. 3064-3073, Jul. 2019.

M. Stickel, P. Kremer, and G. V. Eleftheriades, "A millimeter-wave bandpass waveguide filter using a width-stacked silicon bulk micromachining approach," IEEE Microw. Wireless Compon. Lett., vol. 16, No. 4, pp. 209-211, Apr. 2006.

M. Wang, Y. Shim and M. Rais-Zadeh, "A low-loss directly heated two-port RF phase change switch" IEEE Electron Device Lett., vol. 35, No. 4, pp. 491-493, Apr. 2014.

Mardivirin. D, A. Pothier, A. Crunteanu, B. Vialle, and P. Blondy, "Charging in dielectricless capacitive RF-MEMS switches," IEEE Trans. Microw. Theory Tech., vol. 57, No. 1, pp. 231-236, Jan. 2009.

Matthaei, G. L., E. Young, and E. M. T. Jones, Microwave Filters, Impedance-Matching Networks, and Coupling Structures, Artech House, Norwood, MA, Nov. 1985, 9 pages.

N. Mahmoud, A. Barakat, A. B. Abdel-Rahman, A. Allam, and R. K. Pokharel, "Compact size on-chip 60 GHz H-shaped resonator BPF," IEEE Microw. Wireless Compon. Lett., vol. 26, No. 9, pp. 681-683, Sep. 2016.

P. Blondy, A. R. Brown, D. Cros, and G. M. Rebeiz, "Low-loss micromachined filters for millimeter-wave communication systems," IEEE Trans. Microw. Theory Tech., vol. 46, No. 12, pt. 2, pp. 2283-2288, Dec. 1998.

Palandoken, M. and A. Sondas, "Compact metamaterial based band-stop filter," Microwave Journal, vol. 57, No. 10, 76-84, Oct. 2014.

Palandoken, M. and M. H. B. U,car, "Compact metamaterial-inspired band-pass filter," Microwave and Optical Technology Letters, vol. 56, No. 12, 2903-2907, Dec. 2014.

Pillans, B., A. Malczewski, R. Allison, and J. Brank, "6-15 GHz RF MEMS tunable filters," IEEE MTT-S, 919-922, Jun. 2005.

Pozar, D. M., Microwave Engineering, 4th edition, vol. 8, John Wiley & Sons, Dec. 2011, pp. 1-732.

R. J. Cameron, C. M. Kudsia, and R. R. Mansour, Microwave Filters for Communication Systems, John Willey & Sons, Dec. 2018, 83 pages.

R. Mahameed and G. M. Rebeiz, "A high-power temperature stable electrostatic RF MEMS capacitive switch based on thermal buckle-beam design", J. Microelectromech. Syst., vol. 19, No. 4, pp. 816-826, Aug. 2010.

Rebeiz, G. M., RF MEMS Theory, Design, and Technology, 92, John Wiley & Sons, Feb. 2003, pp. 1-483.

S. Chakraborty et al., "A broadside-coupled meander-line resonator in 0.13-?m SiGe technology for millimeter-wave application," IEEE Electron Device Lett., vol. 37, No. 3, pp. 329-332, Mar. 2016.

S. Dey and S. K. Koul, "Reliability analysis of Ku-band 5-bit phase shifters using MEMS SP4T and SPDT switches," IEEE Trans. Microw. Theory Techn., vol. 63, No. 12, pp. 3997-4012, Dec. 2015.

(56) References Cited

OTHER PUBLICATIONS

S. Dey, S. K. Koul, A. K. Poddar and U. L. Rohde., "Ku-V-Band 4-bit MEMS phase shifters using high isolation SP4T switches and DMTL structures", J. Micromech. Microeng, vol. 27, No. 10, pp. 10, Sep. 2017.

S. Dey, S. K. Koul, A. K. Poddar, and U. L. Rohde, "Reliable and compact 3- and 4-bit phase shifters using MEMS SP4T and SP8T switches", J. Microelectromech. Syst., vol. 27, No. 1, pp. 113-124, Feb. 2018.

S. K. Koul, S. Dey, A. K. Poddar and U. L. Rohde., "Ka-band reliable and compact 3-bit truetime-delay phase shifter using MEMS single-pole-eight-throw switching networks", J. Micromech. Microeng, vol. 26, No. 10, pp. 9 pages, Aug. 2016.

S. Lucyszyn, Advanced RF MEMS, Cambridge University Press, Aug. 2010, 8 pages [table of contents].

S. Lucyszyn, K. Miyaguchi, H.W. Jiang, I. D. Robertson, G. Fisher, A. Lord, and J-Y. Choi, "Micromachined RF-coupled cantilever inverted-microstrip millimeter-wave filters," J. Microelectromech. Syst., vol. 17, No. 3, pp. 767-776, Jun. 2008.

S. Wang, and K-F. Cho, "CMOS/IPD switchable bandpass circuit for 28/39 GHz fifth-generation applications," IET Microw. Antennas Propag., vol. 10, No. 14, pp. 1461-1466, Mar. 2016.

S.-C. Chang, Y.-M. Chen, S.-F. Chang, Y.-H. Jeng, C.-L. Wei, C.-H. Huang, and C.-P. Jeng, "Compact millimeter-wave CMOS bandpass filters using grounded pedestal stepped-impedance technique," IEEE Trans. Microw. Theory Techn., vol. 58, No. 12, pp. 3850-3859, Dec. 2010.

Tao, Y., Hong, W., Tang, H.: 'Design of a Ka-band bandpass filter based on high order mode SIW resonator'. 2006 Seventh Int. Symp. on Antennas, Propagation and EM Theory, Oct. 2006, pp. 1-3.

Topalli, K., M. Unlu, H. I. Atadoy, S. Demir, O. Aydin Civi, and T. Akin, "Empirical formulation of bridge inductance in inductively tuned RF MEMS shunt switches," Progress in Electromagnetics Research, vol. 97, pp. 343-356, Oct. 2009.

W. Feng, Y. Shi, X. Ma, Y. Shen, W. Che, Q. Xue, and L-S, Wu, "28-GHz high-selectivity bandpass filters with dual-behavior resonators using GaAs technology," IEEE Trans. Plasma Sci, vol. 47, No. 12, pp. 5277-5282, Dec. 2019.

Y. Yang, X. Zhu, and Q. Xue, "Design of an ultracompact on-chip bandpass filter using mutual coupling technique," IEEE Trans. Electron Devices, vol. 65, No. 3, pp. 1087-1093, Mar. 2018.

Y. Zhong, Y. Yang, X. Zhu, E. Dutkiewicz, K. M. Shum, and Q. Xue, "An on-chip bandpass filter using a broadside-coupled meander line resonator with a defected-ground structure," IEEE Electron. Device Lett., vol. 38, No. 5, pp. 626-629, May 2017.

Z. J. Hou, Y. Yang, X. Zhu, Y. C. Li, E. Dutkiewicz, and Q. Xue, "A compact and low-loss bandpass filter using self-coupled foldedline resonator with capacitive feeding technique," IEEE Electron Device Lett., vol. 39, No. 10, pp. 1584-1587, Oct. 2018.

ZhengAn Yang and D. Peroulis, "A 23-35 GHz MEMS Tunable All-Silicon Cavity Filter with Stability Characterization up to 140 Million Cycles" in IEEE MTT-S International Microwave Symposium, Jun. 1-6, 2014.

\* cited by examiner

TUNABLE BANDPASS FILTER FOR MILLIMETER-WAVE SIGNALS

CROSS REFERENCE TO RELATED APPLICATION

The present application claims the benefit of the filing date of U.S. Provisional Patent Application No. 63/066,916 filed Aug. 18, 2020, the disclosure of which is hereby incorporated herein by reference.

TECHNICAL FIELD

The present disclosure relates to tunable bandpass filters, and more particularly to microelectromechanical system (MEMS) based tunable bandpass filter components operating in a millimeter-wave frequency band, such as for 5G telecommunication applications.

BACKGROUND

Fifth generation (5G) cellular mobile networks address the demand for higher data rates in mobile devices by operating in higher frequency bands than predecessor technologies, such as third generation (3G) and fourth generation (4G LTE). Particularly, 5G networks operate in millimeter-wave frequency bands, and 5G-compatible radio frequency front-end (RFFE) products must also be capable of operating at these frequencies.

However, 5G communication requires the RFFE products to handle high power signals, which can degrade performance and drain battery life. Additionally, in 5G RFFE products, the RF main path typically transmits and receives RF signals simultaneously, which can make RF design more complex.

Additionally, 5G networks permit for the selection of or tuning to different bands within the millimeter-wave frequency band. Bandwidth of a desired millimeter-wave band is usually very narrow and requires high isolation from neighboring bands. Thus, 5G RFFE products must be configurable to serve multiple bands within millimeter-wave frequency band, and must include multi-band filters in order to optimize the complete system. However, high-performance filter designs have faced many challenges, such as maintaining low insertion loss, wide stopband suppression, and compact circuit size.

Several types of filters are known for mobile communications. A conventional RLC filter stores charge at one or more capacitors and current in one or more inductors. Waveguide and cavity filters store signals in the form of electromagnetic resonance at their transmission lines or in the cavity. Metamaterial based wide bandwidth bandpass filters have also attracted attention. Bandpass filters utilizing silicon, GaAs, LTCC, and MEMS technologies have also been proposed. However, MEMS-based solutions often suffer from low reliability, particularly when multiple switching elements are working simultaneously. Moreover, MEMS-based devices often fail to maintain functionality over a large number of operations, such as over about 1 billion switch cycles.

SUMMARY

One aspect of the present disclosure is directed to a tunable passband filter including a signal input port configured to receiving an input radio frequency (RF) signal, a signal output port configured to transmit a filtered output RF signal, wherein the tunable passband filter is configured to filter the input RF signal to yield the filtered output RF signal, a first high-pass section comprising a first tunable microelectromechanical system (MEMS) switch array and configured to receive the input RF signal from the signal input port, a second high-pass section comprising a second tunable MEMS switch array and configured to transmit the output RF signal to the signal output port, and a low pass section operatively coupled between the first high-pass section and the second high-pass section, the low pass section including each of a first tunable MEMS bridge array, a second tunable MEMS bridge array, and a high impedance line.

In some examples, the tunable passband filter may have a mirror symmetry over a first axis, such that the first tunable MEMS switch array is symmetrical to the second MEMS switch array, the first tunable MEMS bridge array is symmetrical to the second tunable MEMS bridge array, and a midpoint of the high impedance line crosses the first axis.

In some examples, each of the first tunable MEMS bridge array and the second tunable MEMS bridge array may be a shunt varactor, and the first tunable MEMS bridge array and the second tunable MEMS bridge array may be coupled to opposite ends of the high impedance transmission line.

In some examples, each tunable MEMS switch array may include a plurality of MEMS switches arranged in parallel between a switch array input junction and a switch array output junction, and a switch array bias line coupled to a first voltage source and configured to apply a first bias voltage to each of the plurality of MEMS switches, wherein a capacitance of the tunable MEMS switch array varies as a function of the first bias voltage.

In some examples, the switch array may have a capacitance range of 330-580 fF for a range of first bias voltages from 85 V to 105 V.

In some examples, the plurality of MEMS switches may be arranged to distribute current equally.

In some examples, each one of the plurality of MEMS switches may include a beam coupled to each of the switch array input junction and the switch array output junction, and configured to deflect vertically, and a plurality of anchors formed on a substrate of the tunable bandpass filter and configured to contribute lateral support to the beam.

In some examples, the plurality of MEMS switches may include four MEMS switches.

In some examples, each tunable MEMS bridge array may include a plurality of fixed MEMS bridges arranged in series between the switch array output junction and a respective end of the high impedance transmission line, and a bridge array bias line coupled to a second voltage source and configured to apply a second bias voltage to each of the plurality of fixed MEMS bridge. In some examples, a capacitance of the tunable MEMS bridge array may vary as a function of the second bias voltage.

In some examples, the plurality of fixed MEMS bridges may be parallel plate MEMS bridges including a plurality of beams and an electrode plate. In some examples, each beam may be configured to deflect in a direction towards the electrode plate in response to the second bias voltage. In some examples, the electrode plate may have a thickness of about 2 μm.

In some examples, each beam may be anchored to a first side of the tunable MEMS bridge array by a first plurality of springs and to an opposite second side of the tunable MEMS bridge array by a second plurality of springs.

In some examples, each spring of the first and second plurality of springs is mounted at a 45 degree incline. In some examples, each spring may have a thickness of 3.5 μm. In some examples, each spring may have a width of about 10 μm.

In some examples, the plurality of fixed MEMS bridges may include four parallel plate MEMS bridges.

In some examples, each tunable MEMS bridge array may be a third-order 3 dB ripple Chebyshev low-pass filter.

In some examples, the high impedance transmission line may have an electrical length of less than one quarter of the wavelength corresponding to the operating frequency of the tunable passband filter.

In some examples, the high impedance transmission line may have a length of 430 μm. In some examples, the line may have an impedance of 94 ohms.

In some examples, the tunable passband filter may further include a dielectric layer formed between a transmission path of the tunable passband filter and bias lines for providing bias voltages to the first high-pass section, the second high-pass section, and the low pass section.

In some examples, the tunable bandpass filter may be tunable between at least 27 GHz to 29 GHz in increments of about 0.5 GHz.

In some examples, the tunable MEMS switch arrays may have a capacitance range of 400-450 fF. In some examples, the tunable MEMS bridge array may have a capacitance range of 150-170 fF for operating frequencies between 27 GHz and 29 GHz.

In some examples, the tunable MEMS switch arrays may be configured to maintain a variation of contact resistance of 2.23 ohm or less when operated between 0.1-1 W of power and a variation of 13.3 fF or less when operated between 0.5-1 W of power for a duration of one billion cycles at operating frequencies between 27-29 GHz.

In some examples, the tunable MEMS bridge arrays may be configured to maintain a variation of capacitance of 2.77 fF or less when operated between 0.1-1 W of power for a duration of one billion cycles at operating frequencies between 27-29 GHz.

In some examples, a center frequency of the tunable bandpass filter may shift by 0.49 GHz or less between biasing of the bridge array and biasing of the switch arrays when operating at 0.5 W power. In some examples, the shift may be 1.63 GHz or less between biasing of the bridge array and biasing of the switch arrays when operating at 1 W power at operating frequencies between 27-29 GHz.

In some examples, each individual MEMS switch of each tunable MEMS switch array may have a return loss of 30 dB or more. In some examples, each switch may have an insertion loss of up to 0.94 dB for operating frequencies between 1-30 GHz. In some examples, each switch may have isolation of 25 dB or more for operating frequencies between 1-30 GHz.

In some examples, each tunable MEMS switch array may have an average return loss of 21 dB or more for operating frequencies between 27-29 GHz. In some examples, each switch may have an average insertion loss of up to 0.58 dB for operating frequencies between 27-29 GHz. In some examples, each switch may have an average isolation of 30.7 dB or more for operating frequencies between 27-29 GHz.

In some examples, each tunable MEMS bridge array may have a return loss of 15 dB or more for operating frequencies between 1-30 GHz. In some examples, each bridge array may have an insertion loss of up to 1 dB for operating frequencies between 1-30 GHz.

In some examples, the tunable passband filter may produce 5 dB of insertion loss over a bandwidth of about 2.7 GHz for a center frequency of about 28.5 GHz for at least one billion cycles of the MEMS switches of the tunable passband filter during operation at between 0.5-1 W.

In some examples, the tunable passband filter may produce 5 dB of insertion loss over a bandwidth of about 4.1 GHz for a center frequency of about 29 GHz for at least one billion cycles of the MEMS switches of the tunable passband filter during operation at between 0.5-1 W.

In some examples, the tunable bandpass filter may be operable across at least one of a frequency band of 37-38.6 GHz or a frequency band of 38.6-40 GHz.

Another aspect of the present disclosure is directed to a tunable millimeter-wave device, such as an oscillator, phase shifter, frequency synthesizer or amplifier including a tunable passband filter as described in any of the embodiments herein.

For example, a tunable amplifier module may include a filter module including a plurality of tunable bandpass filters as described in any of the embodiments herein, an antenna switch, and a low-noise-amplifier multiplexer module (LMM) including an LMM switch and an amplifier coupled to an output of the LMM switch. Each tunable bandpass filter of the filter module may be connected to a respective output of the antenna switch and to a respective input of the LMM switch.

A further aspect of the present disclosure is directed to method of fabricating a tunable passband filter including: constructing a first tunable MEMS switch array comprising a first plurality of MEMS switches arranged in parallel between a first switch array input junction and a first switch array output junction, wherein a capacitance of the first tunable MEMS switch array varies as a function of a first bias voltage applied to the first plurality of MEMS switches; constructing a first tunable MEMS bridge array comprising a first plurality of fixed MEMS bridges arranged in series, wherein a capacitance of the first tunable MEMS bridge array varies as a function of a second bias voltage applied to the first plurality of fixed MEMS bridges; constructing a second tunable MEMS bridge array comprising a second plurality of fixed MEMS bridges arranged in series, wherein a capacitance of the second tunable MEMS bridge array varies as a function of a third bias voltage applied to the second plurality of fixed MEMS bridges; constructing a second tunable MEMS switch array comprising a second plurality of MEMS switches arranged in parallel between a second switch array input junction and a second switch array output junction, wherein a capacitance of the second tunable MEMS switch array varies as a function of a fourth bias voltage applied to the second plurality of MEMS switches; individually testing each of the first tunable MEMS switch array, the first tunable MEMS bridge array, the second tunable MEMS bridge array, and the second tunable MEMS switch array; and assembling the individually tested first tunable MEMS switch array, the first tunable MEMS bridge array, the second tunable MEMS bridge array, the second tunable MEMS switch array, and a high impedance line to form the tunable passband filter.

In some examples, testing each of the first tunable MEMS switch array, the first tunable MEMS bridge array, the second tunable MEMS bridge array, and the second tunable MEMS switch array may be performed at each of 27 GHz, 28 GHz and 29 GHz.

In some examples, the method may further include any one or combination of: individually testing each of the first plurality of MEMS switches for operability before constructing the first tunable MEMS switch array; individually testing each of the first plurality of fixed MEMS bridges for operability before constructing the first tunable MEMS bridge array; individually testing each of the second plurality of fixed MEMS bridges for operability before constructing the second tunable MEMS bridge array; or individually testing each of the second plurality of MEMS switches for operability before constructing the second tunable MEMS switch array.

In some examples, operability of an individual MEMS switch or bridge may involve actuation of the individual MEMS switch or bridge within a predetermined range of a point of stability.

In some examples, individually testing the first tunable MEMS switch array, the second tunable MEMS switch array, or both, may include continuously varying RF power for operation between 0.1 and 1 W at a controlled bias voltage for biasing the switch array over a duration of 1 billion cycles for the MEMS switches. In some examples, the controlled bias voltage may be between 85 V and 105 V.

In some examples, individually testing the first tunable MEMS bridge array, the second tunable MEMS bridge array, or both, may include continuously varying RF power for operation between 0.1 and 1 W at a controlled bias voltage for biasing the switch array over a duration of 1 billion cycles for the MEMS switches. In some examples, the controlled bias voltage may be between 40 V and 70 V.

In some examples, the method may include, in a first testing stage, tuning a passband frequency of the tunable passband filter by biasing at least one of the first and second tunable MEMS bridge arrays while a corresponding at least one of the first and second tunable MEMS switch arrays remain unbiased, and in a second testing stage, adjusting a fractional bandwidth of the tunable passband filter by biasing both the at least one of the first and second tunable MEMS bridge arrays and the at least one of the first and second tunable MEMS switch array.

In some examples, in either the first testing stage or the second testing stage, one or both of the first and second tunable MEMS bridge arrays and the at least one of the first and second tunable MEMS switch arrays may remain biased for between one to six hours.

Yet a further aspect of the present disclosure is directed to a method of operating a tunable passband filter including: applying a first bias voltage to a first plurality of MEMS switches of a first tunable microelectromechanical system (MEMS) switch array and a second plurality of MEMS switches of a second tunable MEMS switch array having a mirror symmetry with the first tunable MEMS switch array over a midpoint axis, wherein the first bias voltage tunes the first and second tunable MEMS switch array to a common high-pass roll-off frequency between about 27 to 29 GHz; applying a second bias voltage to a first plurality of fixed MEMS bridges of a first tunable MEMS bridge array and a second plurality of fixed MEMS bridges of a second tunable MEMS bridge array having a mirror symmetry with the first tunable MEMS bridge array over the midpoint axis and connected to the first tunable MEMS bridge array by a high impedance line whose midpoint crosses the midpoint axis, wherein the second bias voltage tunes the first and second tunable MEMS bridge arrays to a common low-pass roll-off frequency between about 27 to 29 GHz and that is higher than the common high-pass roll-off frequency; filtering an input RF signal received at the first tunable MEMS switch array using the first tunable MEMS switch array, the first tunable MEMS bridge array, the high impedance line, the second tunable MEMS bridge array and the second tunable MEMS switch array; and outputting the filtered input RF signal from the second tunable MEMS switch array.

DETAILED DESCRIPTION

Figure 1:
FIG. 1 is a schematic diagram of a tunable bandpass filter in accordance with an aspect of the disclosure.

FIG. 1 shows a schematic diagram of a tunable bandpass filter 100 for filtering radio frequency (RF) signals in accordance with an aspect of the disclosure. The filter 100 includes an input port 102 for receiving an input RF signal ("RF in") and an output port 104 for transmitting a filtered output RF signal ("RF out").

Between the input port 102 and the output port 104 are the filtering components. These components may be separately produced, and subsequently assembled as blocks to produce the tunable bandpass filter 100. Some blocks may be tunable, while other blocks may be fixed. Being tunable may mean that the block receives a control signal separate from the RF signal, and that the control signal affects an operational property of the block. For example, a block may be a high pass filter block setting a lower roll-off frequency of the tunable bandpass filter 100, in which case the control signal may affect the lower roll-off frequency, a sharpness of the roll-off, a combination thereof, or other properties of the filter. For further example, a block may be a low pass filter block setting an upper roll-off frequency of the tunable bandpass filter 100, in which case the control signal may affect the upper roll-off frequency, a sharpness of the roll-off, a combination thereof, or other properties of the filter. As such respective control signals to high pass and low pass blocks of a bandpass filter may enable for the filtered band of the filter to be adjusted.

In the example of FIG. 1, the tunable bandpass filter 100 is constructed from three types of filter blocks. A first filter block 110 functions as a high pass filter. A second filter block 120 functions as a low pass filter. A third filter block 130 includes a high impedance line to provide impedance matching between the other filter blocks. Each of the first filter block 110 and the second filter block 120 is tunable, while the third filter block 130 is fixed. Additionally, the first filter block 110 receives a first control signal ($V_s$) while the second filter block 120 received a second control signal ($V_b$) that is controlled separately from the first control signal.

In the example of FIG. 1, the tunable bandpass filter 100 is constructed to have mirror symmetry over a first axis X. The first axis X may extend in a direction that is perpendicular from a lengthwise direction of the filter, whereby the lengthwise direction is defined by the direction from the input port 102 to the output port 104, or more particularly to the lengthwise direction of the transmission line extending between the input port 102 and the output port 104. Because of the mirror symmetry of the filter, each of the first filter blocks 110 and the second filter blocks 120 is duplicated in order to provide symmetrical components. A midpoint of the third filter block 130 is positioned at the first axis X such that it is symmetrical with itself and does not require a duplicate block to achieve symmetry.

A first one 112 of the first filter blocks may be treated as a first high pass section of the filter, while a second one 114 of the first filter blocks may be treated as a second high pass section of the filter. The first one 112 of the first filter blocks may be coupled to the input port 102 to receive the input RF signal, while the second one 114 of the first filter blocks may be coupled to the output port 104 to transmit the input RF signal. Each of the first and second high pass sections of the filter may receive a common first control signal ($V_s$) to maintain symmetry in their operation. The duplicate second filter blocks 122, 124 and the high impedance line of the third filter block 130 may be treated as a low pass section of the filter coupled between each of the first and second first filter blocks 112, 114. The duplicate second filter blocks 122, 124 may also receive a common second control signal ($V_b$) to maintain symmetry in their operation.

Figure 2A:
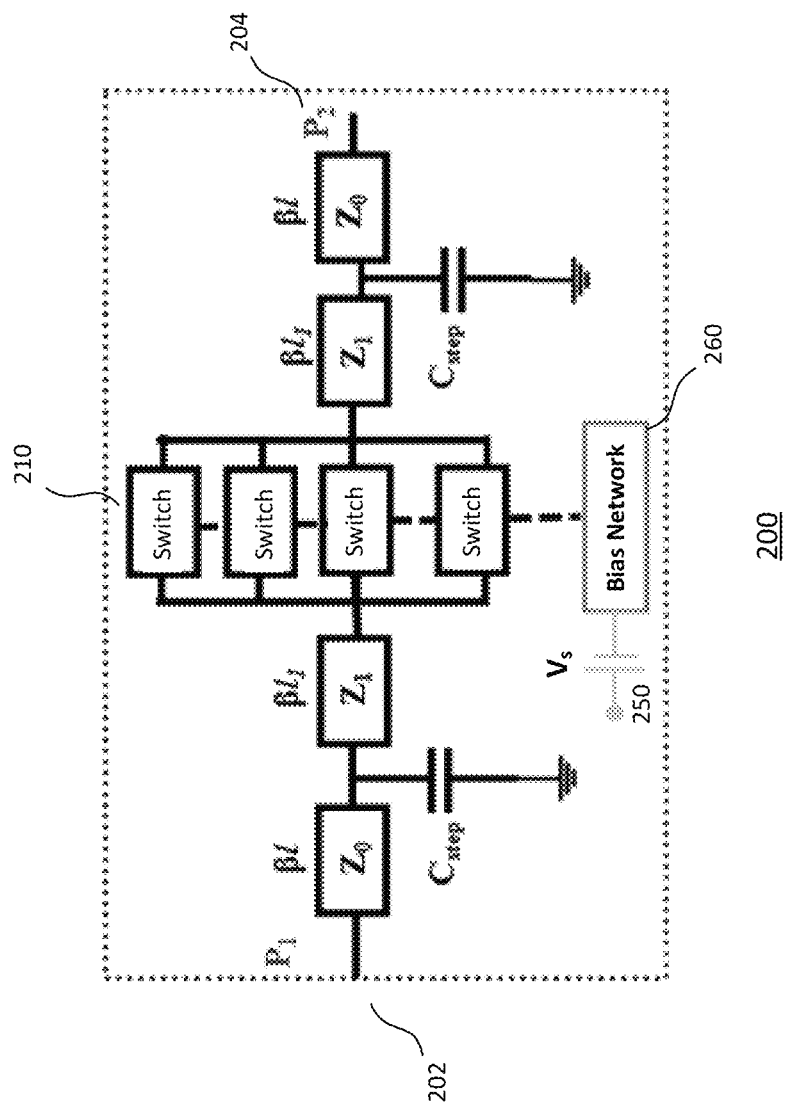
FIG. 2A is a schematic diagram of an example switch array of the tunable bandpass filter of FIG. 1.

The first filter block 110 may include an array of microelectromechanical system (MEMS) switches that function as tunable capacitors. FIG. 2A shows a schematic diagram of an example switch array 200 of the tunable bandpass filter of FIG. 1. The switch array 200 is positioned between portions of the transmission line extending between a switch array input junction 202 and a switch array output junction 204. The transmission line portions are represented as impedance elements $\beta 1$ and $\beta 1_1$ in FIG. 2A. Also, in the example of FIG. 2A, the respective portions of the transmission line include capacitive elements, such as an air bridge, in order to improve impedance matching. The capacitive elements are represented as shunt varactor elements $C_{step}$ in FIG. 2A.

The switch array 200 is positioned in series with the respective portions of the transmission line and includes a plurality of MEMS switches 210 system. Particularly, in the example of FIG. 2A, the array includes four switches, although in other examples, a different number of switches may be included. The switches are arranged in parallel with one another. In some examples, the switches may be substantially identical to one another, such that each exhibits the same capacitance for a given input control signal. Additionally, the switches may be arranged to distribute current equally, such that the input RF signal is split evenly among the switches and thus handled the same at each of the switches.

Figure 2B:
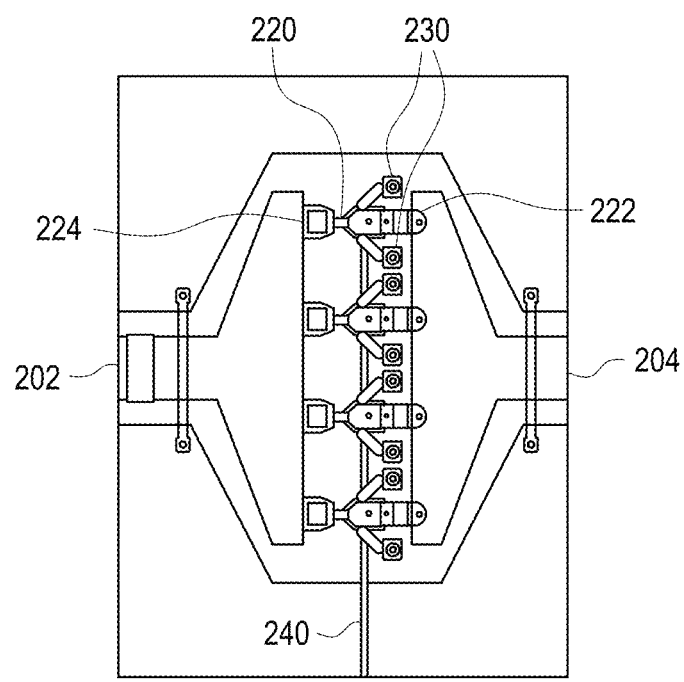
FIG. 2B is an image of an example layout of the switch array of FIG. 2A.

FIG. 2B is an image of an example layout of the switch array of FIG. 2A. In the example of FIG. 2B, each MEMS switch includes a beam 220 coupled to respective portions of the transmission line via the switch array input junction 202 and the switch array output junction 204, respectively. Each beam 220 may include a fixed end permanently coupled to its respective junction, and an opposing free end capable of connecting to or separating from the other respective junction. In the example of FIG. 2B, the fixed end 222 of each MEMS switch is connected to the switch array output junction 204 and the free end 224 of each MEMS switch is connected to the switch array input junction 202. However, in other examples, the beam may be arranged with a different configuration, such as being fixed to the input junction and free at the output junction.

The beam 220 may be configured to deflect in a vertical direction (in/out of the image of FIG. 2B). A plurality of anchors 230 may be formed on a substrate of the tunable bandpass filter in order to support the beam 220. In particular, at least two anchors 230 may be positioned to opposing sides of the beam 220 in order to contribute lateral support to the beam. The particular example of FIG. 2B provides three anchors arranged in a Y-configuration for each beam, whereby a point of convergence of the Y-configuration is positioned at or around a midpoint of the beam 220.

Referring to both FIG. 2A and FIG. 2B, a switch array bias line 240 may be coupled to each of the MEMS switches 210 in order to supply a first control signal to the switches. For instance, the first control signal may be a first bias voltage (V), and may be received from a voltage source 250. A bias network 260 may be provided between the voltage source 250 and the switches 210 in order to deliver the first bias voltage. A capacitance of each MEMS switch 210 may vary as a function of the first bias voltage. Thus, a capacitance of the switch array 200 as a whole may also vary as a function of the first bias voltage. Controlling a capacitance of the switch array may control a roll-off frequency of the array, which may be a frequency at which the signal attenuates by 3 dB or by 5 dB. Frequencies lower than the roll-off frequency may be dampened by the capacitors while frequencies higher than the roll-off frequency are passed from one portion of the transmission line to the next.

Although not shown in the figures, the bias lines 240 may include a dielectric layer, such as $S_iO_2$ formed thereon. The dielectric layer may help to route the line underneath the bottom electrode and the coplanar waveguide (CPW) transmission lines, and may avoid the bias lines causing lockage losses and unwanted resonance during bandpass filtering.

The example switch array of FIG. 2A may have a sharp roll-off. For example, the switch design of FIG. 2B may obtain a third order response. Additionally or alternatively, the switch array may have a tuning range of about 40% of its center frequency.

Figure 3A:
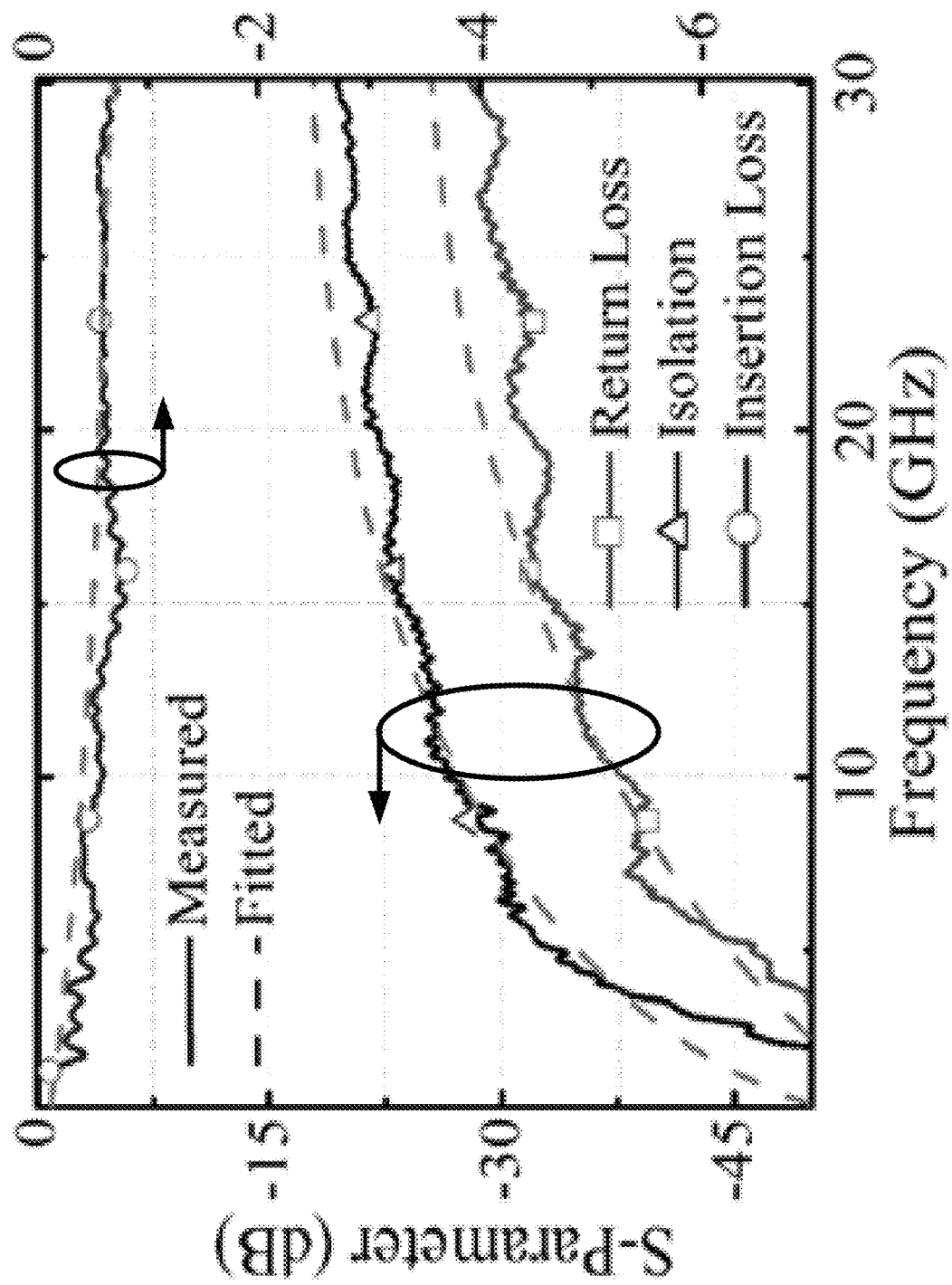
FIG. 3A is a graph illustrating S-parameters of a single switch of the example switch array of FIG. 2B.
Figure 3B:
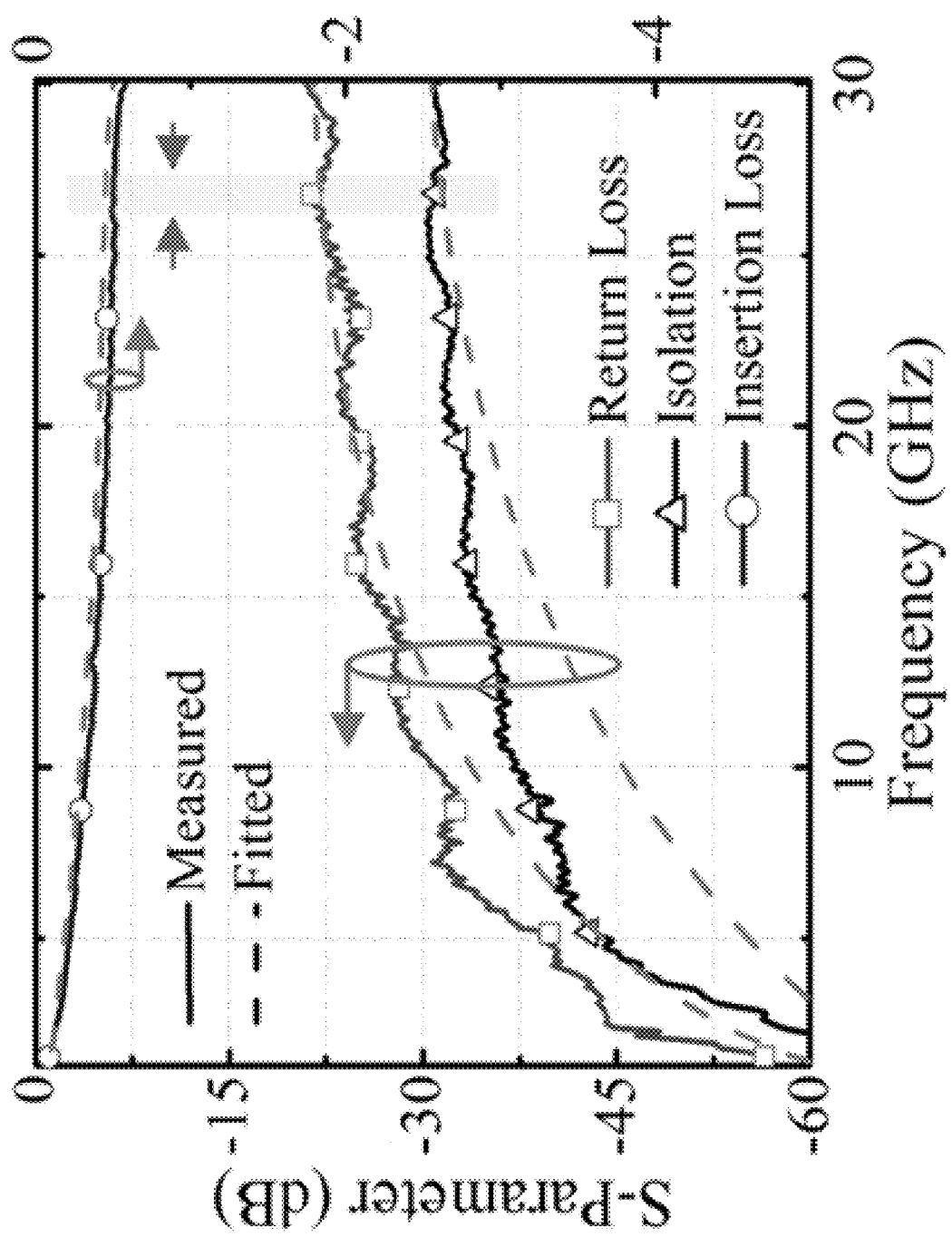
FIG. 3B is a graph illustrating S-parameters of the switch array of FIG. 2B.

The example switch array of FIGS. 2A and 2B reduces overall noise while at the same time preventing signal attenuation. FIG. 3A illustrates S-parameters of a single MEMS switch 210 of the switch array 200 of FIG. 2B, and FIG. 3B illustrates S-parameters of the entire switch array 200. As can be seen in FIG. 3A, return loss of the MEMS switch remains about 30 dB or better for frequencies up to and including 30 GHz, while insertion loss of the MEMS switch is about 0.94 dB or less for the same range of frequencies, and isolation of about 25 dB or better for the same range of frequencies is achieved. A bias voltage of up to 112 V is used to tune the center frequency of the switch. Also, as can be seen in FIG. 3B, average return loss of the switch array as a whole remains about 21 dB or better for frequencies up to and including 30 GHz, while average insertion loss of the switch array is about 0.58 dB or less for the same range of frequencies, and average isolation of about 30.7 dB or better for the same range of frequencies. As with FIG. 3A, a bias voltage of up to 112 V is used to tune the center frequency of the switches in the switch array. Additional measurement details are provided in Table 1 below:

TABLE 1

| Frequency | $V_s$ (V) | $C_s$ (fF) | Insertion Loss (dB) | Return Loss (dB) |
|---|---|---|---|---|
| 27 GHz | 94 | 440 | 0.5 | 30.95 |
| 27.5 GHz | 95 | 430 | 0.51 | 31 |
| 28 GHz | 98 | 460 | 0.518 | 31.6 |
| 28.5 GHz | 93 | 430 | 0.526 | 31.3 |
| 29 GHz | 96 | 450 | 0.532 | 31.2 |

Figure 4A:
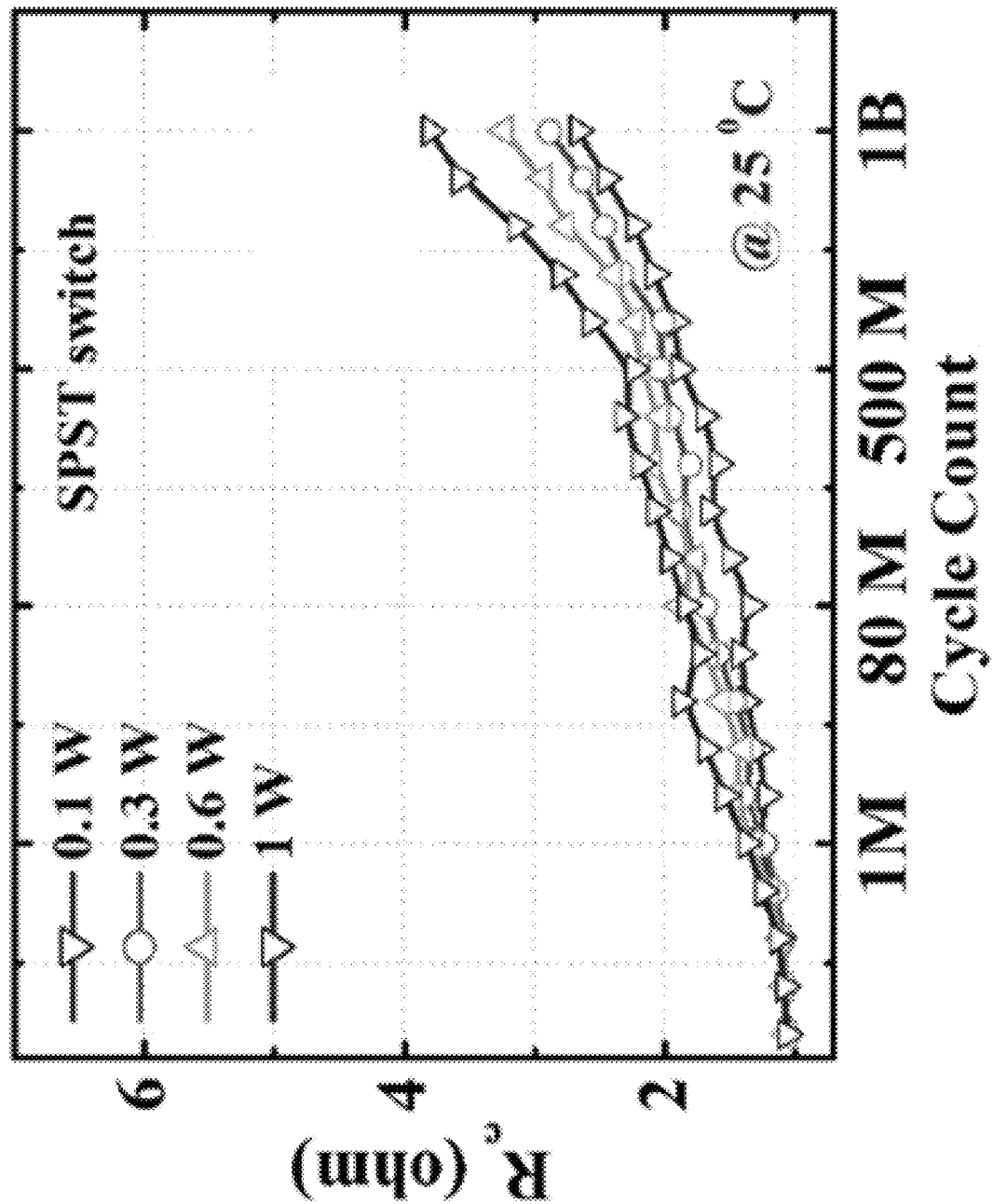
FIGS. 4A, 4B and 4C are graphs illustrating reliability as a function of contact resistance during lifetime of a single switch and of the example switch array of FIG. 2B.
Figure 4B:
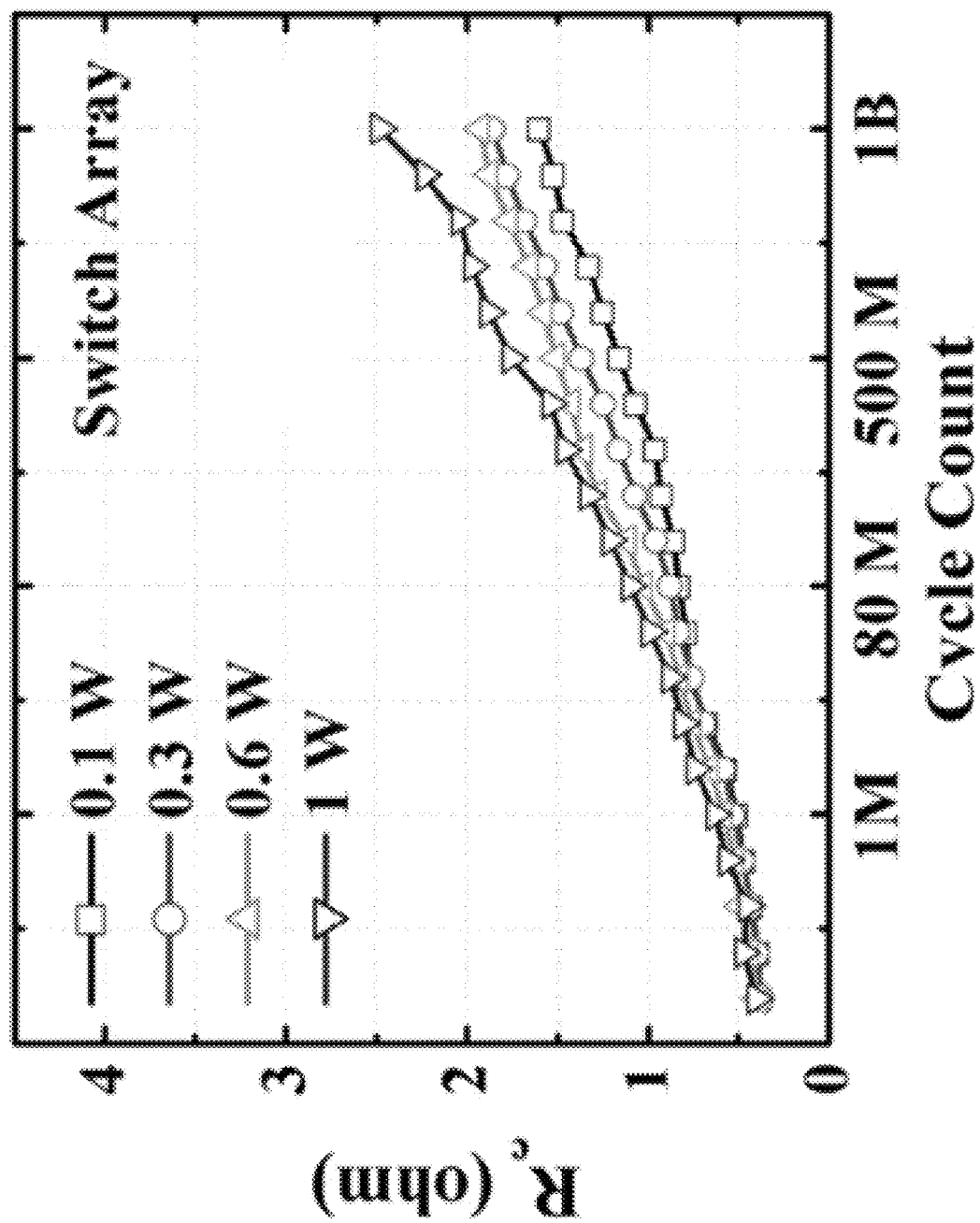
Figure 4C:
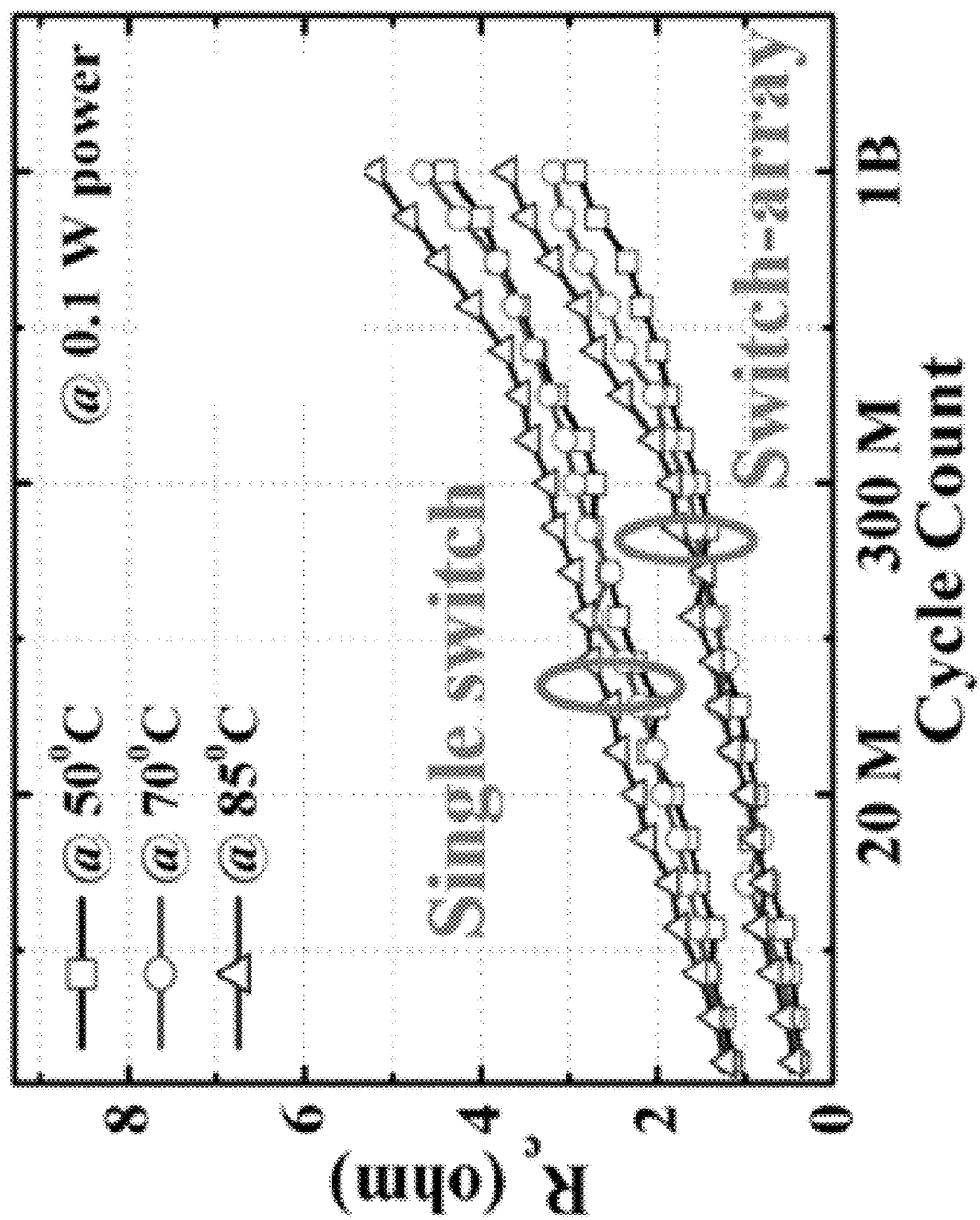

The example switch array of FIGS. 2A and 2B is also very stable operationally over a long lifespan, such as up to one billion switch cycles. FIG. 4A illustrates changes in contact resistance of a single MEMS switch 210 over a lifespan of the switch at a fixed temperature condition of 25° C., FIG. 4B illustrates changes in contact resistance of the entire switch array 200, and FIG. 4C illustrates changes of the single switch and entire array at higher temperature conditions. As can be seen in FIG. 4A, a switch contact resistance ($R_C$) of a single switch remains between about 1-4Ω for one billion switch cycles when an operational power of the switch between 0.1-1.0 W. For operational power 0.3 W and below, the switch contact resistance does not exceed 3Ω. Also, as can be seen in FIG. 4B, overall contact resistance of the array remains between about 1.5-3Ω for one billion switch cycles when an operational power of the switch between 0.1-1.0 W. For operational power 0.6 W and below, the switch contact resistance does not exceed 2Ω. Lastly, as can be seen in FIG. 4C, the switch contact resistance of a single switch remains between about 4.4-5.1Ω for one billion switch cycles at temperatures between 50 to 85° C. when an operational power of the switch is 0.1 W, and the overall contact resistance of the entire switch array remains between about 2.9-3.8Ω for one billion switch cycles at temperatures between 50 to 85 C when an operational power of the switch is 0.1 W.

Figure 4D:
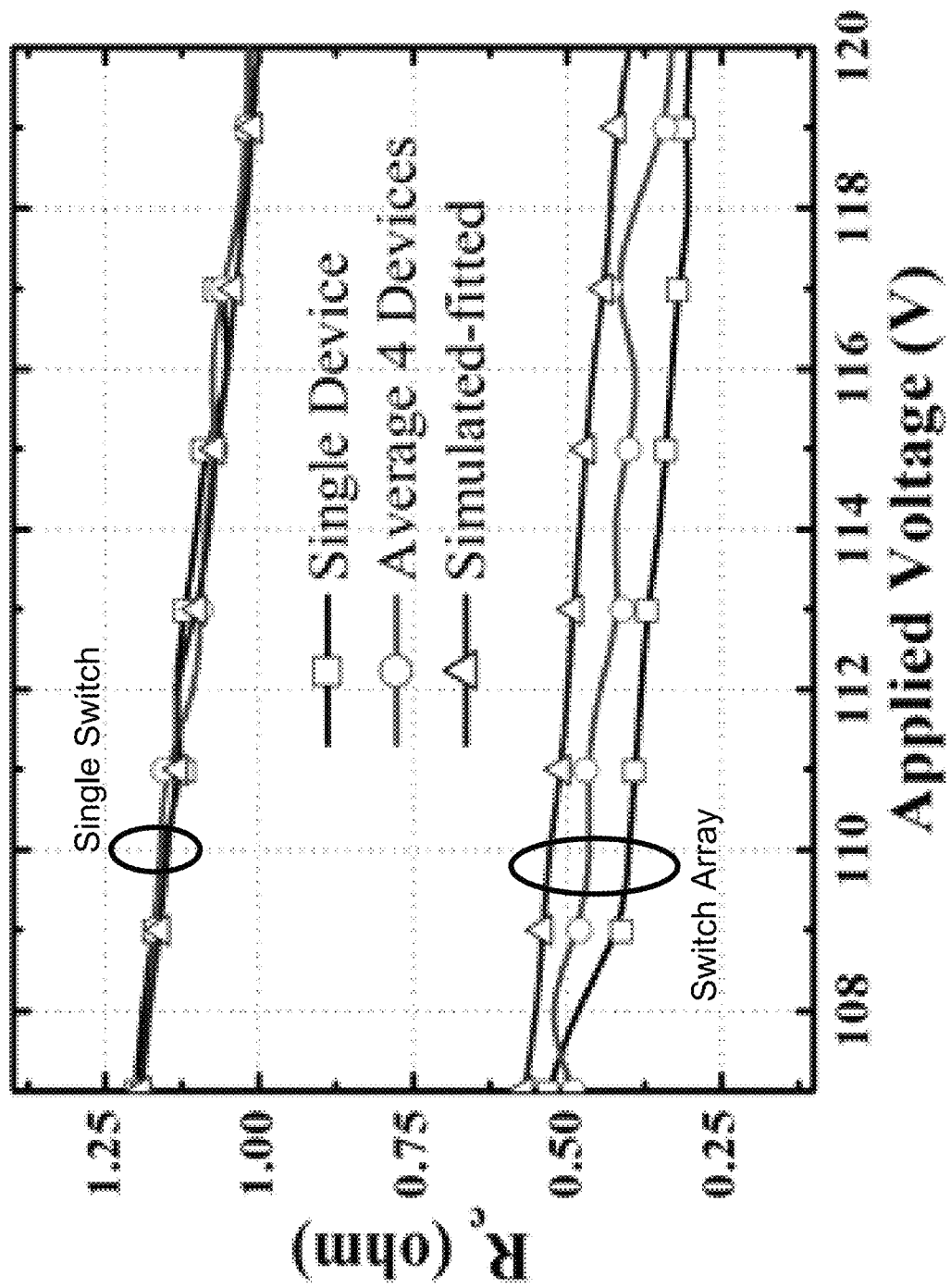
FIG. 4D is a graph illustrating variations in contact resistance as a function of applied voltage for a single switch and for all switches of the example switch array of FIG. 2B.

The example switch array of FIGS. 2A and 2B is also very stable operationally over a range of applied bias voltages. FIG. 4D illustrates changes in contact resistance of a single MEMS switch 210 and of an entire switch array as a function of the bias voltage. As can be seen in FIG. 4D, a switch contact resistance of a single switch remains between about 1.0-1.2Ω for a range of bias voltages between 107V and 120 V, and switch contact resistance of the entire switch array remains between about 0.3-0.55Ω for the same range of bias voltages. FIG. 4D shows measurements collected for each of a switch and array of a single device, as well as average resistances for a switch and array measured across four different devices. The measurements are further compared to simulated data. As can be seen from the figure, the simulated data and measurements match very well for the single switch, and are also a relatively match for the switch array.

Figure 5A:
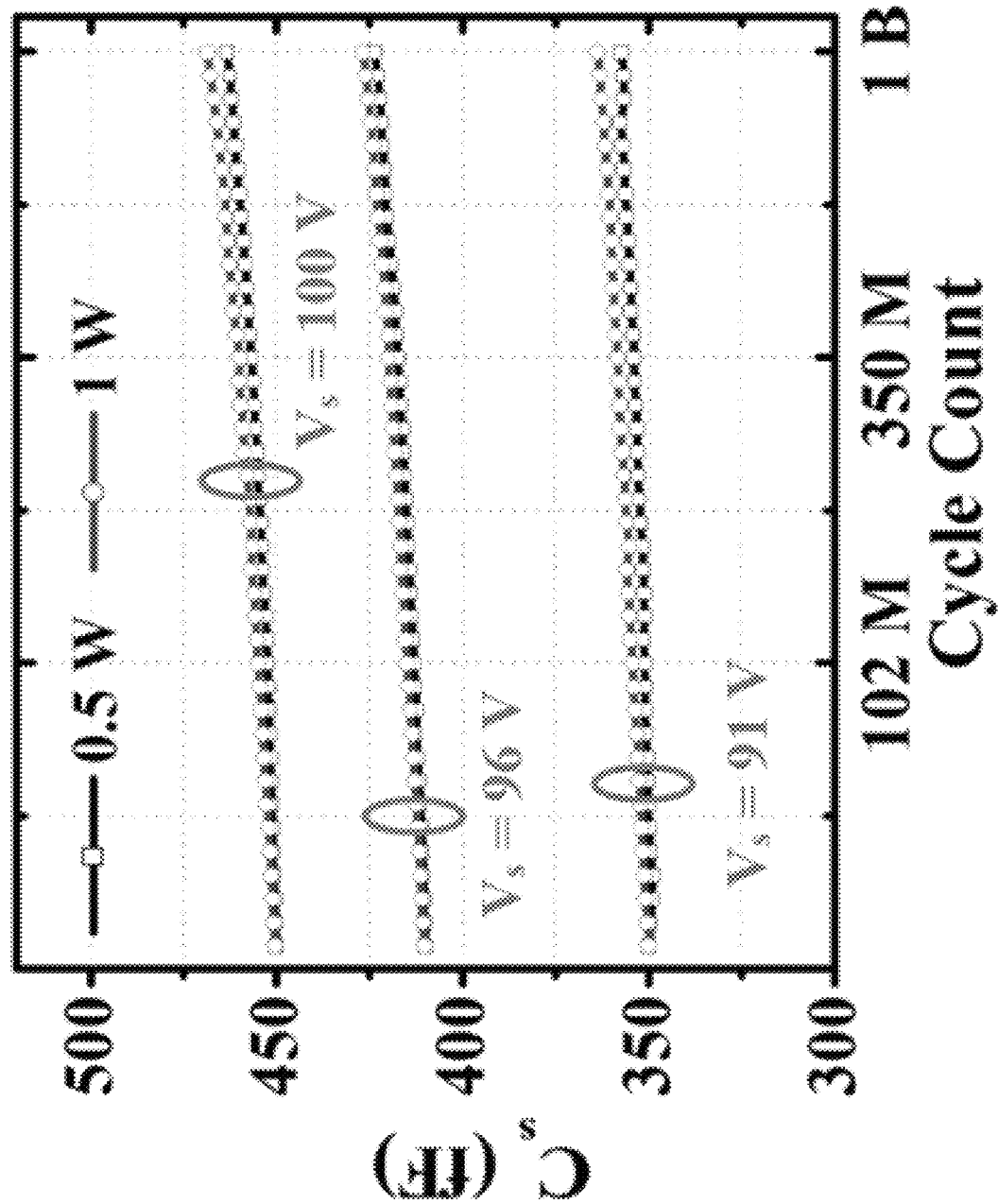
FIGS. 5A and 5B are graphs illustrating variations in capacitance during lifetime of the example switch array of FIG. 2B.
Figure 5B:
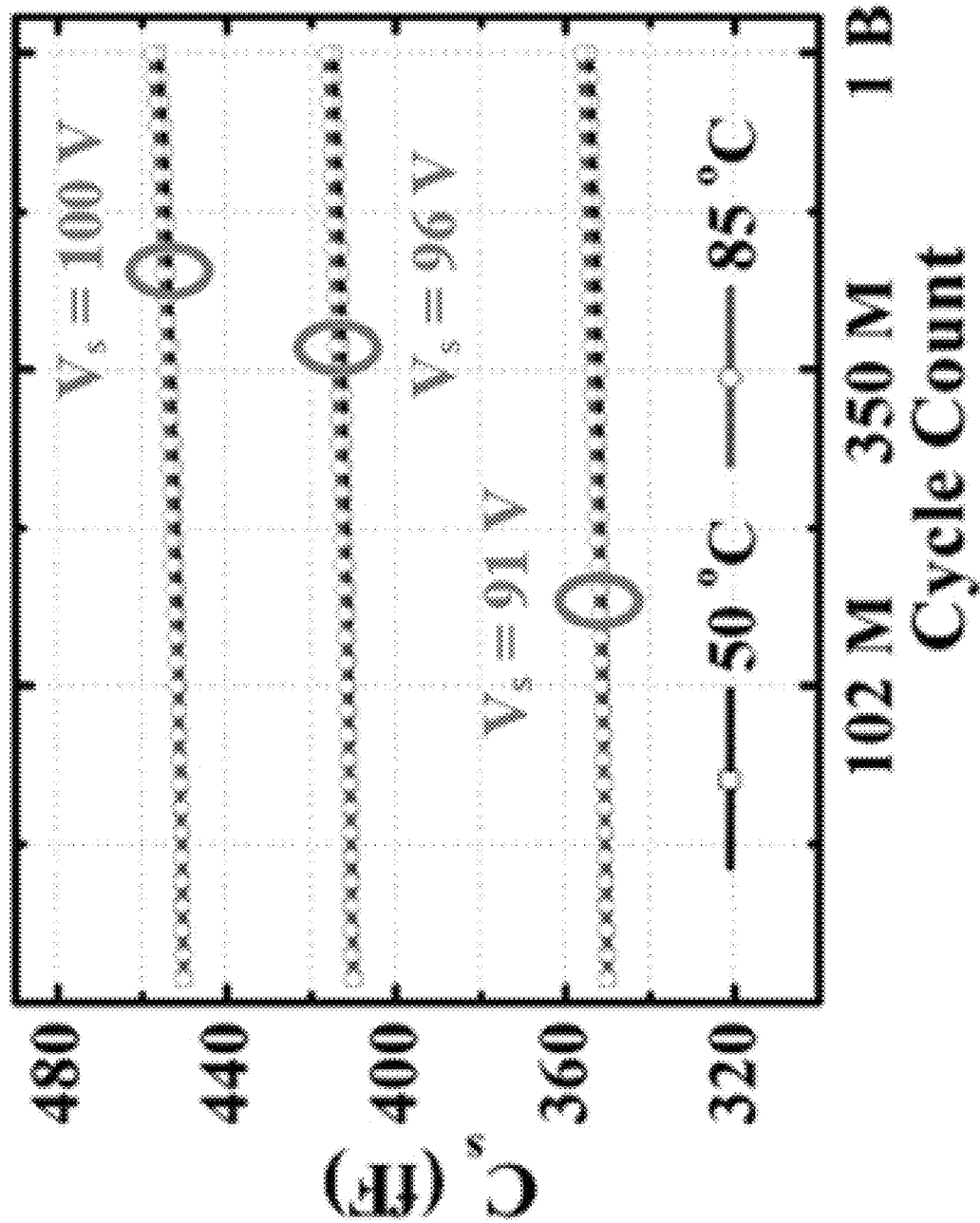
Figure 5C:
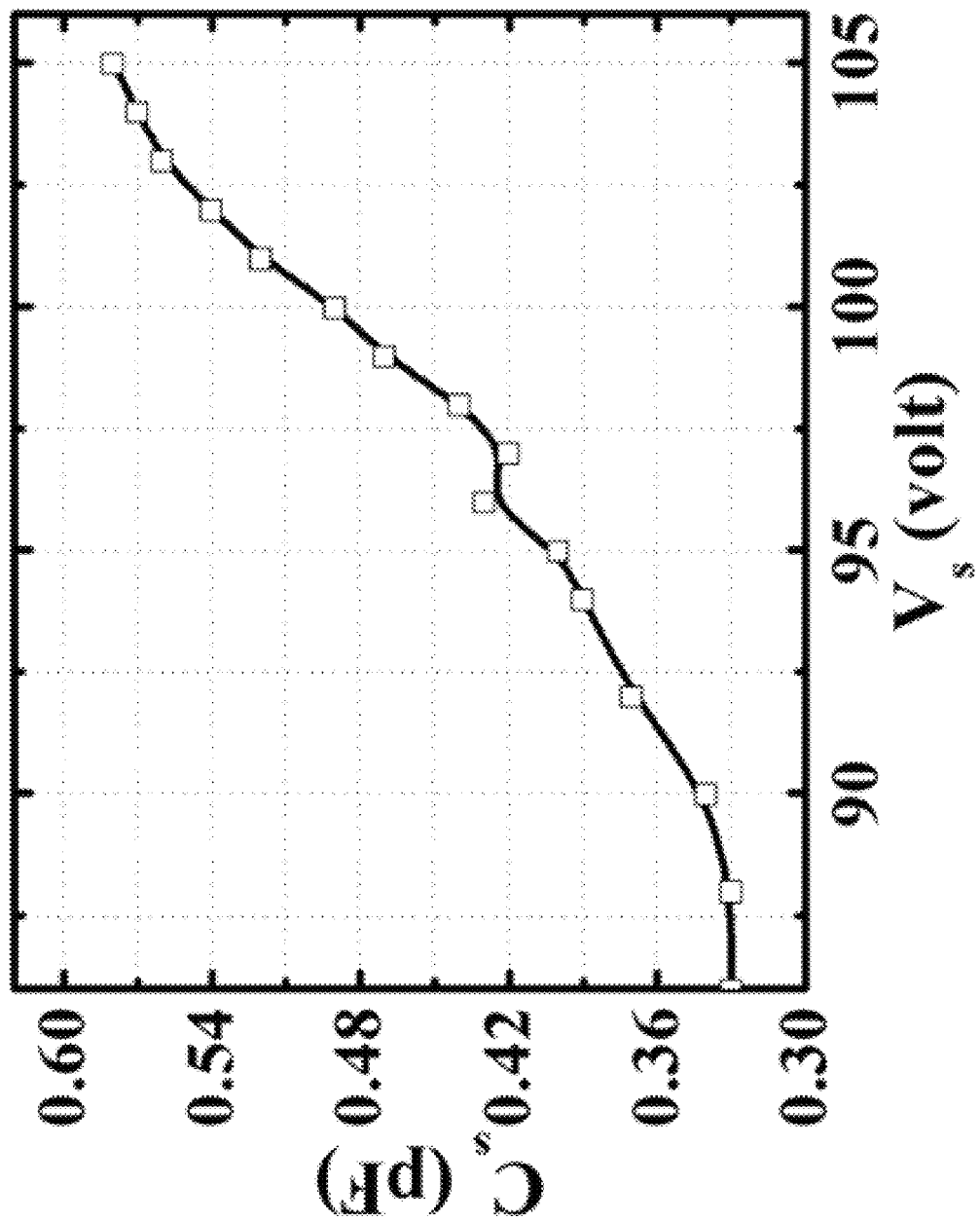
FIG. 5C is a graph illustrating variations in capacitance as a function of applied voltage for the example switch array of FIG. 2B.

A capacitance of the example switch array of FIGS. 2A and 2B also remains very stable operationally over a long lifespan, such as up to one billion switch cycles. FIG. 5A illustrates changes in capacitance of the switch array 200 over a billion-cycle lifespan of the switch, and FIG. 5B illustrates changes in capacitance of the switch array 200 over a billion-cycle lifespan of the switch at temperature conditions of 50 and 85° C. Change in capacitance has been found to be negligible at lower temperatures, such as 25° C. As can be seen in FIGS. 5A and 5B, a switch array capacitance ($C_s$) of the switch array remains within a range of about 5-10 fF for one billion switch cycles when an operational power of the switch is between 0.5-1.0 W regardless of the temperature. Small increases to capacitance variation as a function of the bias voltage can be seen in FIGS. 5A and 5B. These increases are more clearly shown in FIG. 5C, which illustrates changes in switch capacitance of the switch array as a function of the bias voltage. As can be seen in FIG. 5C, capacitance of the switch can increase by about 250 fF, particularly from 330-580 fF, for a range of bias voltages from 88-105 V. For tuning between 27-29 GHz, the capacitance ranges between about 400-450 fF.

Figure 6A:
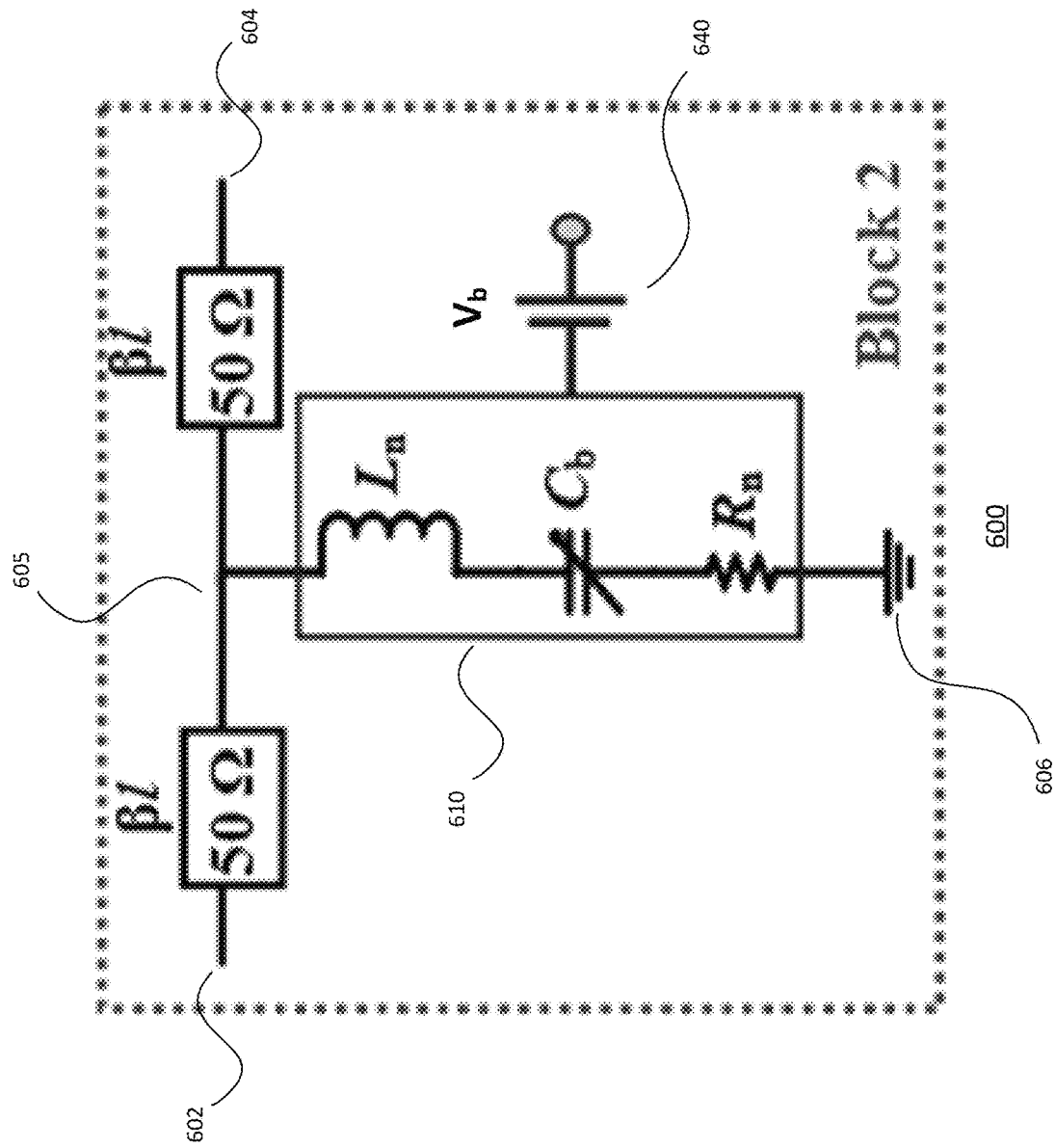
FIG. 6A is a schematic diagram of an example bridge array of the tunable bandpass filter of FIG. 1.

The second filter block 120 may include an array of fixed MEMS bridges that function as tunable capacitors. FIG. 6A shows a schematic diagram of an example bridge array 600 of the tunable bandpass filter of FIG. 1. The bridge array 600 may extend between a bridge array input end 602 and a bridge array output end 604. Adjacent transmission line portions are represented as impedance elements (31 in FIG. 6A. The adjacent transmission line on one end may connect to either the switch array input junction 202 or switch array output junction 204 of an adjacent first filter block 110, depending on which side of the first axis X the second filter block 120 is positioned. The adjacent transmission line on the other end may connect to the high impedance transmission line.

The bridge array 600 is positioned as a shunt varactor element between a point 605 connecting each of the bridge array input end 602, the bridge array output end 604, and ground 606. In the example of FIG. 6A, the bridge array is represented as an RLC element, since it contributes the properties of an RLC circuit to the filter.

Figure 6B:
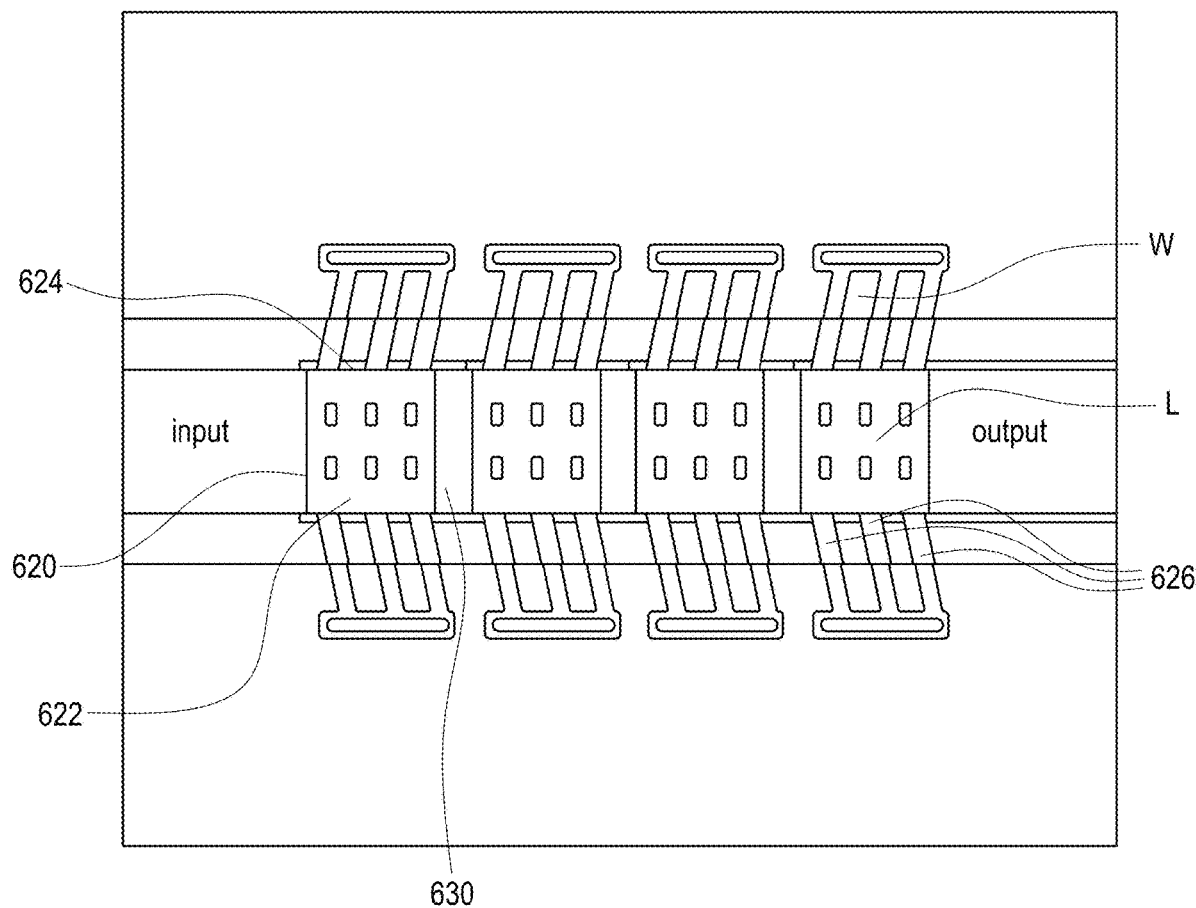
FIG. 6B is an image of an example layout of the switch array of FIG. 6A.

FIG. 6B is an image of an example layout of the bridge array 600 of FIG. 6A. In the example of FIG. 6B, the bridge array includes a plurality of MEMS bridges 610, arranged in series with one another along the lengthwise direction of the transmission line. In the example of FIG. 6B, the array includes four MEMS bridges, although in other examples, a different number of bridges may be included.

Each MEMS bridge 610 includes a beam 620 coupled to respective posts on opposite sides 622, 624 of the transmission path. Unlike the beams of the MEMS switch 210 in FIG. 2B, the beam 620 of the MEMS bridge 610 in fixed on both ends and not free to attach and separate from a side of the transmission path. In the example of FIG. 6B, three posts 626 are provided on each side 622, 624 of the beam 620, although in other examples more or fewer posts may be present. The posts 626 may include spring elements designed to facilitate deflection or buckling of the beam 620 in the downward direction. In some examples, the posts 626 may be positioned at an angle between the supporting substrate and the beam to reduce deflection amounts due to in-plane displacement effects from tensile stress. For example, each post may be positioned at a 45° incline, and may have a 3.5 µm thickness and 10 µm width.

In the example of FIG. 6B, the MEMS bridge 610 is a parallel plate MEMS bridge, whereby the beam 620 positioned over an electrode 630. Each beam of the bridge array may be positioned over a common electrode that extends a length of the array. The electrode 630 may have a thickness that is greater than a thickness of the beam 620. In some examples, the electrode may be 2 µm thick and may have a length L of about 65 µm and width W of about 90 µm. Although the beam ends are fixed, a midpoint of each beam is capable of vertical deflection or buckling in a direction towards the electrode plate. Capacitance between the beams and 620 electrode 630 may vary based on an electrostatic excitation between them, and this may affect the center frequency of the bridge array 600.

Referring to both FIGS. 6A and 6B, a bridge array bias line (not shown) may be coupled to the electrode 630 in order to supply a second control signal to the bridge array. For instance, the second control signal may be a second bias voltage ($V_b$) and may be received from a voltage source 640. The second bias voltage may control a force between the electrode 630 and the beams 620 of the MEMS bridge 610, whereby increasing the second bias voltage increases the downward deflection or buckling of the beams 620 towards the electrode 630. Thus, a capacitance of each MEMS bridge 610 may vary as a function of the second bias voltage, and thus a capacitance of the entire bridge array 600 as a whole may also vary as a function of the second bias voltage. Controlling a capacitance of the bridge array may control a roll-off frequency of the array, which may be a frequency at which the signal attenuates by 3 dB or by 5 dB. Frequencies higher than the roll-off frequency may be dampened by the shunt varactor elements while frequencies lower than the roll-off frequency continue to be passed along the transmission line.

The example bridge array of FIG. 6A may have a sharp roll-off. For example, the bridge design of FIG. 6B may be a third-order 3 dB ripple Chebyshev filter and series capacitor array. The basic filter elements may be extracted from a Chebyshev equal ripple low pass filter prototype. The normalized filter elements for a 3 dB ripple Chebyshev prototype are given as g1=3.3487, g2=0.7117, and g3=3.3487 with g4=1.00 as the load impedance.

Figure 7:
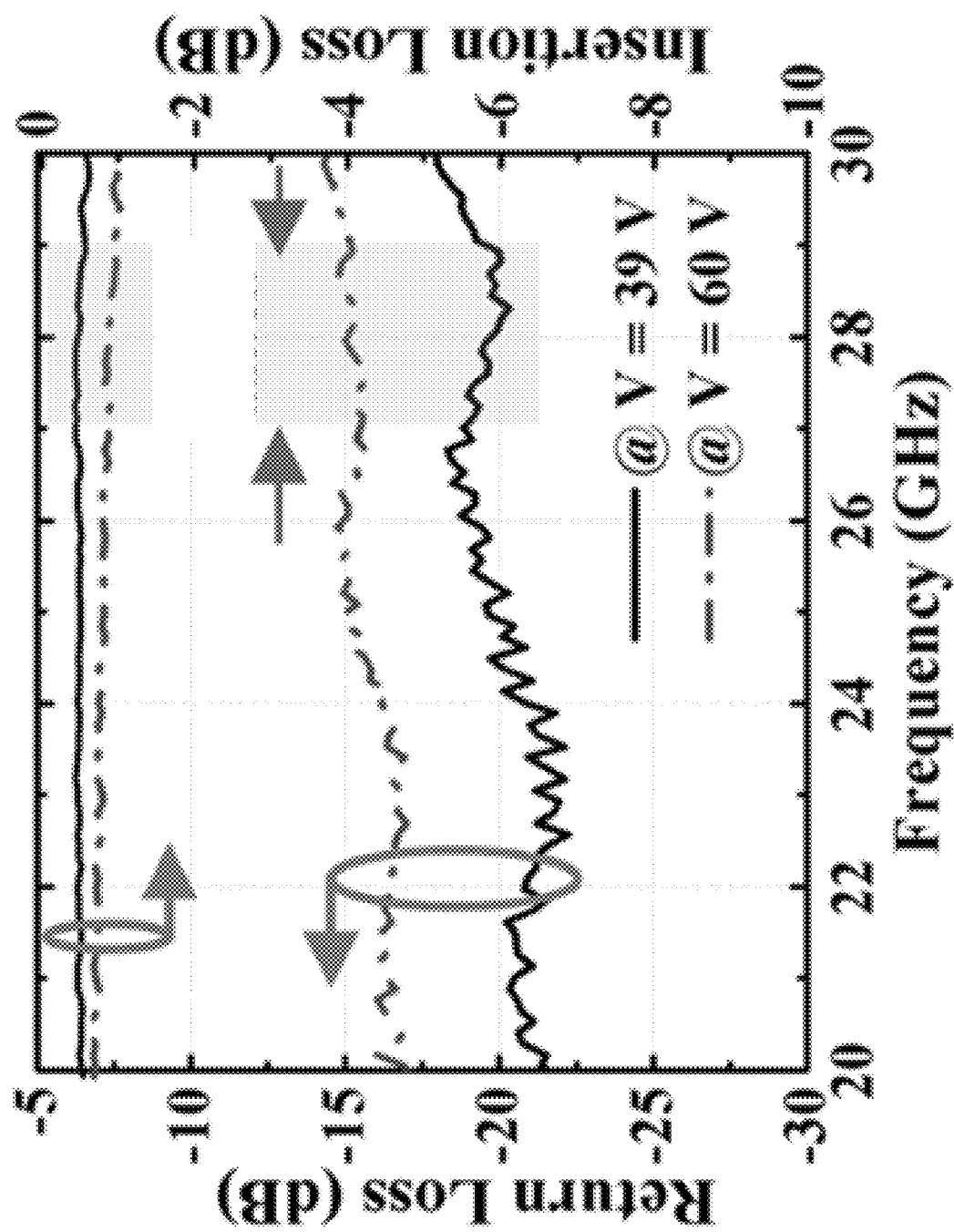
FIG. 7 is a graph illustrating S-parameters of the switch array of FIG. 6B.

The example bridge array of FIGS. 6A and 6B reduces overall noise while at the same time preventing signal attenuation. FIG. 7 illustrates S-parameters of the bridge array 600 at different bias voltages. As can be seen in FIG. 7, return loss of the bridge array remains about 18 dB or better for frequencies up to and including 30 GHz at a bias voltage of 39V and about 15 dB or better at a bias voltage of 60V, while insertion loss of the bridge array is about 0.5 dB or less for the same range of frequencies at a bias voltage of 39V and about 1 dB or less at a bias voltage of about 60V.

TABLE 2

| Frequency | $V_b$ (V) | $C_b$ (fF) | Insertion Loss (dB) | Return Loss (dB) |
| --- | --- | --- | --- | --- |
| 27 GHz | 59 | 170 | 0.86 | 15.49 |
| 27.5 GHz | 55 | 165 | 0.8 | 16.5 |
| 28 GHz | 51 | 160 | 0.71 | 17.6 |
| 28.5 GHz | 43 | 155 | 0.65 | 18.5 |
| 29 GHz | 39 | 150 | 0.57 | 19.27 |

Figure 8:
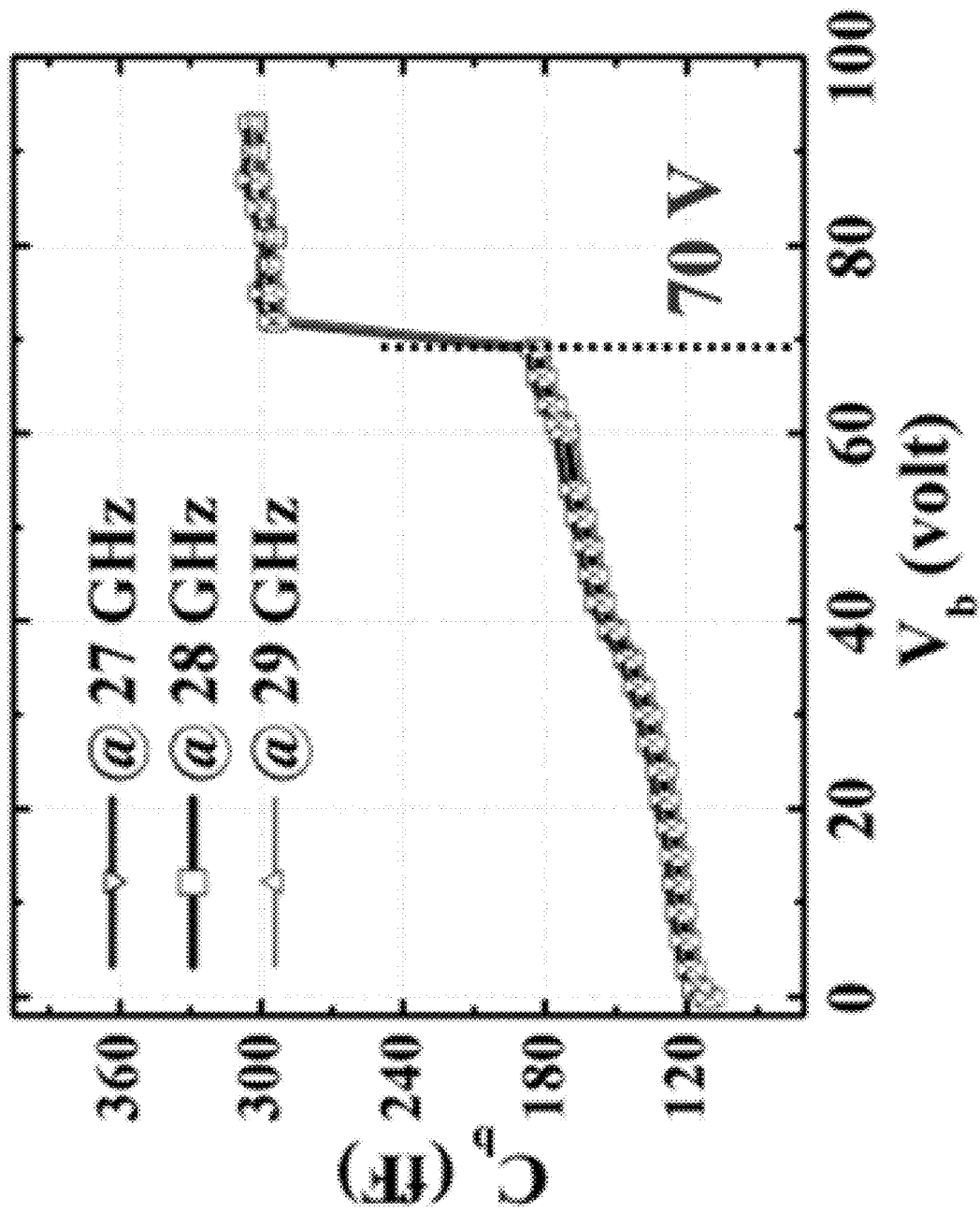
FIG. 8 is a graph illustrating variations in capacitance as a function of applied voltage for the example bridge array of FIG. 6B.

A capacitance of the example bridge array of FIGS. 6A and 6B varies as a function of the bias voltage applied to it. These variations can be seen in FIG. 5C, in which capacitance of the bridge array ($C_b$) gradually increases from 120-180 fF for a range of bias voltages from 0-70 V, and particularly between 150-170 fF within the operating range of 27-29 GHz for a range of bias voltages between 39-59 V. The capacitance also remains relatively stable at about 290-310 fF for bias voltages between about 75-95 V. It can be seen from FIG. 8 that the bridge array has a point of instability at about 70 V. Testing to find a point of instability such as the one shown in FIG. 8 can inform operation decisions, such as designing the switch to operate across a range of bias voltages that does not cross the point of instability in order to avoid the beam not starting and finishing a cycle at the same point. It can also be seen from FIG. 8 that the capacitances remain relatively stable for each of a 27 GHz, 28 GHz and 29 GHz operating frequencies, with variations in capacitance of about 10 fF depending on the frequency.

Figure 9A:
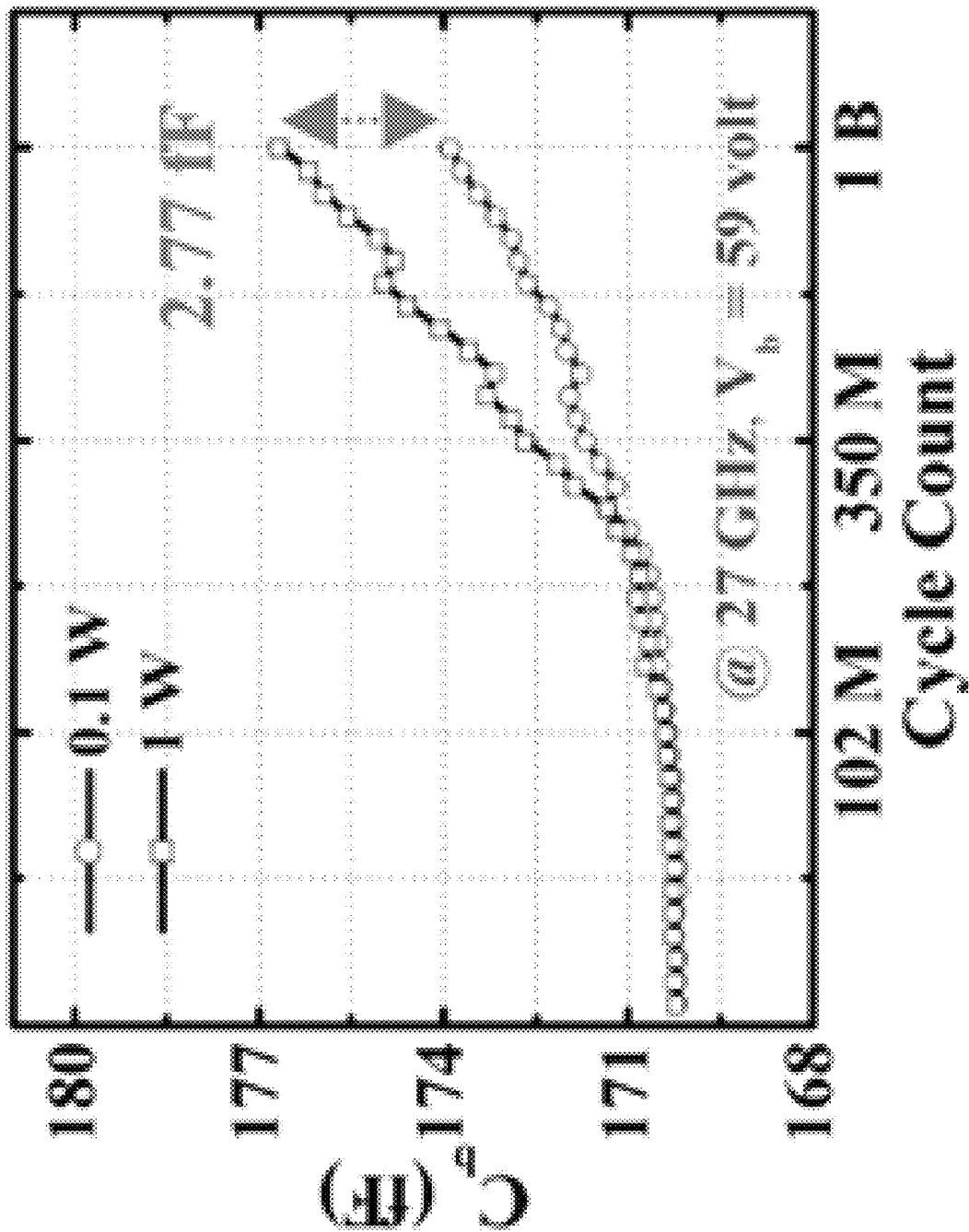
FIGS. 9A, 9B, 9C and 9D are graphs illustrating variations in capacitance during lifetime of the example bridge array of FIG. 6B.
Figure 9B:
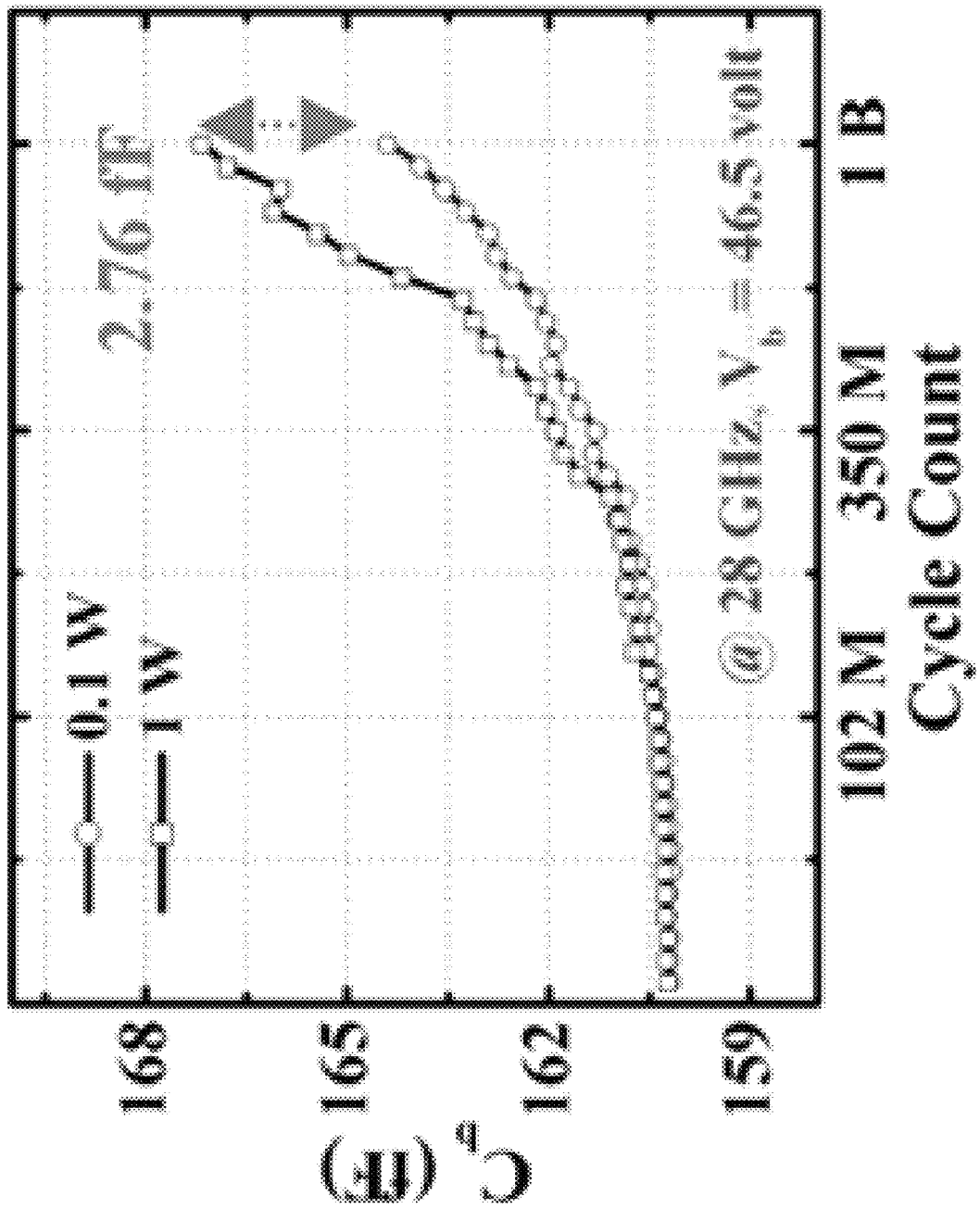
Figure 9C:
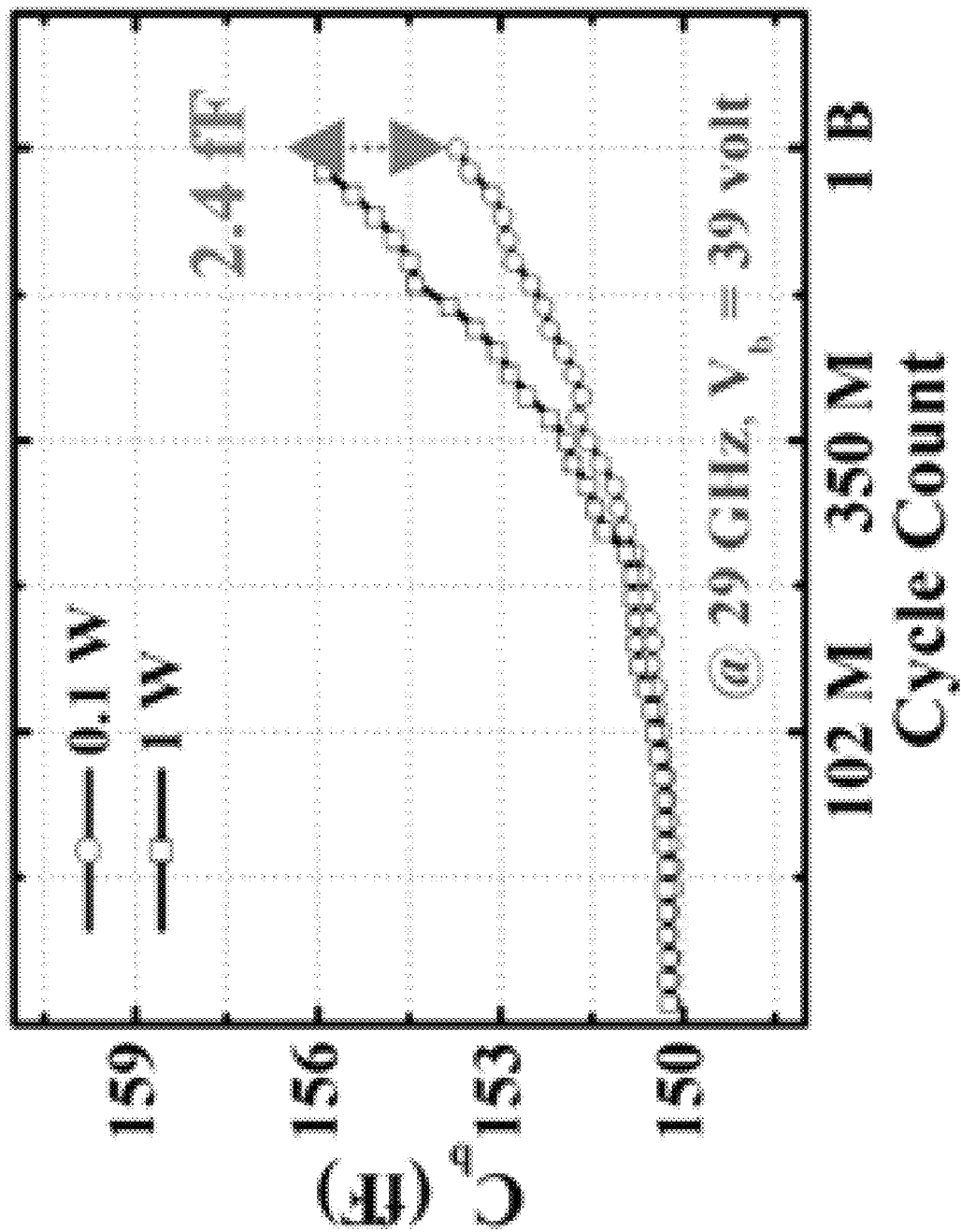
Figure 9D:
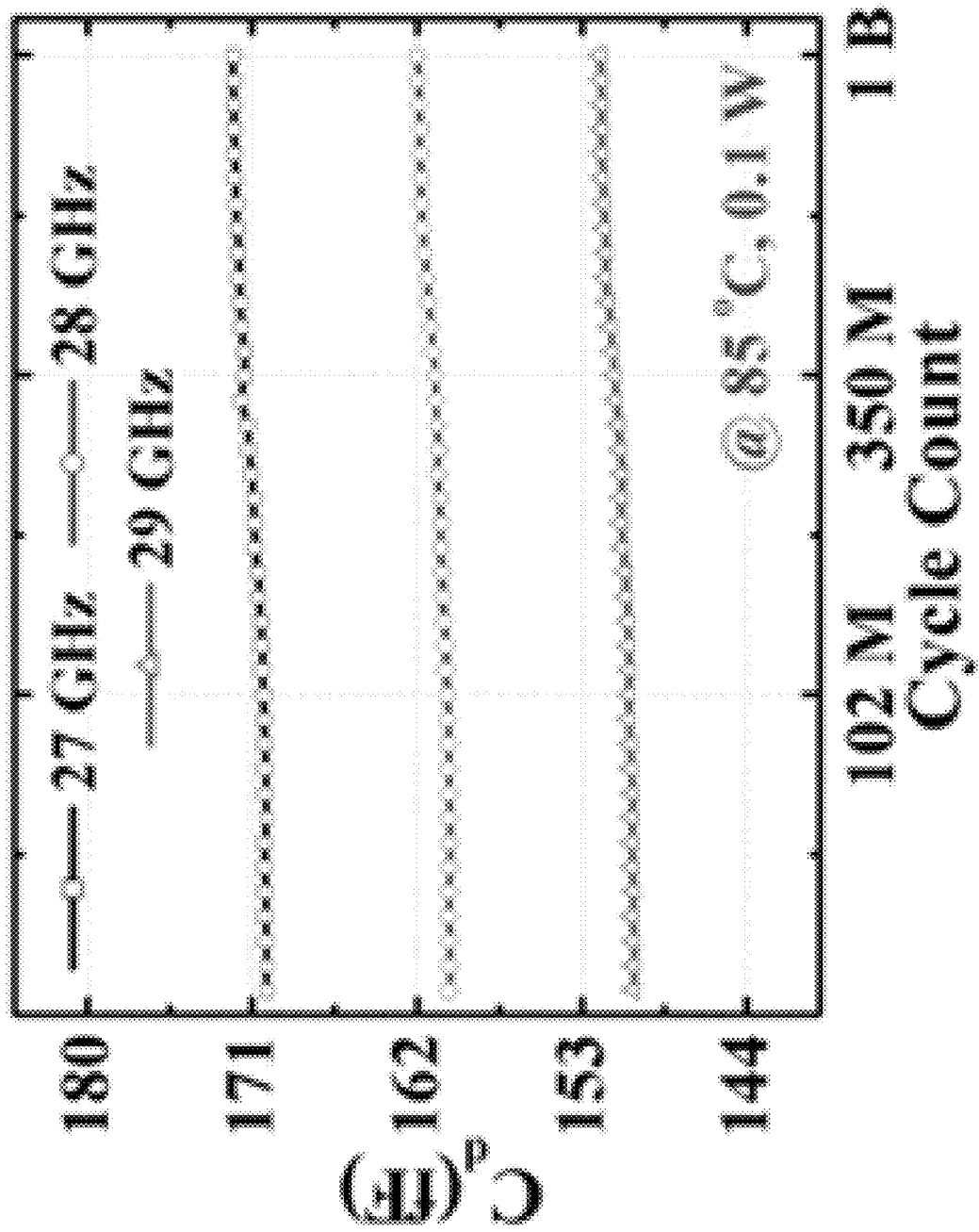

Additionally, the capacitance of the bridge array of FIG. 6B remains very stable operationally over a long lifespan, such as up to one billion cycles, or in other words excitation of the MEMS bridges up to one billion times. FIG. 9A illustrates changes in capacitance of the bridge array 600 over a billion-cycle lifespan of the bridge array at an operating frequency of 27 GHz for an operating power of 0.1 and 1.0 W, FIG. 9B illustrates changes in capacitance of the same bridge array 600 under the same conditions but at an operating frequency of 28 GHz, and FIG. 9C illustrates changes in capacitance of the same bridge array 600 under the same conditions but at an operating frequency of 29 GHz. As can be seen in FIGS. 9A, 9B and 9C, a bridge array capacitance ($C_b$) of the bridge array remains within about 2.77 fF for an operating frequency of 27 GHz, within about 2.76 fF for an operating frequency of 28 GHz, and within about 2.4 fF for an operating frequency of 29 GHz, over the course of one billion switch cycles when an operational power of the bridge varies between 0.1-1.0 W. Changes to the capacitance as a function of the operating frequency can be seen in each of FIGS. 9A, 9B and 9C. These increases are more clearly shown in FIG. 9D, which illustrates changes in bridge array capacitance of the bridge array as a function of each of the operating frequency and the lifespan of the bridge array. As can be seen in FIG. 9D, capacitance of the bridge array can increase by about 250 fF for a range of bias voltages from 85-105 V.

Figure 10:
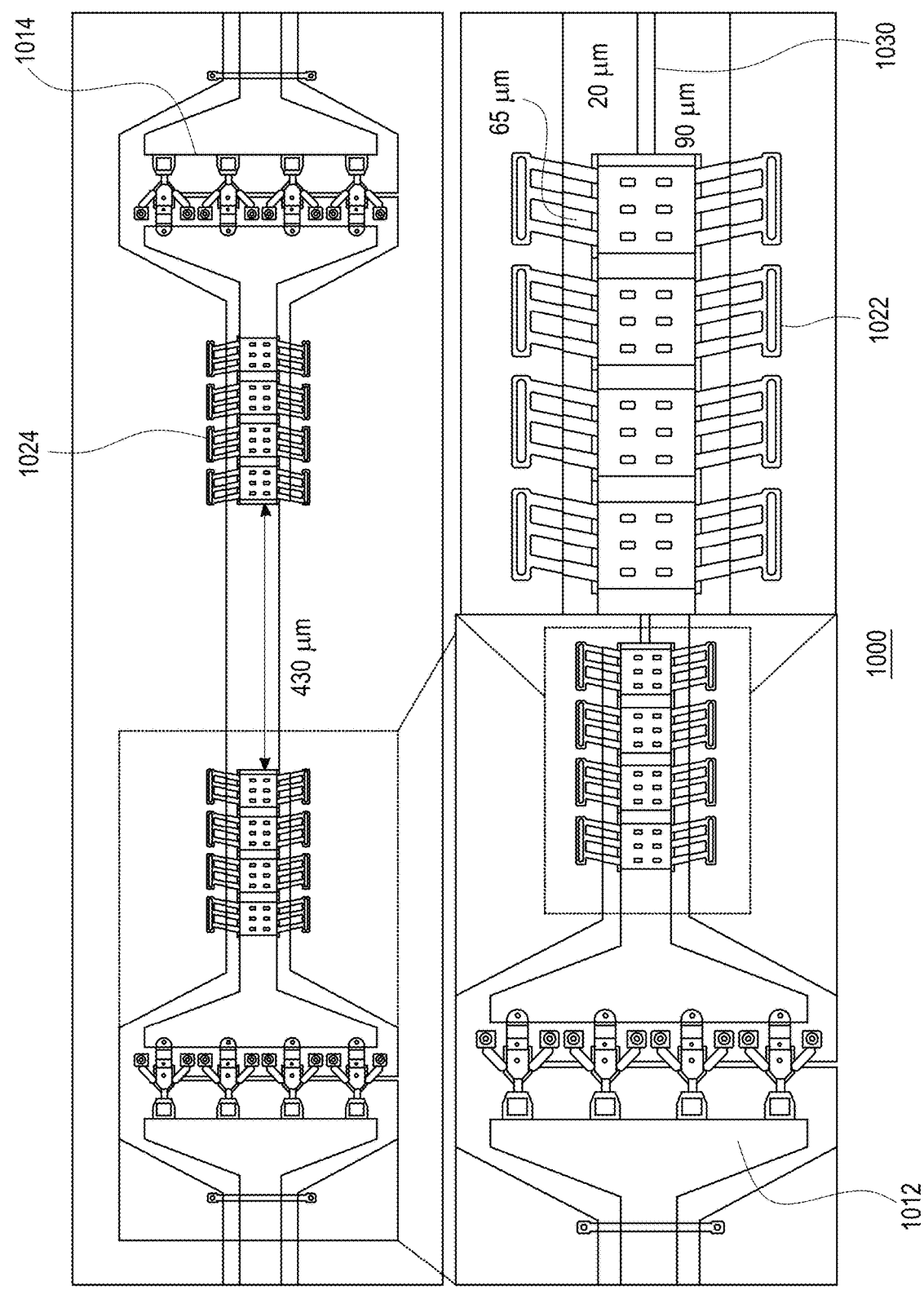
FIG. 10 is an image of an example layout of the tunable bandpass filter of FIG. 1 including the example switch array of FIG. 2b and the example bridge array of FIG. 6B.

FIG. 10 is an image of an example layout of the tunable bandpass filter 100 of FIG. 1, including the example switch array 200 of FIG. 2B and the example bridge array 600 of FIG. 6B. In the example of FIG. 10, two switch arrays 1012, 1014 are provided on opposite sides of the first axis X, and two bridge arrays 1022, 1024 are provided on opposite sides of the first axis X. The third filter block, high impedance line 1030, connects the two bridge arrays 1022, 1024 to one another. The length of the high impedance line 1030 may be selected to provide good impedance matching between the opposing sides of the tunable bandpass filter.

The high impedance line may be a coplanar waveguide line having an electrical length ($\beta l_c$) of less than $\lambda/4$, where $\beta$ is the propagation constant and $\lambda$ is the wavelength of an RF signal propagated along the line. A reactance of the circuit with a high impedance line of a given length $l_c$ is given by $X_L=Z_0\beta l_c$, where $Z_0$ is the characteristic impedance of the line. 94Ω impedance is used with 430 μm length of CPW line. In the example of FIG. 10, the high impedance line has a length of 430 μm and a width of 20 μm, and spans from the bridge array output end of one bridge array 1022 to the bridge array input end of the other bridge array 1024.

The example filter of FIG. 10 may be fabricated on a substrate having properties that permit for operation over the millimeter-wave 5G band. For example, a 635 μm alumina substrate ($\varepsilon_r$=9.8) may be used. The inductance ($L_b$) of the high impedance line ($Z_b$) may be a fixed value, such as 94Ω. The total area of the filter may be as small as 2.3 mm$^2$, including bias lines and pads connected to the bias lines.

In some examples, the individual filter blocks of the filter design in FIG. 10 may be constructed separately and then assembled on the substrate. For example, a micromachining process may be used to build each function block of the filter, including individual switches and varactors, as well as for building arrays such as the switching array and bridge array. These individual components may be individually tested for desired operating performance before being assembled. All switches and varactors may be designed to actuate within a point of stability, and with no contacting being made throughout the cycle. As such, the micromachined design may be very stable, allowing for switch and bridge array designs that remain reliable through over one billion cycles.

Micromachining may permit for added control in maintaining common heights for all filter block components. For example, all MEMS switches may be maintained within a 110 nm height range, and all MEMS bridges may be maintained within a 170 nm height range. Additionally, beams may all be fabricated at about 3.7 μm in thickness, and the dielectric layer on the bottom electrode may have an average roughness of about 12 nm. Variations of this small degree have been demonstrated to show good thermosmechanical behavior and thus are suitable for the embodiments described herein.

Table 3 shows an example set of proposed functional parameters for a tunable bandpass filter, including proposed capacitance values for each of the first filter block ($C_s$) and the second filter block ($C_b$) and inductance values for the third filter block ($L_b$) across the 5G-compatible band from 27-29 GHz.

TABLE 3

| Frequency | $C_b$ (fF) | $C_s$ (fF) | $L_b$ (pH) | % BW |
|---|---|---|---|---|
| 27 GHz | 170 | 420-450 | 137 | 14.2 |
| 27.5 GHz | 165 | 400-460 | 137 | 11.7 |
| 28 GHz | 160 | 420-450 | 137 | 12.8* |
| 28.5 GHz | 155 | 40-450 | 137 | 13.2 |
| 29 GHz | 150 | 410-450 | 137 | 13.6 |

Figure 11A:
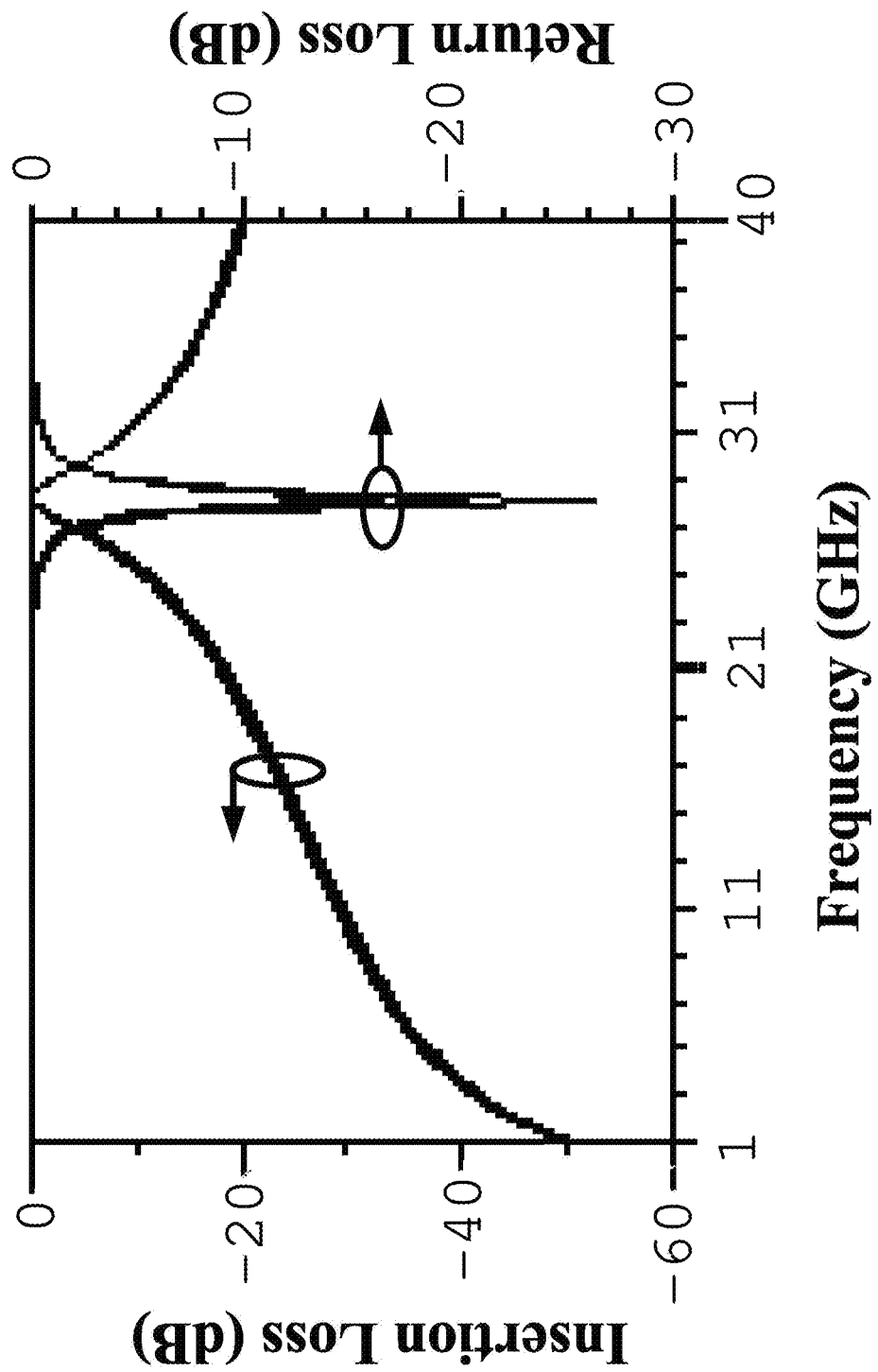
FIGS. 11A, 11B, 11C, 11D, 11E and 11F are graphs illustrating respective ranges of simulated responses of the example tunable bandpass filter of FIG. 10 at respective operating frequencies.
Figure 11B:
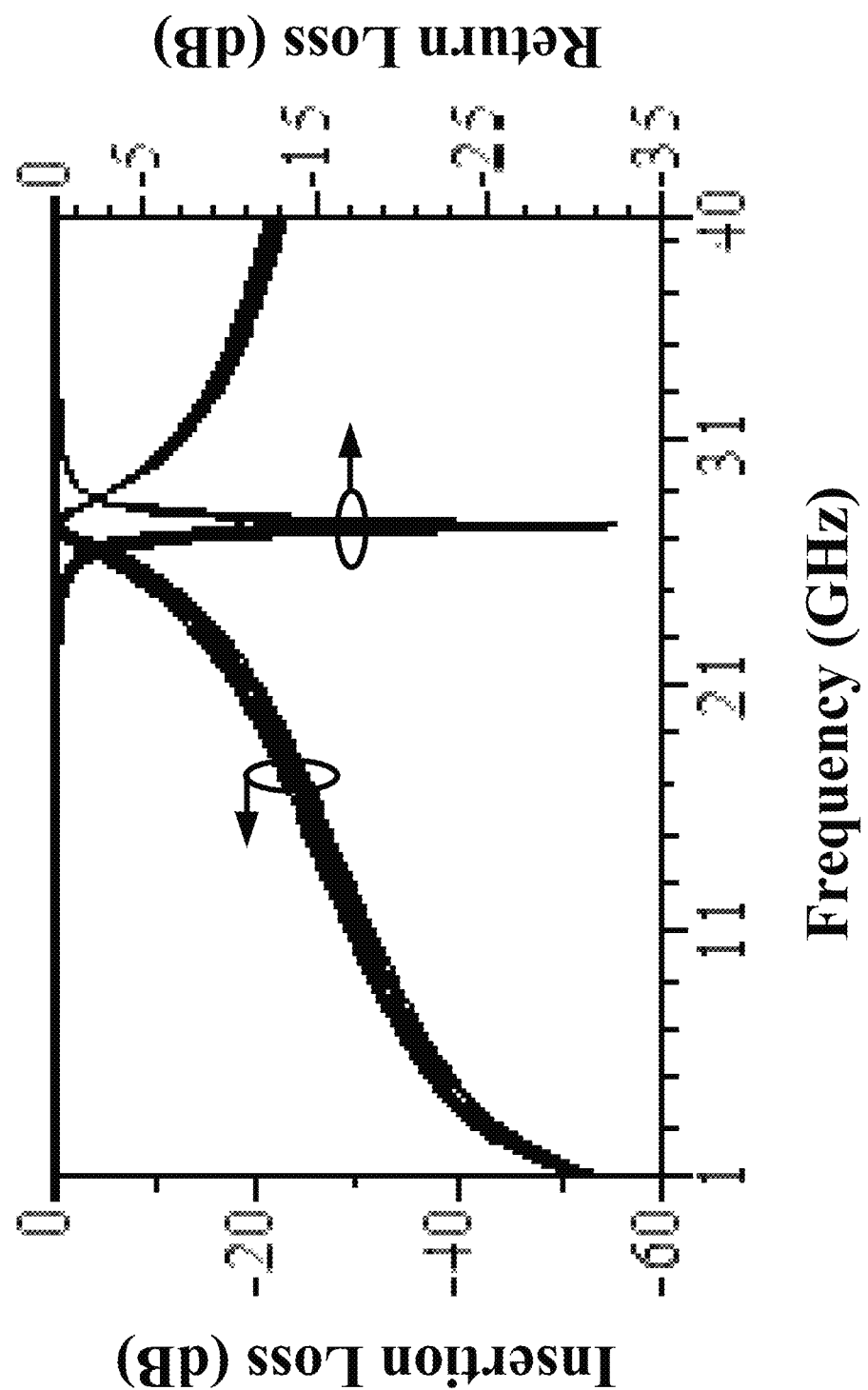
Figure 11C:
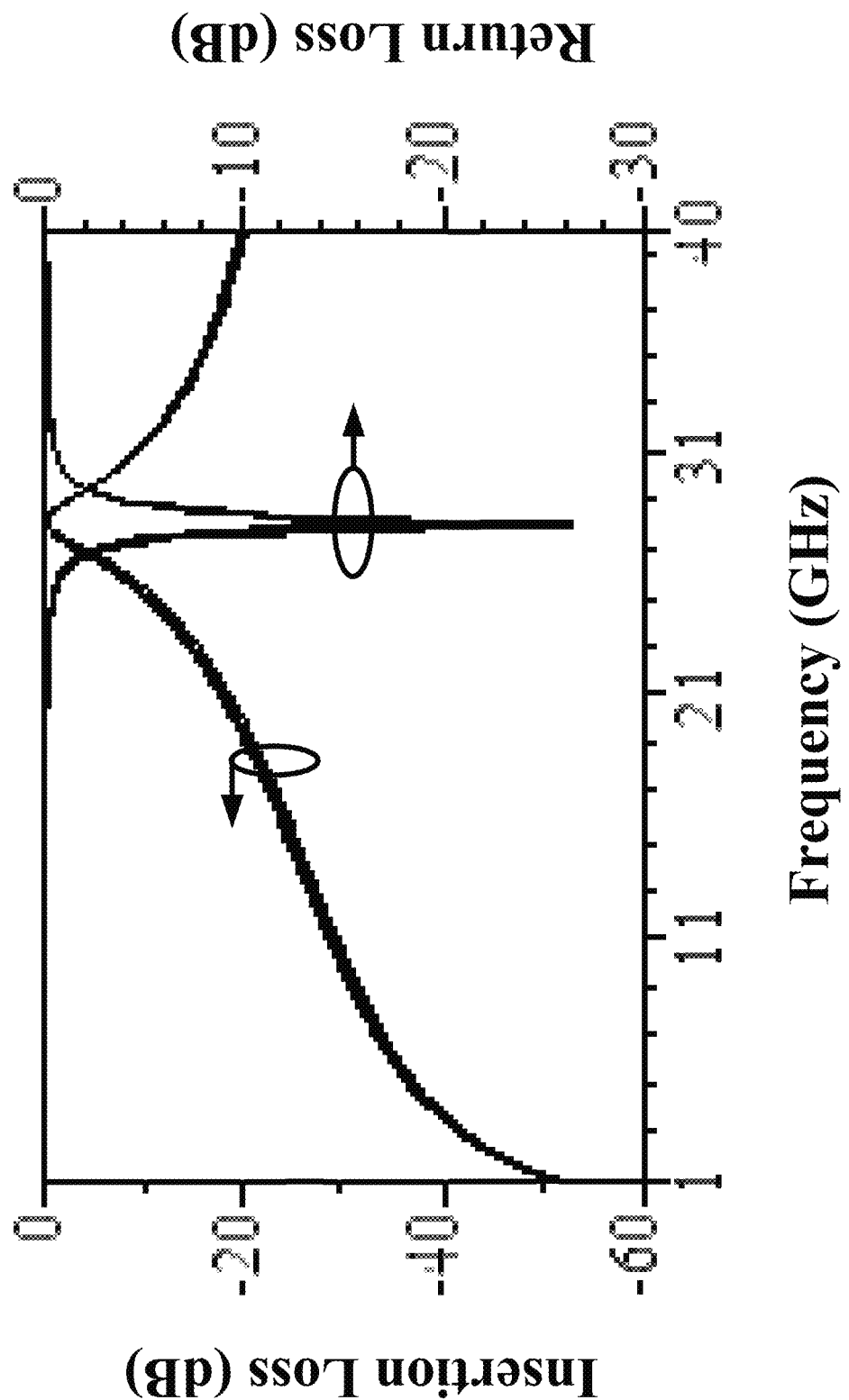
Figure 11D:
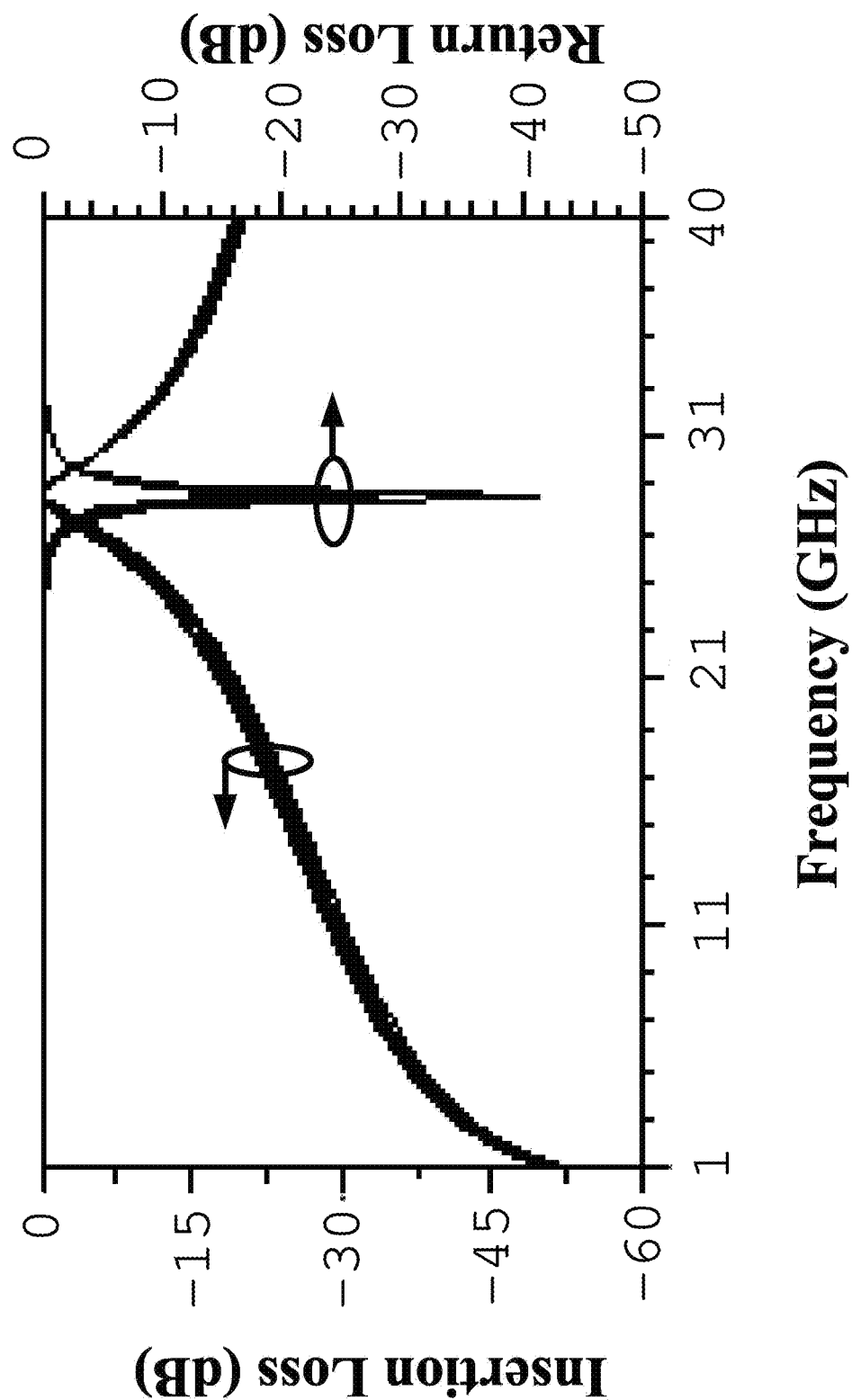
Figure 11E:
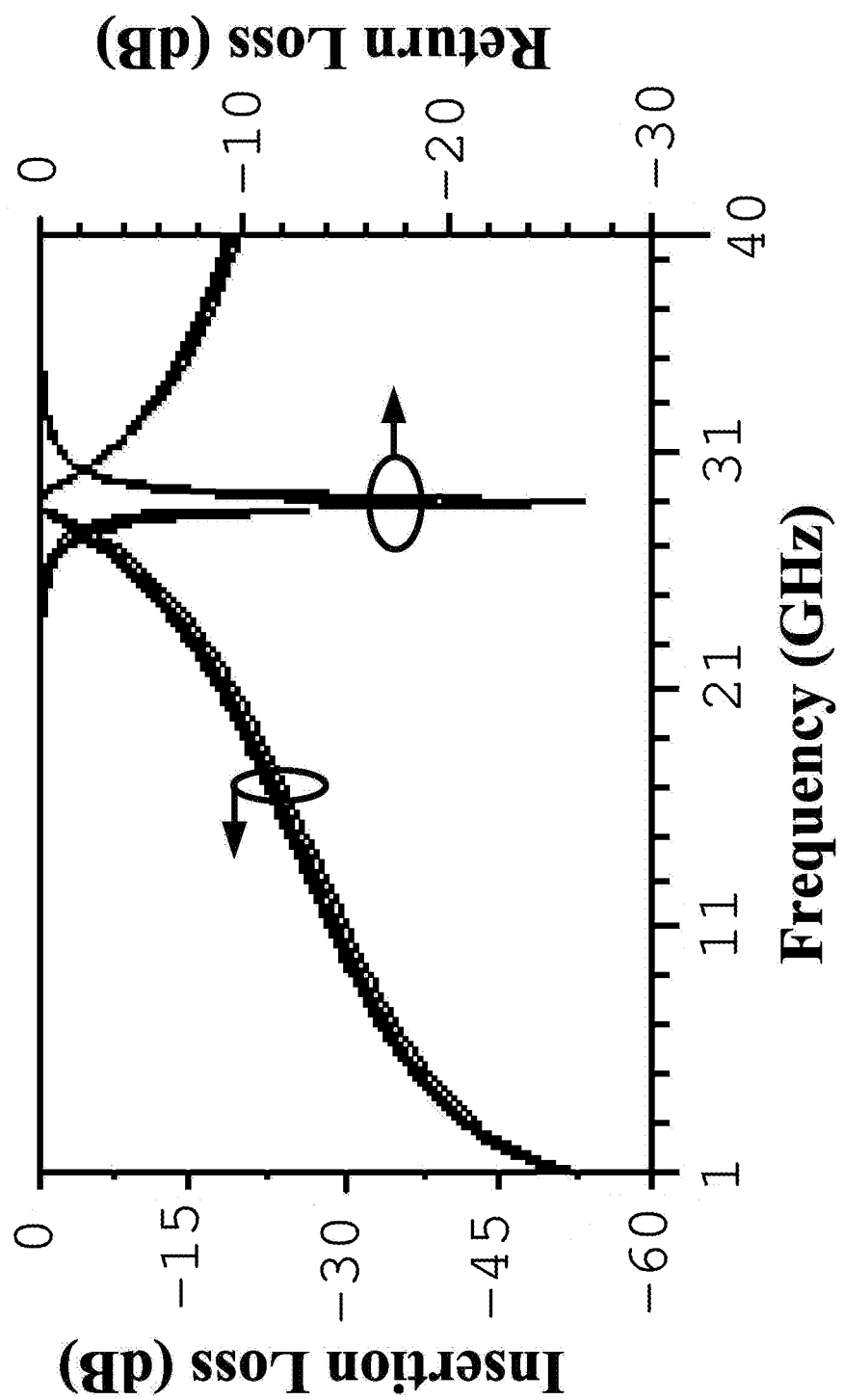
Figure 11F:
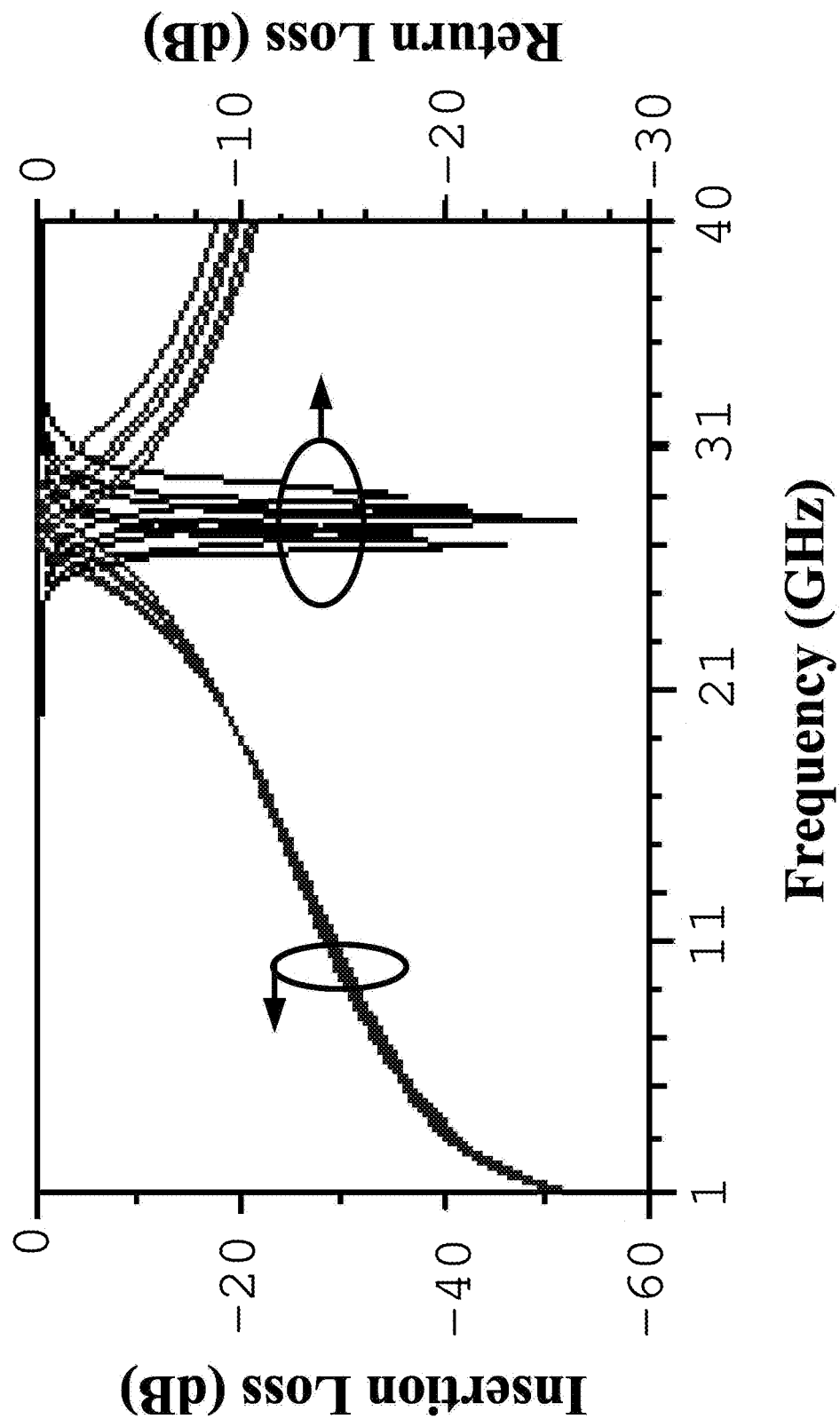

Simulations of the tunable bandpass filter have shown the design of FIG. 10 to be operable for at least a band of frequencies between 27 GHz and 29 GHz. For example, FIG. 11A shows the filter tuned to 27 GHz having a return loss of as much as 55 dB at the center frequency, FIG. 11B shows the filter tuned to 27.5 GHz having a return loss of as much as 57 dB at the center frequency, FIG. 11C shows the filter tuned to 28 GHz having a return loss of as much as 54 dB at the center frequency, FIG. 11D shows the filter tuned to 28.5 GHz having a return loss of as much as 48 dB at the center frequency, and FIG. 11E shows the filter tuned to 29 GHz having a return loss of as much as 50 dB at the center frequency. Matching characteristics for each tuned setting are substantially the same, albeit at shifted frequencies. These results may be obtained by adjusting the values of $C_s$ and $C_b$ for the filter, which in turn may be performed by adjusting the respective bias voltages applied to each filter block. FIG. 11F shows the results of FIGS. 11A-E overlaid on top of one another.

Figure 12A:
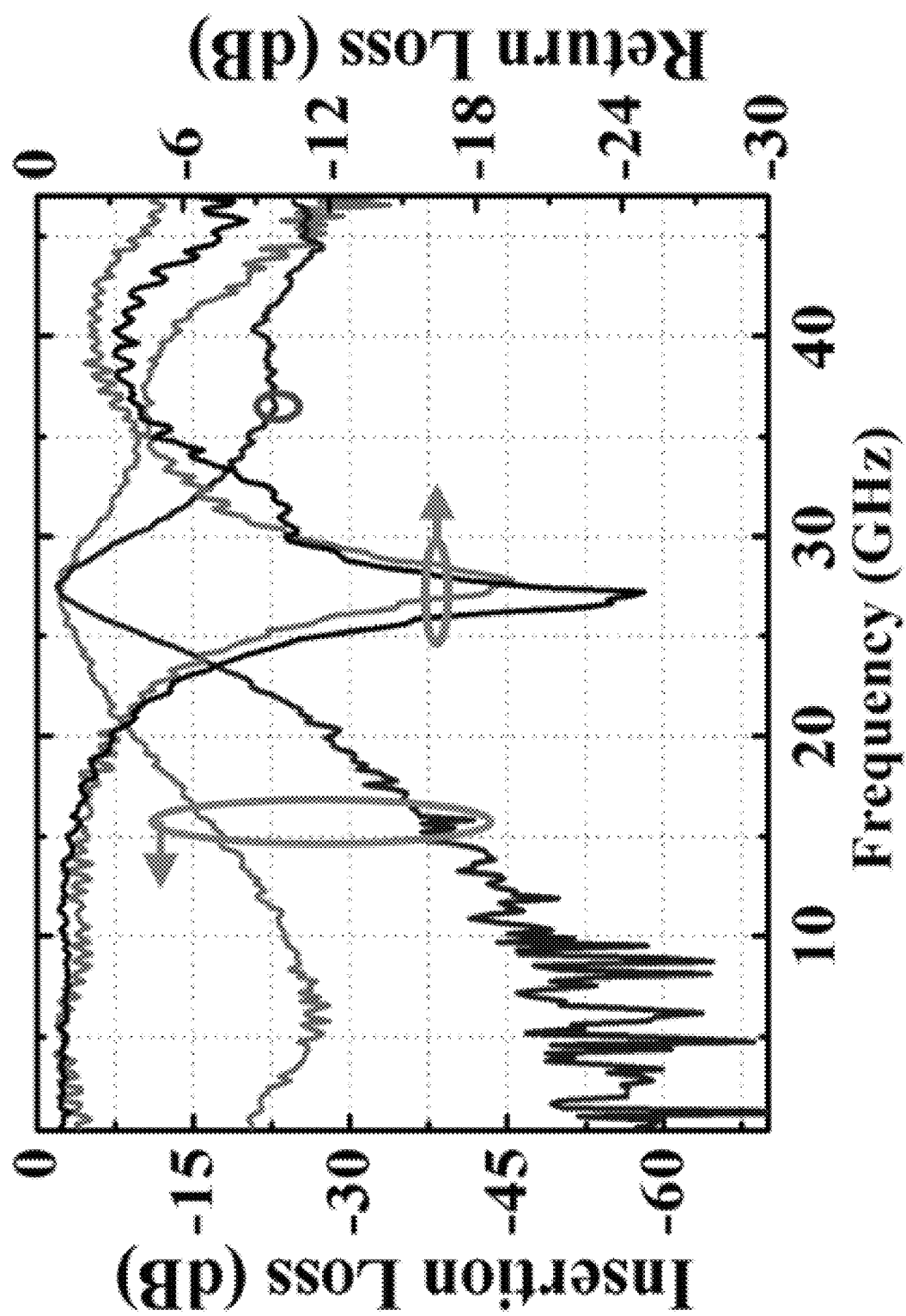
FIGS. 12A, 12B, 12C and 12D are graphs illustrating S-parameters of the example tunable bandpass filter of FIG. 10 at respective operating frequencies.
Figure 12B:
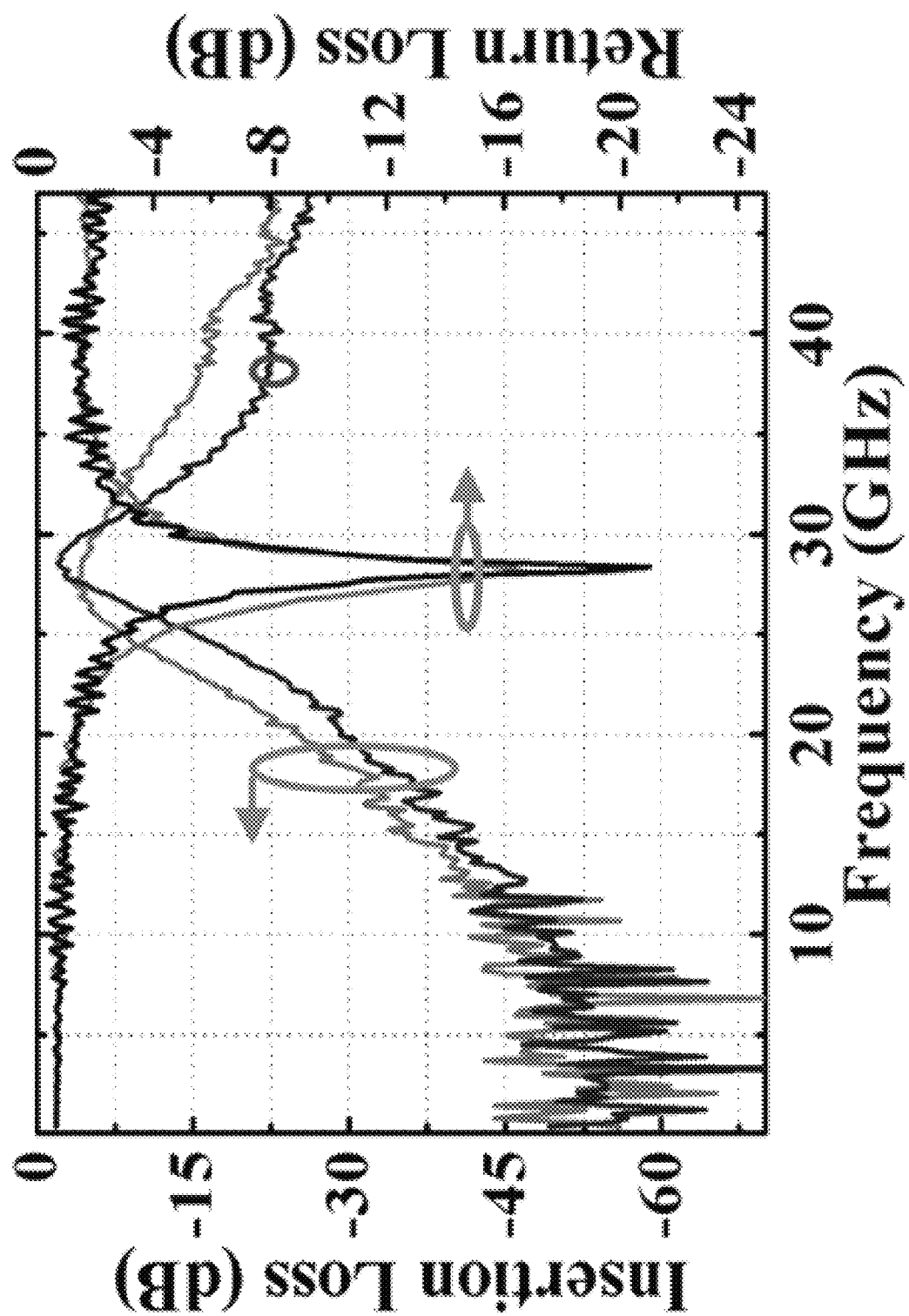
Figure 12C:
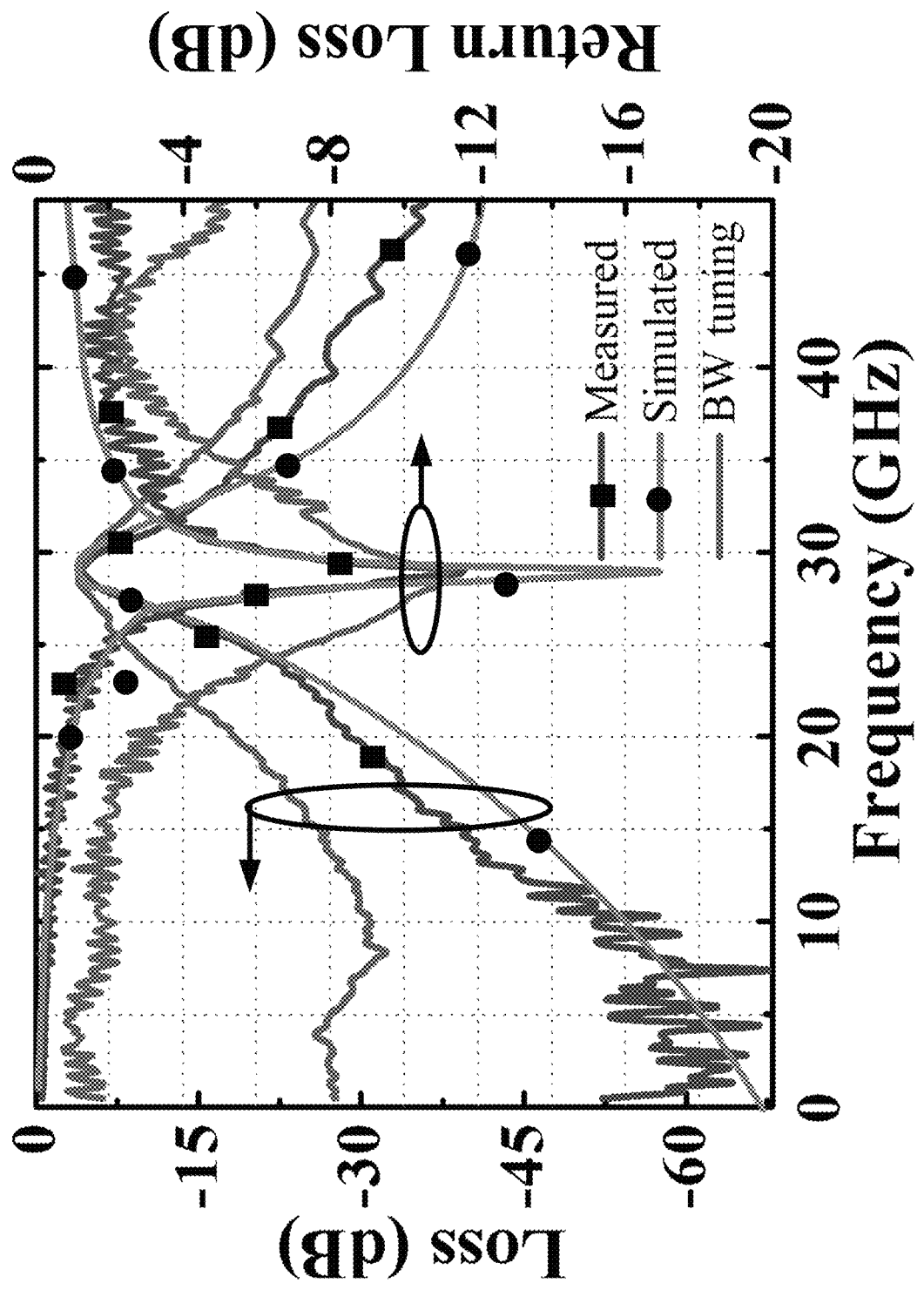
Figure 12D:
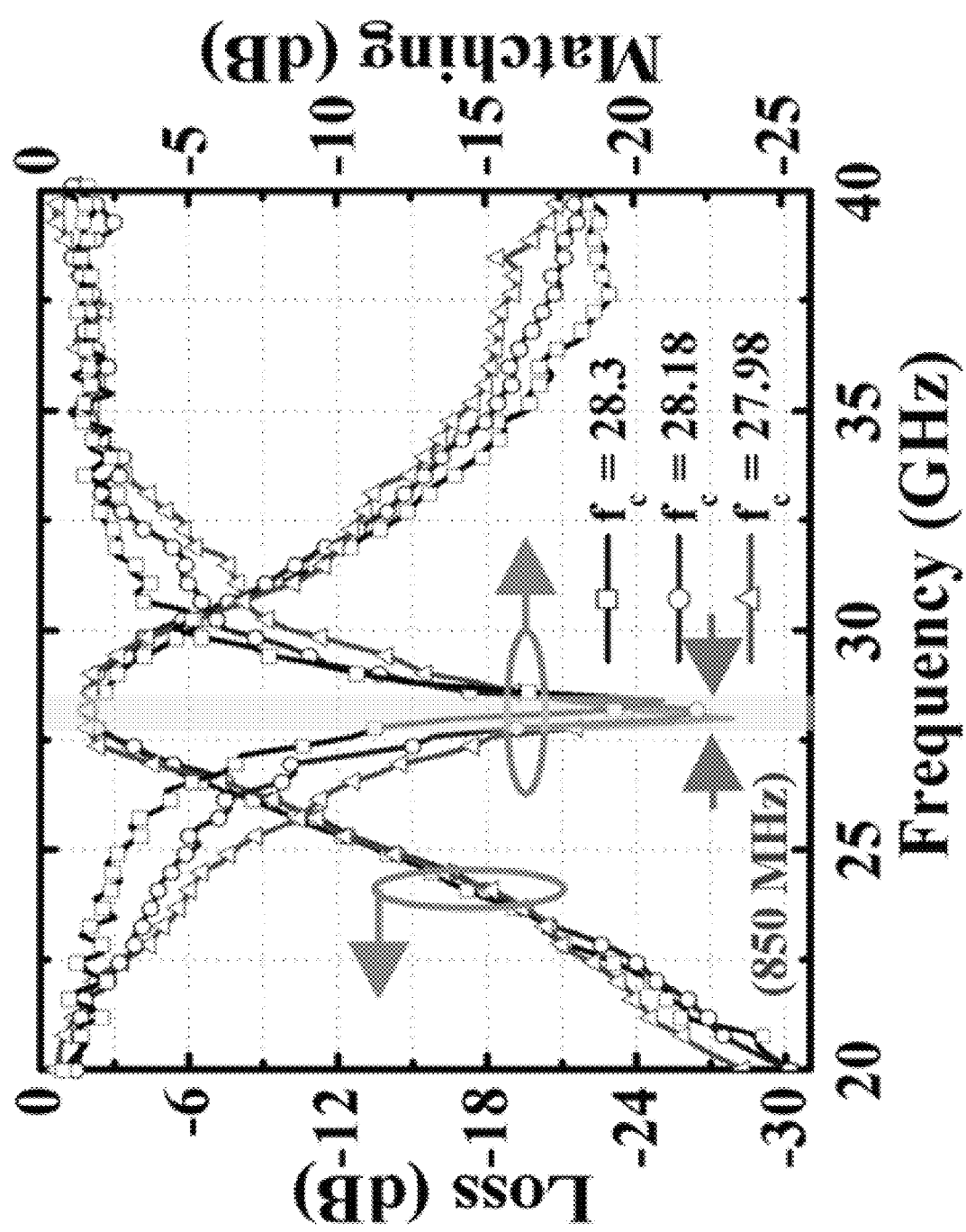

The tunable bandpass filter of FIG. 10 reduces overall noise while at the same time preventing signal attenuation. FIGS. 12A, 12B and 12C illustrate S-parameters of the filter at operating frequencies of 27.4 GHz, 28.3 GHz and 29 GHz, respectively. FIG. 12D illustrates S-parameters of the filter at each of operating frequencies of 28.3 GHz, 28.18 GHz and 27.8 GHz.

As can be seen in FIG. 12A, the filter exhibits insertion loss of 1.9 dB at the center frequency, and return loss of better than 24 dB with the bridge array bias voltage set to 61V and an operating power of 0.1 W. Average insertion loss is about 2.22 dB, and return loss is about 22.5 dB, over the range 26.975-27.825 GHz (bandwidth of 0.85 GHz). Over a 3 dB bandwidth (26.5-28.75 GHZ, with a fractional bandwidth (FBW) of 8.2%), the filter exhibits insertion loss of about 3.12 dB and return loss of about 20 dB. Stop-band rejection (SBR) is better than 20 dB. In the example of FIG. 12A, the filter is tuned with a switch array bias range of 88-100 V while maintaining a constant bridge array bias of 61 V. For instance, at a switch array bias of 91V, the filter exhibits an average insertion loss of about 3 dB and return loss of better than 13.3 dB between 25.84-28.51 GHz (bandwidth of 2.67 GHz).

As can be seen in FIG. 12B, the filter exhibits insertion loss of 2.1 dB at the center frequency, and return loss of better than 21 dB with the bridge array bias voltage set to 48V and an operating power of 0.1 W. Average insertion loss is about 2.4 dB, and return loss is about 22.5 dB, over the range 27.875-28.72 GHz (bandwidth of 0.85 GHz). Over a 3 dB bandwidth (27.36-29.4 GHZ, with an FBW of 7%), the filter exhibits insertion loss of about 3.2 dB and return loss of about 21.3 dB. SBR is better than 30 dB. At a switch array bias of 95V, the filter exhibits an average insertion loss of about 5 dB with maximum tuning from 27.3-30 GHz (bandwidth of 2.7 GHz).

Next, as can be seen in FIG. 12C, the filter exhibits insertion loss of 4 dB at the center frequency, and return loss of better than 11.6 dB with the bridge array bias voltage set to 39V and an operating power of 0.1 W. Average insertion loss is about 4.46 dB, and return loss is about 10.8 dB, over the range 28.575-29.425 GHz (bandwidth of 0.85 GHz). Over a 3 dB bandwidth (27.75-30.27 GHZ, with an FBW of 8.6%), the filter exhibits insertion loss of about 5.36 dB and return loss of about 9.7 dB. At a switch array bias of 100V and a center frequency of 30.3 GHz, the filter exhibits an average insertion loss of about 5 dB and return loss of about 10 dB with maximum tuning from 28.17-32.58 GHz (bandwidth of 4.41 GHz).

Lastly, as can be seen in FIG. 12D, filter responses with fine tuning around a center frequency of about 28 GHz were tested. The bridge array bias voltage ($V_b$) was set to a constant 48 V, and the switch array bias voltage ($V_s$) was adjusted between 96-97.2 V to create the fine-tuning effect. Adjustment of $V_s$ did not affect the capacitance of the bridge array ($C_b$), only the capacitance of the switch array (Cs) was affected, and rose to its highest value at the lowest tested frequency, 27.98 GHz. Results shown for tests at 28.3 GHz in FIG. 12B are reproduced in FIG. 12D. FIG. 12D further shows that the filter exhibits insertion loss of about 2 dB and return loss of better than 22.2 dB at a tuned frequency of 28.18 GHz, an average insertion loss of about 2.06 dB and average return loss of about 20 dB for an 850 MHz band centered around the tuned frequency of 28.18 GHz, and an average insertion loss of about 2.7 dB and average return loss of about 15 dB for the 3 dB bandwidth around the tuned frequency of 28.18 GHz. FIG. 12D also shows that the filter exhibits insertion loss of about 1.92 dB and return loss of 23.4 or better at a tuned frequency of 27.98 GHz, an average insertion loss of about 2 dB and an average return loss of about 19 dB for an 850 MHz band centered around the tuned frequency of 27.98 GHz, and an average insertion loss of about 2 dB and an average return loss of about 19 dB for the 3 dB bandwidth around the tuned frequency of 27.98 GHz. Filter responses further show an about 20 dB stopband rejection between 23-35 GHz. Thus, the filter demonstrates its best results (from among the tested frequencies) around a tuned frequency of 27.98 GHz. Of the results shown above, the lowest FBW is achieved at 27.98 GHz and is about 6.7%. These measurements also validate the simulated data shown in FIGS. 17A-H, described in greater detail below.

Ultimately, the tunable bandpass filter of FIG. 10 is expected to achieve matching (input and output) of better than 18 dB and a worst-case insertion loss of 0.6 dB across the operating frequency range of 27-29 GHz.

Figure 13A:
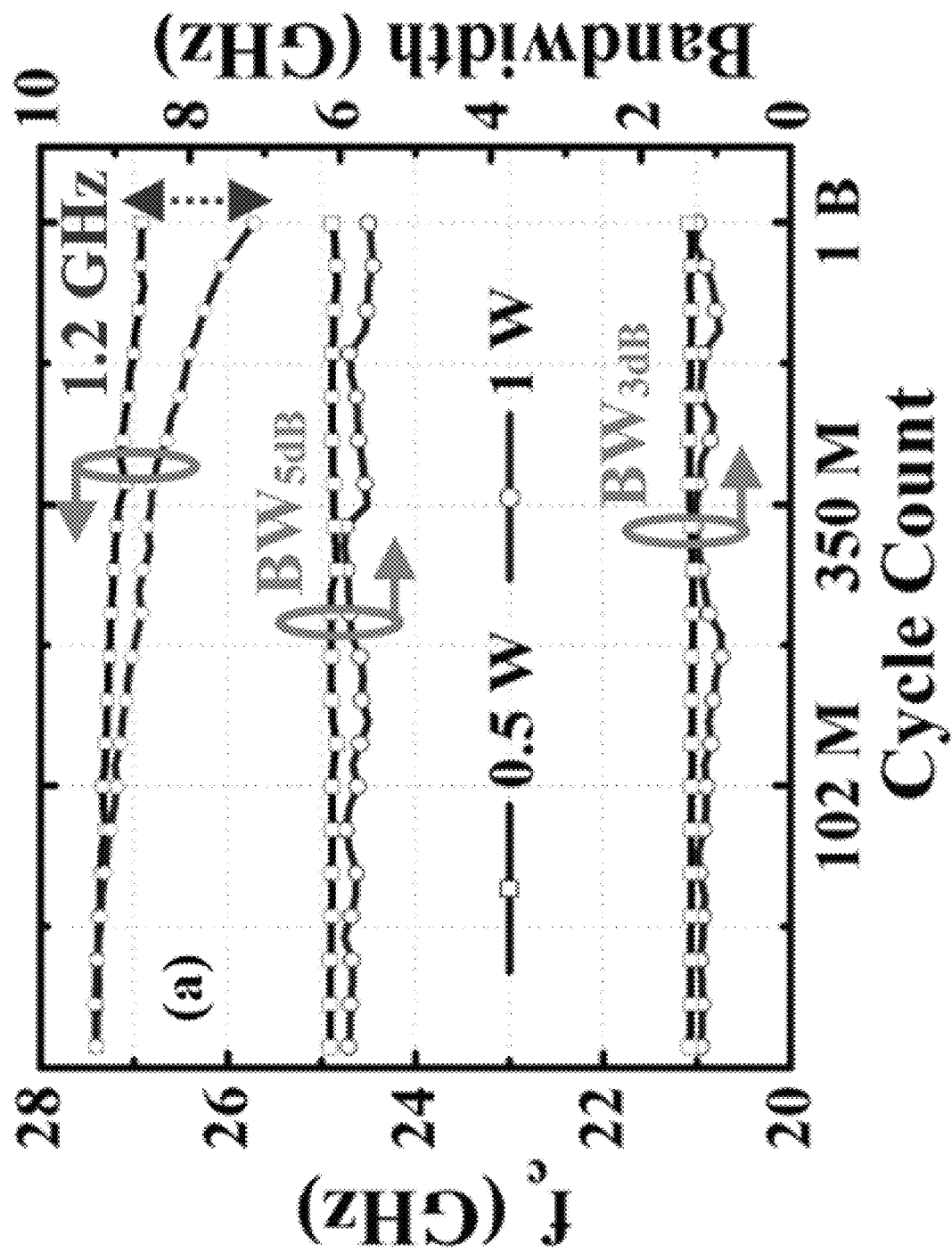
FIGS. 13A, 13B and 13C are graphs illustrating reliability of a bandwidth during lifetime of the example tunable bandpass filter of FIG. 10 at respective operating frequencies.
Figure 13B:
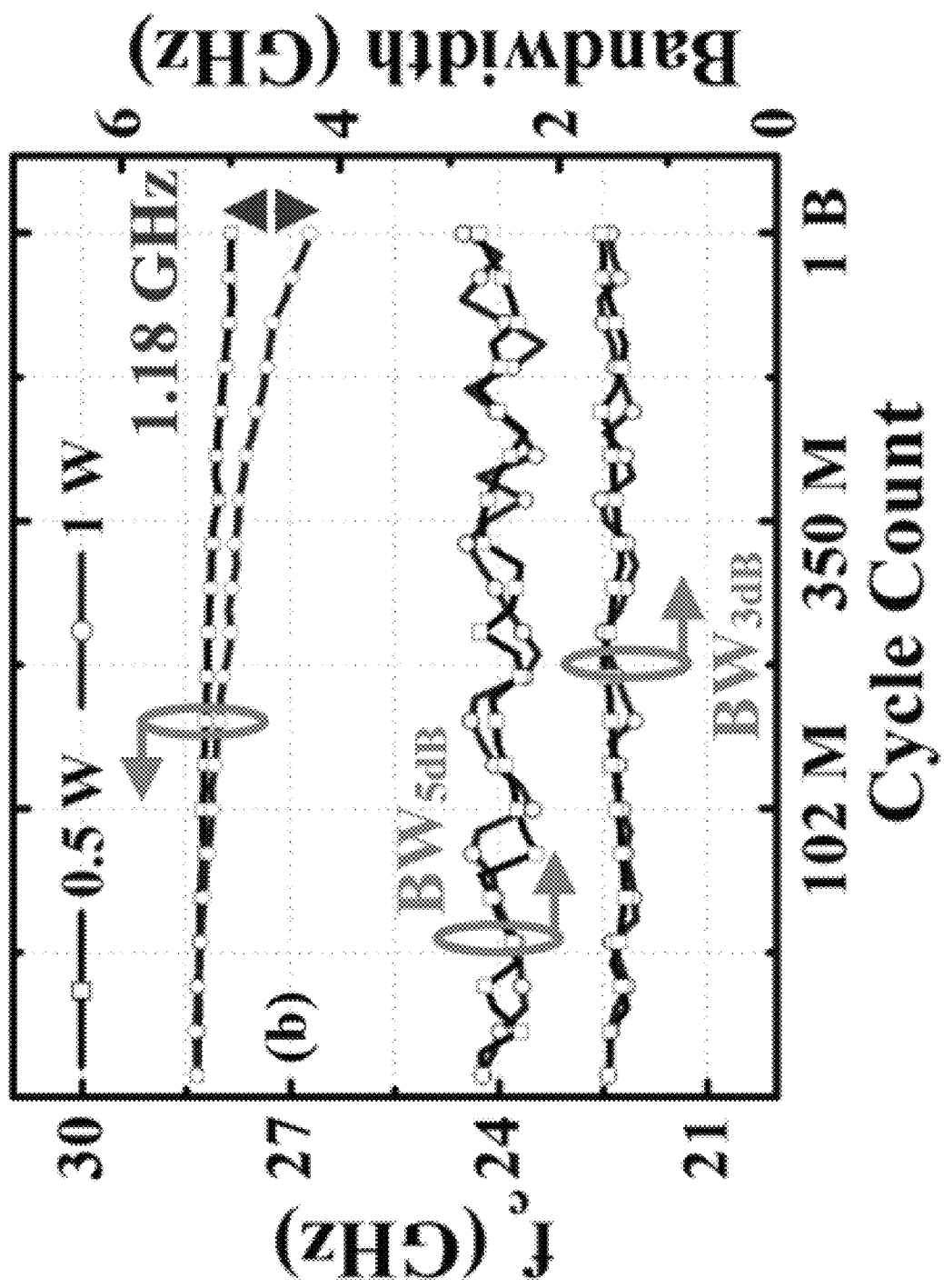
Figure 13C:
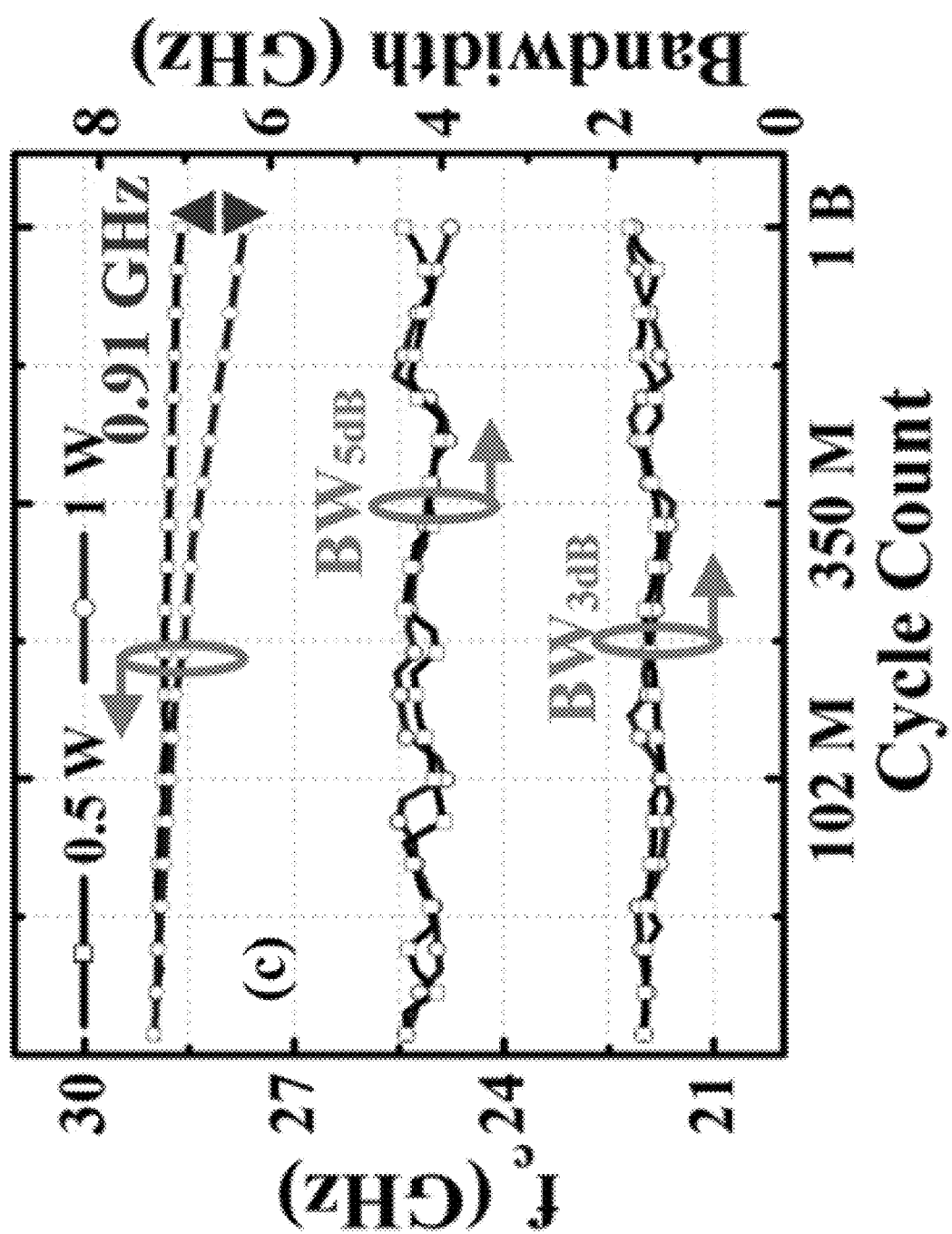

The tunable bandpass filter of FIG. 10 also exhibits reliable passband bandwidth characteristics over its lifetime, such as one billion cycles. FIGS. 13A, 13B and 13C illustrate 3 dB and 5 dB bandwidths of the filter at operating frequencies of 27 GHz, 28 GHz and 29 GHz, respectively. As can be seen in FIG. 13A, the 3 dB bandwidth of the filter remains about 1.6 GHz, and the 5 dB bandwidth remains approximately 6 GHz, at 27 GHz. Also, as can be seen in FIG. 13B, the 3 dB bandwidth of the filter remains about 1.7-1.8 GHz, and the 5 dB bandwidth remains approximately 2.5-2.9 GHz, at 28 GHz. Lastly, as can be seen in FIG. 12C, the 3 dB bandwidth of the filter remains about 1.7-1.9 GHz, and the 5 dB bandwidth remains approximately 3.9-4.6 GHz, at 29 GHz. Overall, the 3 dB bandwidth variation is about 11.7-14.2% across the range of operating frequencies, 27-29 GHz and the filter achieves a total available frequency range from 25.5-30.4 GHz when the considering the 3 dB bandwidth range for the 27-29 GHz operating frequency range.

Further reliability tests were carried out at center frequencies of 27.4 GHz, 27.98 GHz, 28.3 GHz and 29 GHz.

Figure 14A:
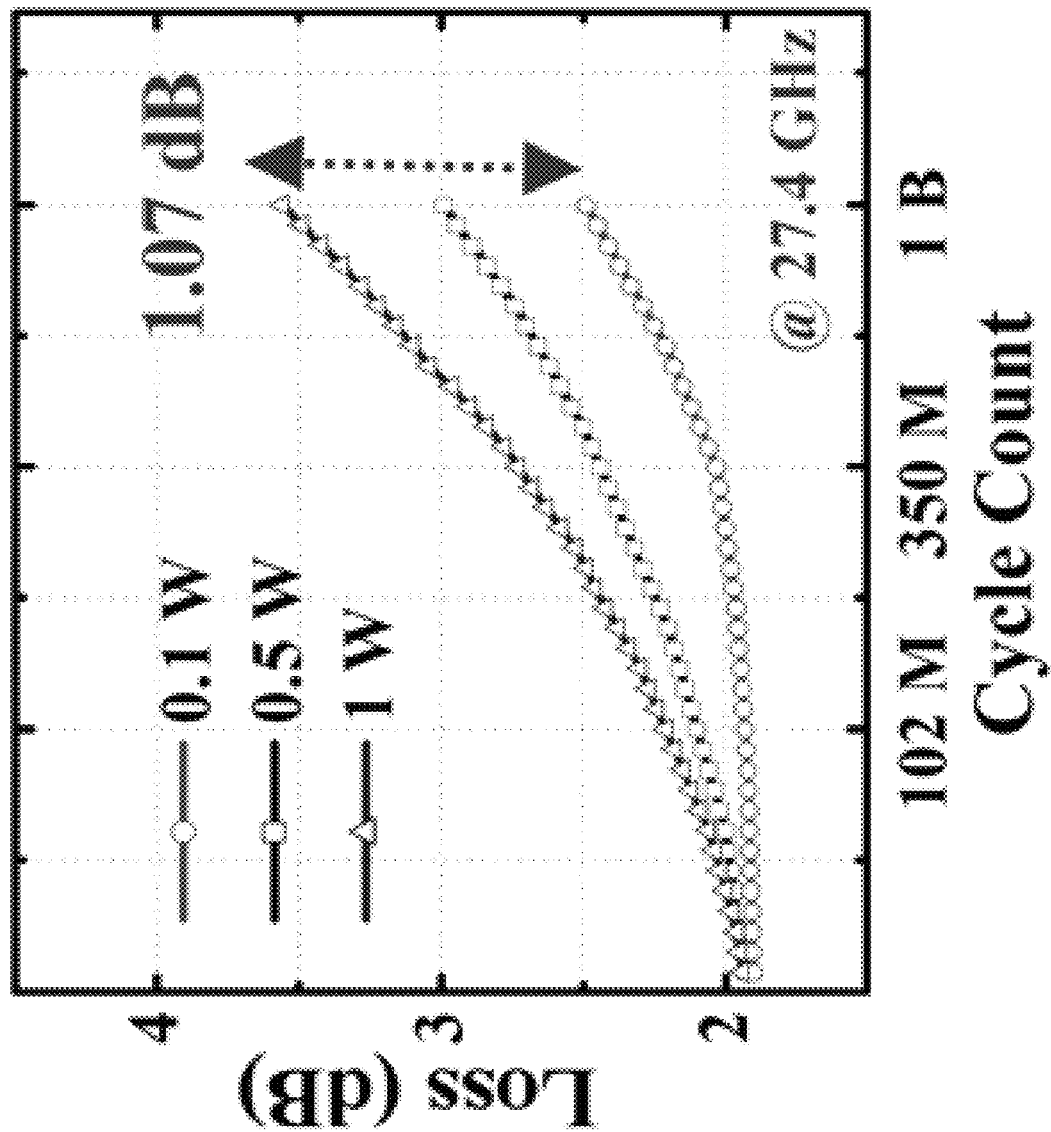
FIGS. 14A, 14B, 14C and 14D are graphs illustrating reliability of a filter response during lifetime of another example tunable bandpass filter at respective operating frequencies.
Figure 14B:
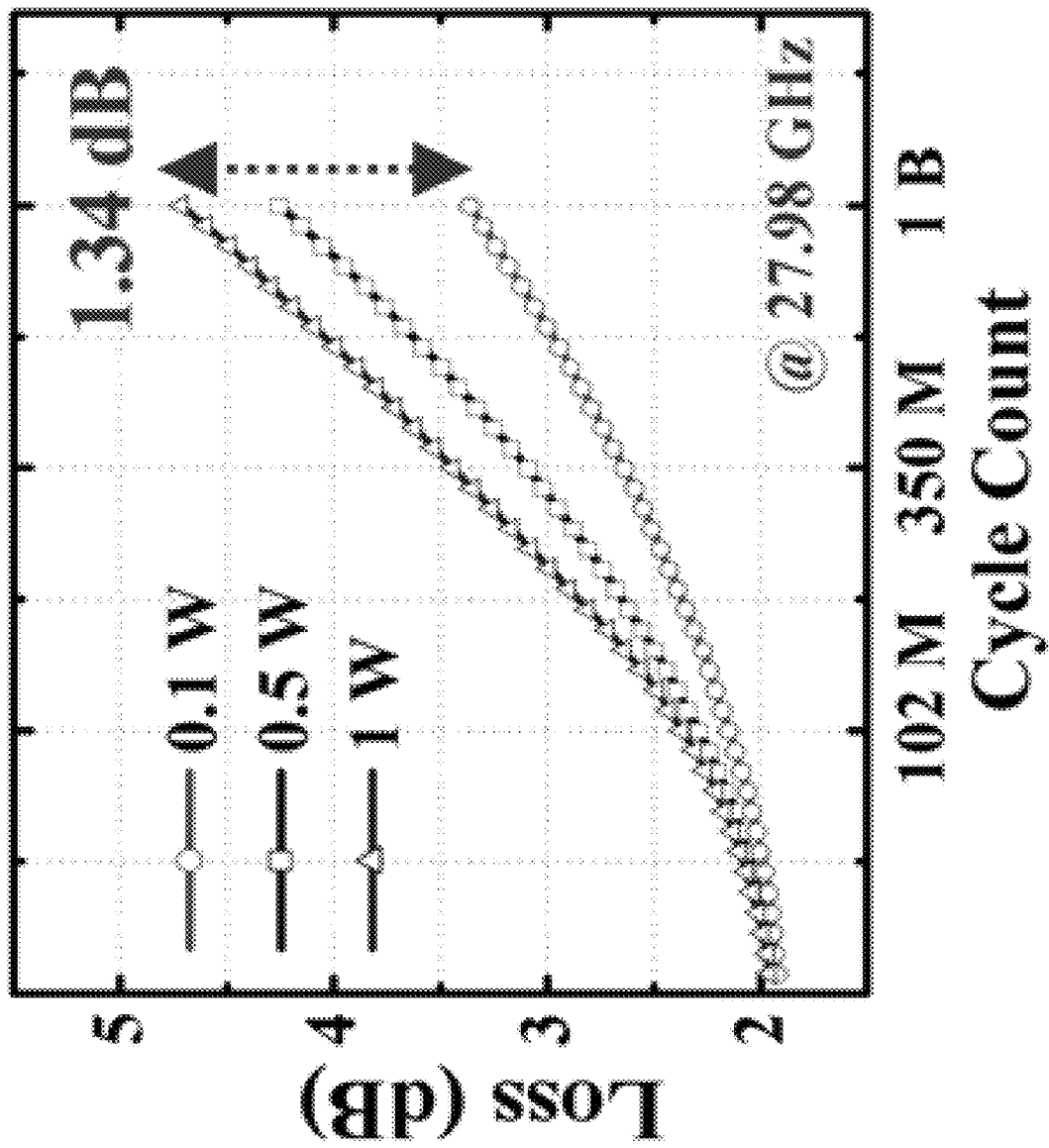
Figure 14C:
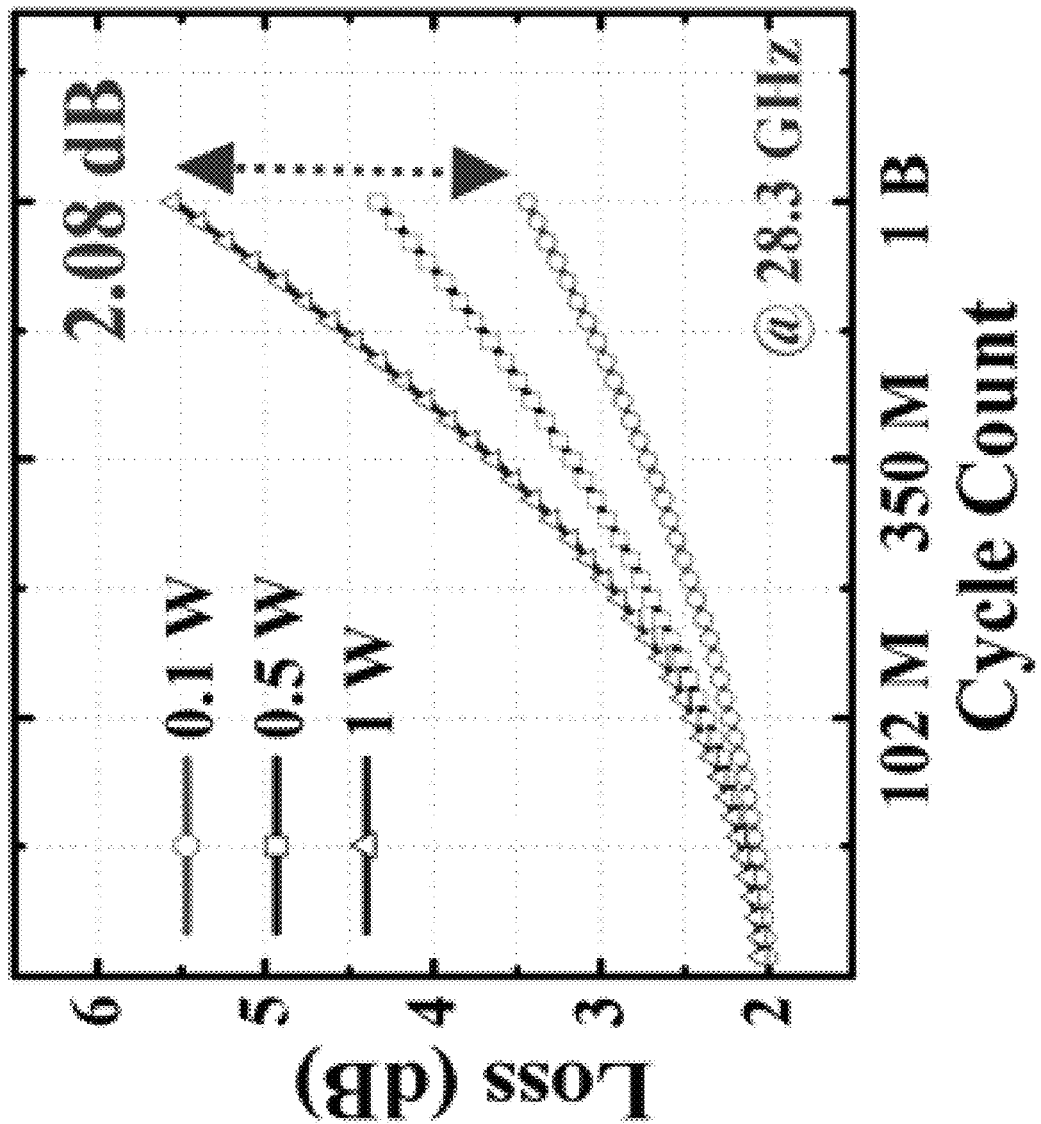
Figure 14D:
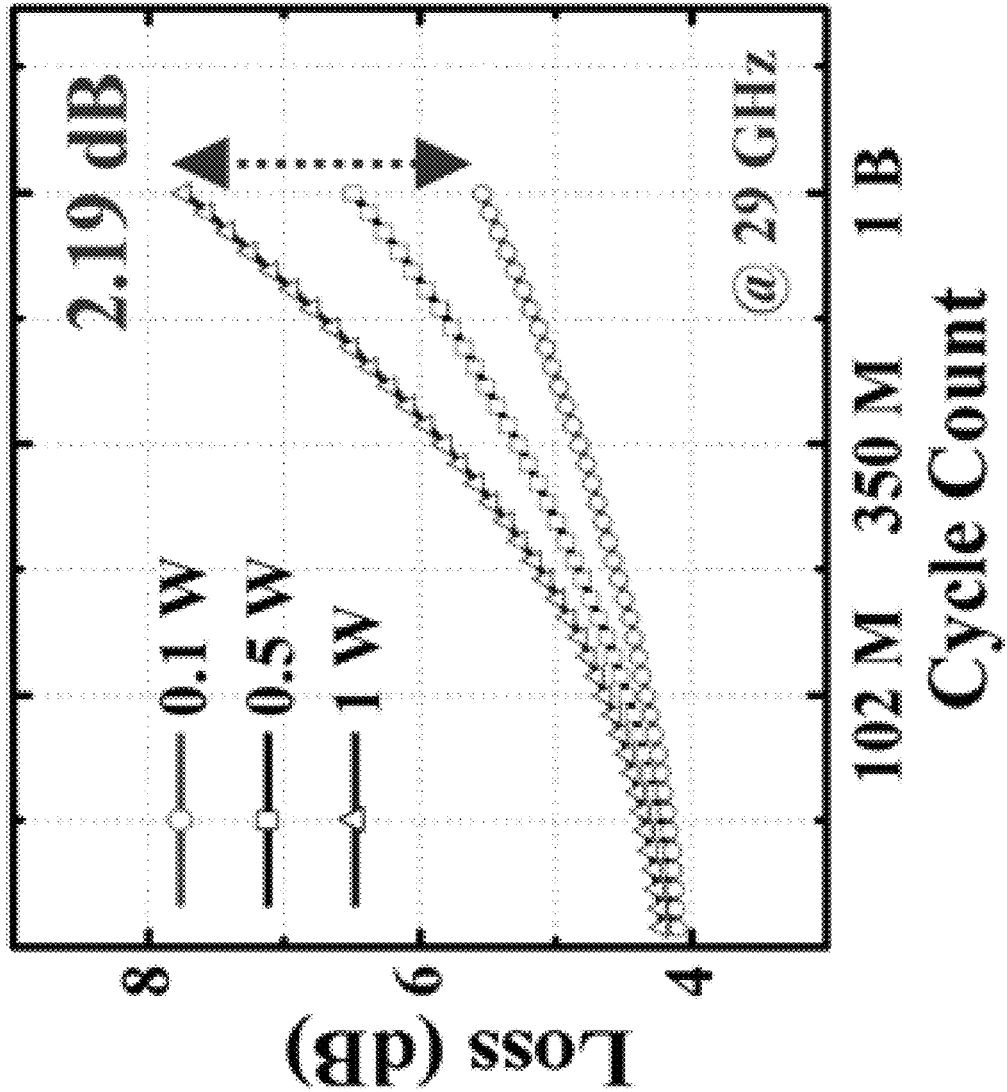
Figure 15A:
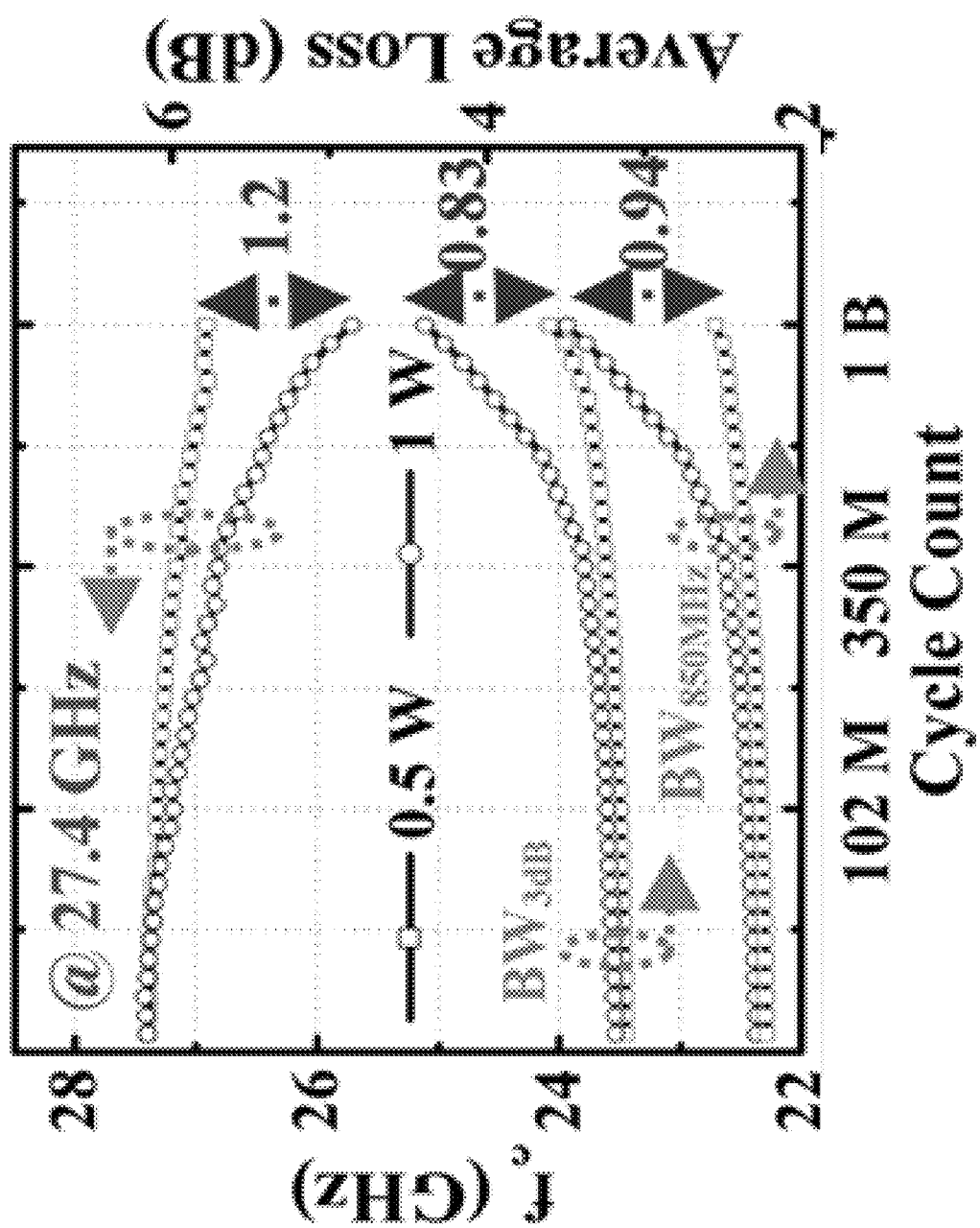
FIGS. 15A, 15B, 15C and 15D are graphs illustrating reliability of a bandwidth during lifetime of the other tunable bandpass filter at respective operating frequencies.
Figure 15B:
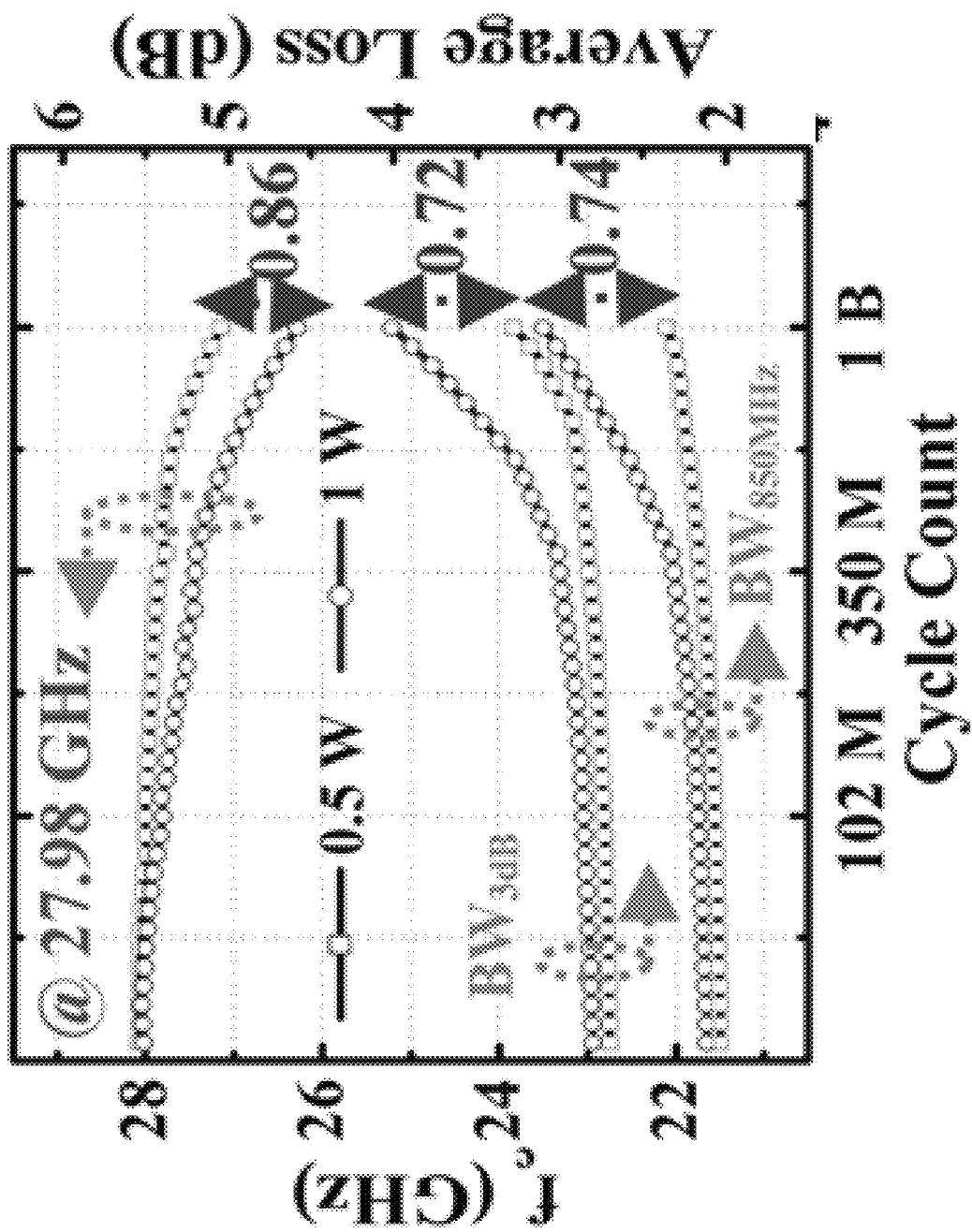
Figure 15C:
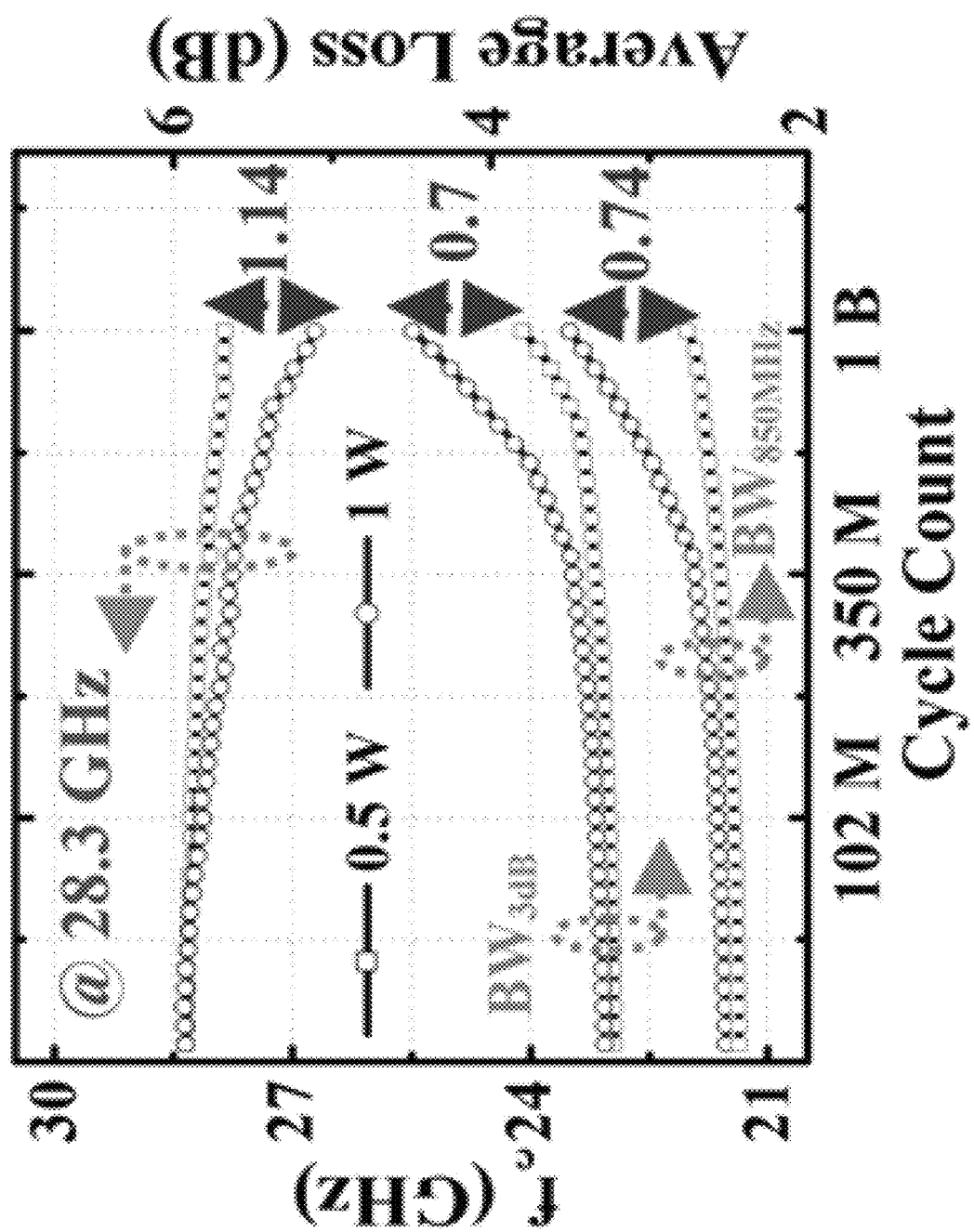
Figure 15D:
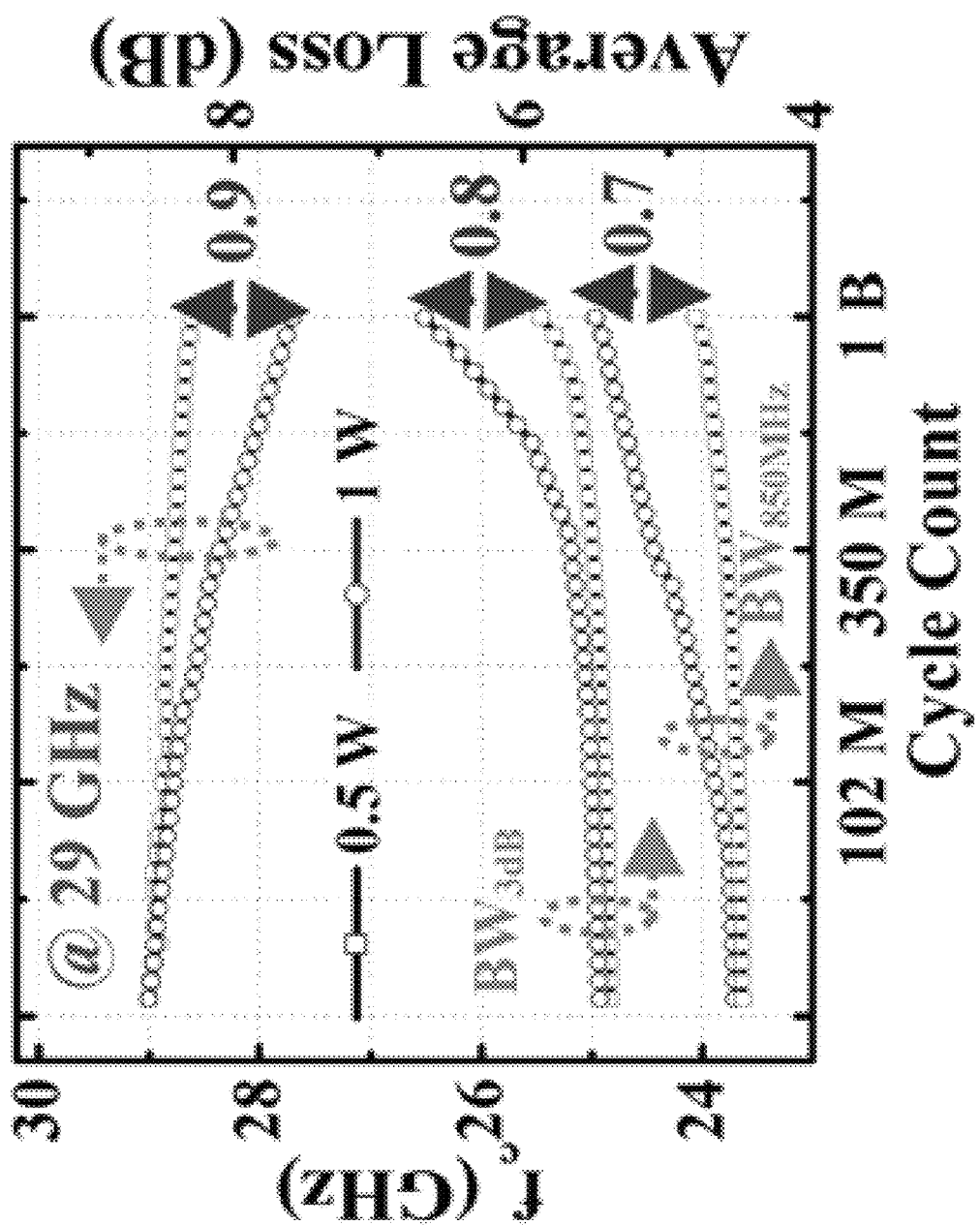

In a first additional test, insertion losses were measured from 0.1-1 W of incident RF powers, corresponding changes were recorded at room temperature up through one billion cycles. Results of the test are shown in FIGS. 14A-D, respectively. The difference between loss at 0.1 W and loss at 1.0 W rose as the center frequency rose: 1.07 dB difference for 27.4 GHz (FIG. 14A), 1.34 dB difference for 27.98 GHz (FIG. 14B), 2.08 dB difference for 28.3 GHz (FIG. 14C), and 2.19 dB difference for 29 GHz (FIG. 14D).

In a second additional test, both center frequency shift deviation and average loss deviations were calculated for a change between powers of 0.5 W and 1.0 W at room temperature up through one billion cycles. The average loss deviations were calculated over both an 850 MHz band centered around the corresponding center frequency, and for a 3 dB bandwidth around the center frequency. Results of this test are shown in FIGS. 15A-D for each respective test frequency.

A highest deviation in center frequency shift was observed in the test at 27.4 GHz, in which the center frequency was 1.2 GHz lower after a billion cycles at 1.0 W than at 0.5 W. A lowest deviation in center frequency shift was observed in the test at 27.98 GHz, in which the center frequency was 0.86 dB lower after a billion cycles at 1.0 W than at 0.5 W. The shifts were mostly attributable to the change in $C_b$ at the elevated power level.

A highest deviation in average loss (both for the 850 MHz band and the 3 dB bandwidth) were observed in the test at 27.4 GHz, in which average loss within the 850 MHz band decreased by about 0.94 dB, and within the 3 dB bandwidth decreased by about 0.83 dB, after a billion cycles at 1.0 W than at 0.5 W. A lowest deviation in average loss within the 850 MHz band was observed in the test at 29 GHz, and was about 0.7 dB. A lowest deviation in average loss within the 3 dB bandwidth band was observed in the test at 28.3 GHz, and was also about 0.7 dB.

Reliability of the tested filters could be improved even further by adding thickness to the cantilever beams of the MEMS switches. However, a charge pump could be used with the thicker beam in order to provide a higher actuation voltage to the thicker beam.

The tunable bandpass filter of FIG. 10 also exhibits relatively low shifts in center frequency, and particularly shifts of less than 10% of the center frequency, when switching between different RF power levels for given switch and bridge capacitance values over the lifespan of the filter. As can be seen in FIG. 13A, a shift of no more than 1.2 GHz occurs for the filter when operating at 27 GHz with an operating power of between 0.5-1 W, even after one billion cycles. This represents a shift of about 4.4%. Also, as can be seen in FIG. 13B, a shift of no more than 1.18 GHz occurs for the filter when operating at 28 GHz over the same RF power conditions. This represents a shift of about 4.2%. Lastly, as can be seen in FIG. 13C, a shift of no more than 0.91 GHz occurs for the filter when operating at 29 GHz over the same RF power conditions. This represents a shift of about 3.1%.

The filter also exhibits a shift in center frequency between a first condition having bias voltage applied to only the bridge array and a second condition having bias voltages applied to both the switch array and bridge array. For example, for a filter tuned to 27.4 GHz and having a bridge array bias voltage of 61 V, biasing the switch array is observed to result in a change of 0.49 GHz for the filter when operating at 0.5 W and 1.69 when operating at 1 W. For further example, for a filter tuned to 28.3 GHz and having a bridge array bias voltage of 48 V, biasing the switch array is observed to result in a change of 0.45 GHz for the filter when operating at 0.5 W and 1.63 when operating at 1 W. For further example, for a filter tuned to 29 GHz and having a bridge array bias voltage of 39 V, biasing the switch array is observed to result in a change of 0.39 GHz for the filter when operating at 0.5 W and 1.3 when operating at 1 W.

Figure 16A:
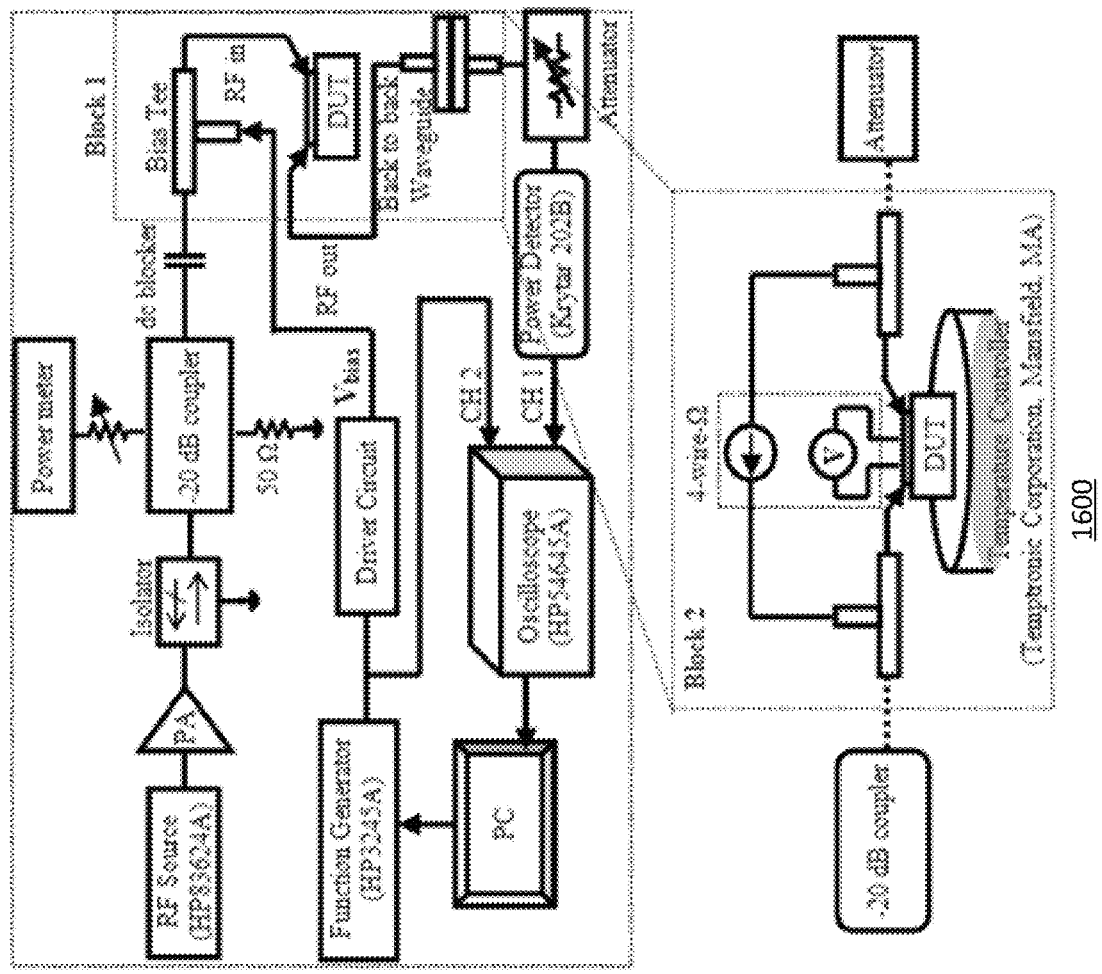
FIG. 16A is a block diagram of a setup for conducting reliability testing of the example tunable bandpass filter of FIG. 1.
Figure 16B:
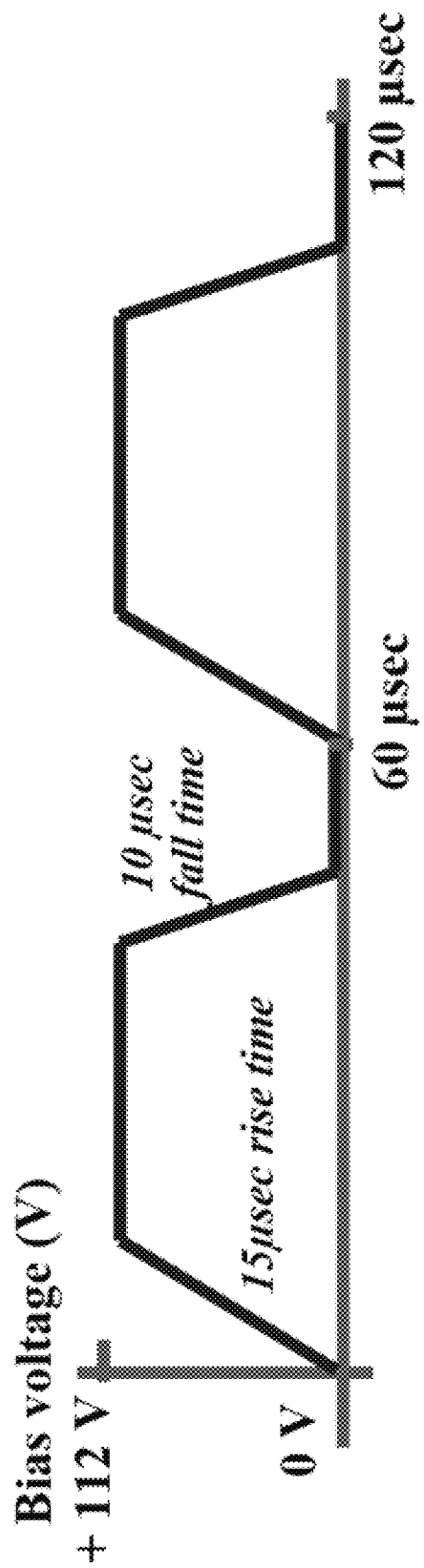
FIG. 16B is a test waveform for use in the setup of FIG. 16B.

FIG. 16A illustrates a test setup 1600 for conducting reliability testing of the individual filter blocks of the tunable bandpass filter, each labeled "Device Under Test" (DUT) in the figure. Various examples of reliability tests are provided in FIGS. 14A-D and 15A-D, although other tests may be conducted using the setup 1600 of FIG. 16A. The testing is performed under conditions in which the temperature of the filter blocks, operating frequencies of the filter blocks and bias voltages applied to the filter blocks may be controlled. A bias waveform may be applied to the first and second filter blocks in order to cycle the MEMS switches of the first filter block and the MEMS bridges of the second filter block. FIG. 16B illustrates an example test waveform that may be used for testing the first filter block. The waveform may be a pulse wave, and in the example of FIG. 16B, is a trapezoidal pulse wave, whereby each cycle in the test lasts 60 microsecond. As such, a test of the filter block over one billion cycles may be completed in less than one day.

Reliability testing of the first filter block may involve continuous variation of the switch contact resistance ($R_c$) and desired capacitance ($C_s$) variation with controlled voltages.

Test measurements of a bias voltage applied to bridge array only, and to both the switch array and bridge array, are shown in Table 4 below:

TABLE 4

| | | | @ $f_c$ | | 0.85 GHz BW | | | 3 dB BW | | | | |
|---|---|---|---|---|---|---|---|---|---|---|---|---|
| Frequency (GHz) | $V_s$ (V) | $V_b$ (V) | Insertion Loss ($S_{21}$) (dB) | Return Loss ($S_{11}$) (dB) | Avg. $S_{21}$ (dB) | Avg. $S_{11}$ (dB) | $Q_{ext}$ | Avg. $S_{21}$ (dB) | Avg. $S_{11}$ (dB) | $Q_{ext}$ | $FBW_{3dB}$ | $Q_u$ |
| 27.4 | 0 | 61 | 1.9 | 2.22 | 2.22 | 22.5 | 27.5 | 3.12 | 20 | 12.2 | 8.2% | 201 |
| 28 | 97.2 | 48 | 1.92 | 23.4 | ~2 | 19 | 28 | 2.7 | 15 | 14.9 | 6.7% | 204 |
| 28.18 | 96.8 | 48 | 2 | 22.2 | 2.06 | 20 | 28.3 | 3 | 13.6 | 13 | 7.7% | 193 |
| 28.3 | 0 | 48 | 2.1 | 21 | 2.4 | 17 | 28.4 | 3.2 | 13 | 14.2 | 7% | 182 |
| 29 | 0 | 39 | 4 | 11.6 | 4.46 | 10.8 | 29.1 | 5.36 | 9.7 | 11.6 | 8.6% | 101 |

(in which $Q_u$ is the unloaded quality factor of the filter, and $Q_{ext}$ is the external quality factor of the filter).

Also during testing, the switch array was found to demonstrate a worst-case average contact resistance variation of about 0.4-2.23Ω with 1 W of RF power for up to 1 billion cycles at 25° C. and with a bias voltage of up to 112 V. The switch array was also found to demonstrate a variation in measured capacitance of 350-357.3 fF, 410-423.6 fF and 450-463.3 fF with 0.5-1 W changes in RF power up to 1 billion cycles with applied bias voltages of 91 V, 96 V and 100 V, respectively. These voltages were preselected to provide sufficient capacitance at 27 GHz, 28 GHz and 29 GHz respectively, although in other examples, other bias voltages may be applied.

Additional test measurements are shown in Table 5 below for various center frequencies ($f_c$). The losses noted in the table are at the edges of the band. Losses at the center frequency are typically much less.

TABLE 5

| $f_c$ (GHz) | Loss (dB) | FBW (%) | Stopband Suppression @ high frequency (dB) |
|---|---|---|---|
| 27.17 | 3 | 9.82 | 23 |
| 28.3 | 3 | 5.44 | 22 |
| 28.42 | 5 | 9.5 | 23 |
| 29 | 3.4 | 3.4 | 55 |
| 29.2 | 5 | 5.6 | 55 |
| 30.3 | 5 | 14.55 | 22 |

As can be seen from Table 5, the filter has the ability to operate at each of 27, 28 and 29 GHz with minimum and maximum bandwidths of 3.4% and 9.82% with 3 dB of loss, respectively. In addition, the filter exhibits a minimum and maximum bandwidth of 5.6% and 22.7% with 5 dB of loss.

The following guidelines are provided for designing and testing a tunable passband filter in accordance with the present disclosure:

(1) Obtaining design data set: This can be done on a known simulation program, such as a circuit simulator, and may include values or ranges for each functional parameter of the design, including but not limited to: $C_s$, $C_b$, and $L_s$. The values may be set for the tunable filter at a particular frequency, which may be a frequency at which the filter is intended to operate. Each of the three filter blocks may be designed using a fine element method (FEM) solver, electromechanical solver, or combination thereof, to satisfy design requirements.

Table 6 below provide example parameter sets for different filters tuned to respective frequencies:

TABLE 6

| Frequency | $C_b$ (pF) | $C_s$ (pF) | $L_b$ (nH) | $FBW_{3dB}$ |
|---|---|---|---|---|
| 27 GHz | 0.17 | 0.42-0.45 | 0.322 | 6.6 |
| 28 GHz | 0.16 | 0.42-0.45 | 0.322 | 6.2 |
| 29 GHz | 0.15 | 0.41-0.45 | 0.322 | 7.3 |

(2) MEMS switch fabrication: The MEMS switch should be designed in a manner than ensures electromechanical robustness for long range operation. Hence, the switch should be fabricated individually and tested with reliability testing (with one or more RF powers applied over a predetermined number of cycles, such as a billion) to ensure it meets performance expectations. Robustness of the switch can be evaluated by cycling complete actuations and observing the change to $R_c$ over the predetermined number of cycles.

(3) MEMS array design: The filter includes N-element arrays of MEMS switches and/or MEMS bridges. The MEMS elements included in the switches and bridges may be fabricated individually and then arranged in their respective arrays. Since each switch and bridge has an amount of capacitance, the value of N chosen for a given array will affect the overall capacitance of the given array.

(4) High impedance line design: The length and width of the impedance line affect the value of inductance $L_s$. In some instances, the impedance line width may be chosen to be as narrow as possible while remaining within tolerance limits for fabrication, and the length may then be chosen to provide the desired impedance.

(6) Fabrication process yield: The filter requires actuation of at least 8 and at most 16 actuators at any given time. It is preferable that all actuated elements exhibit similar characteristics, whether it be $C_s$ or $C_b$ as a function of the actuation voltage. This can be achieved through fabrication using polyimide (PI) and through uniform deposition for each beam and proper release of the PI. For instance, the PI may be cured in an oven at about 350° C. and may be etched using EKC 265.

(7) Filter testing: After successful fabrication of the structure, testing may include two measuring steps: a first step in which only bridges are excited with $V_b$ ($V_s$=0) to tune the central frequency $f_c$; and a second step in which the FBW of the filter is adjusted with $V_b$. The second step may also include recording $V_s$ voltages and corresponding changes in insertion loss. For filters used in multiple applications, reliability measurements may be conducted at each applicable operational $f_c$ value of the filter. It should be noted that, during the two-stage test, the bridge-arrays are actuated a greater number of times than are the switch-arrays, since the switch-arrays are not actuated at all during the first stage of testing.

The filter testing stages can be performed without cycling, such as by a prolonged actuation condition where a constant $V_b$ or $V_s$ (or both) are applied on the filter. This may be applied for up to 6 hours, such as for an amount of time between ten minutes and six hours, an amount of time between a half hour and six hours, an amount of time between one hour and six hours, an amount of time between two hours and six hours, an amount of time between three hours and six hours, and so on, with negligible deviations being observed for each of $f_c$ (about 9% deviation), average loss over $BW_{850\ MHz}$ (about 9% deviation) and average loss over $BW_{3\ dB}$ (about 12% deviation). These measurements are limited by the time of operation and beam deforms over the time. This lack of deviation is advantageous for applications where the filter may stay at a fixed center frequency $f_c$ over a desired bandwidth for a relatively long time.

FIGS. 17A-H show simulated responses of an example tunable filter.

Figure 17A:
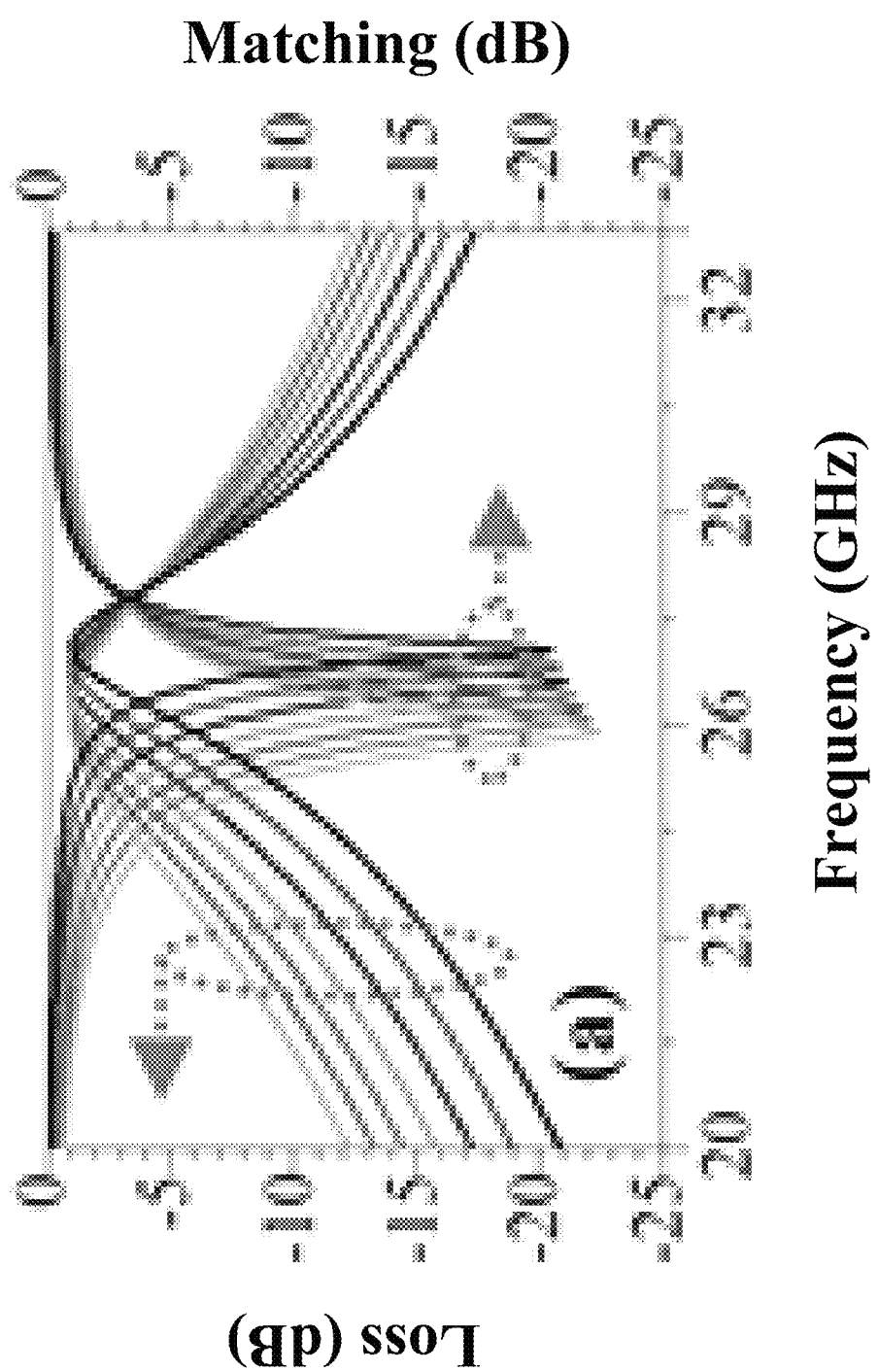
FIGS. 17A, 17B, 17C, 17D, 17E, 17F, 17G and 17H are graphs illustrating filer response data of another example tunable bandpass filter obtained during design and testing of the tunable bandpass filter in accordance with an aspect of the disclosure.
Figure 17B:
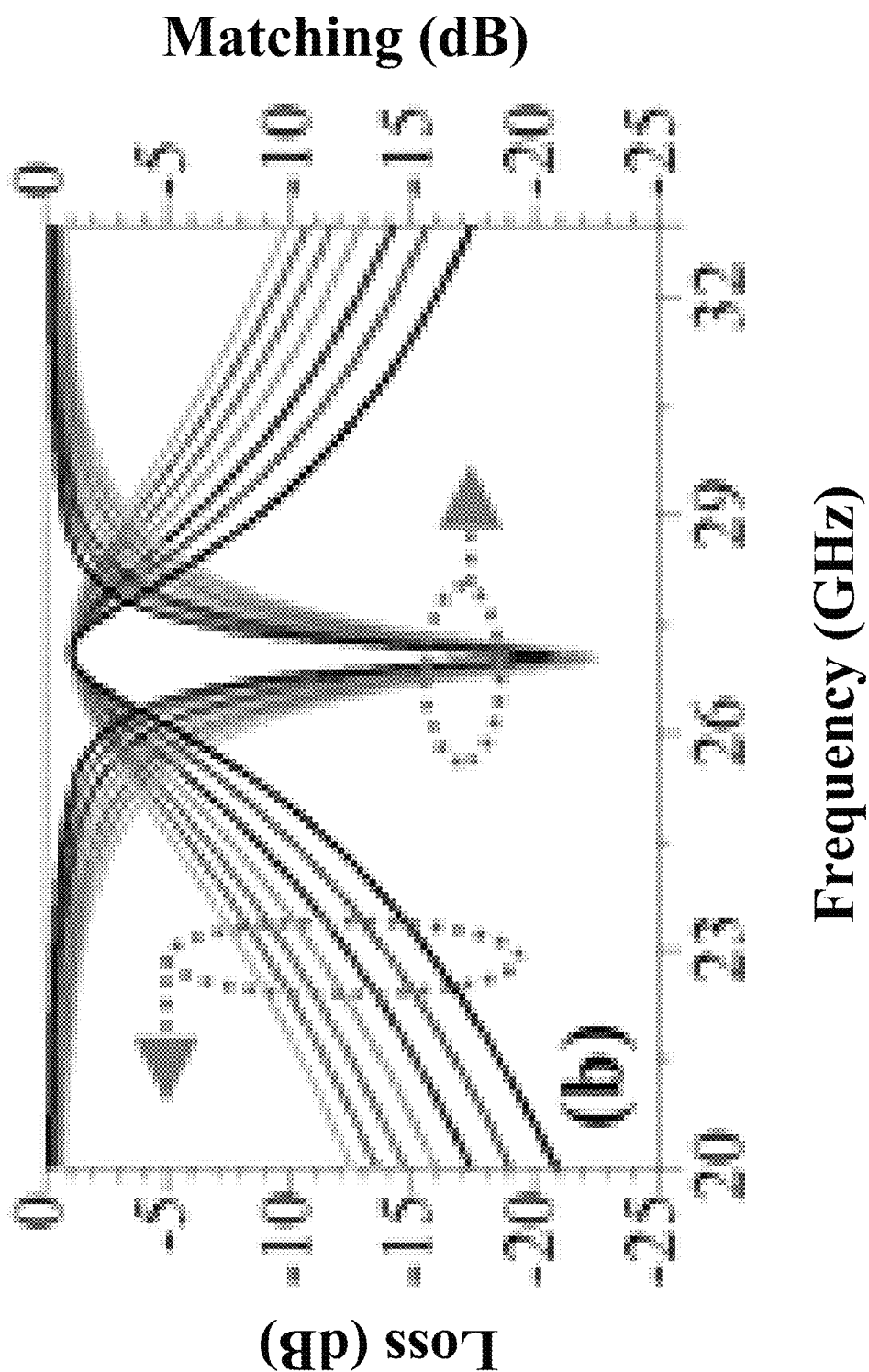

FIG. 17A shows that the center frequency shifts as a function of changes to the capacitance value of the switch array $C_s$. The frequency shifts permit for the center frequency to be anywhere between 25.9-27 GHz. In FIG. 17B, the value of $C_s$ is fixed, and the capacitance value of the bridge array $C_b$ is adjusted. As can be seen from FIG. 17B, the filter response changes in response to the change in $C_b$, but the center frequency does not shift since $C_s$ remains fixed. In this example, the center frequency is maintained at 27 GHz.

Figure 17C:
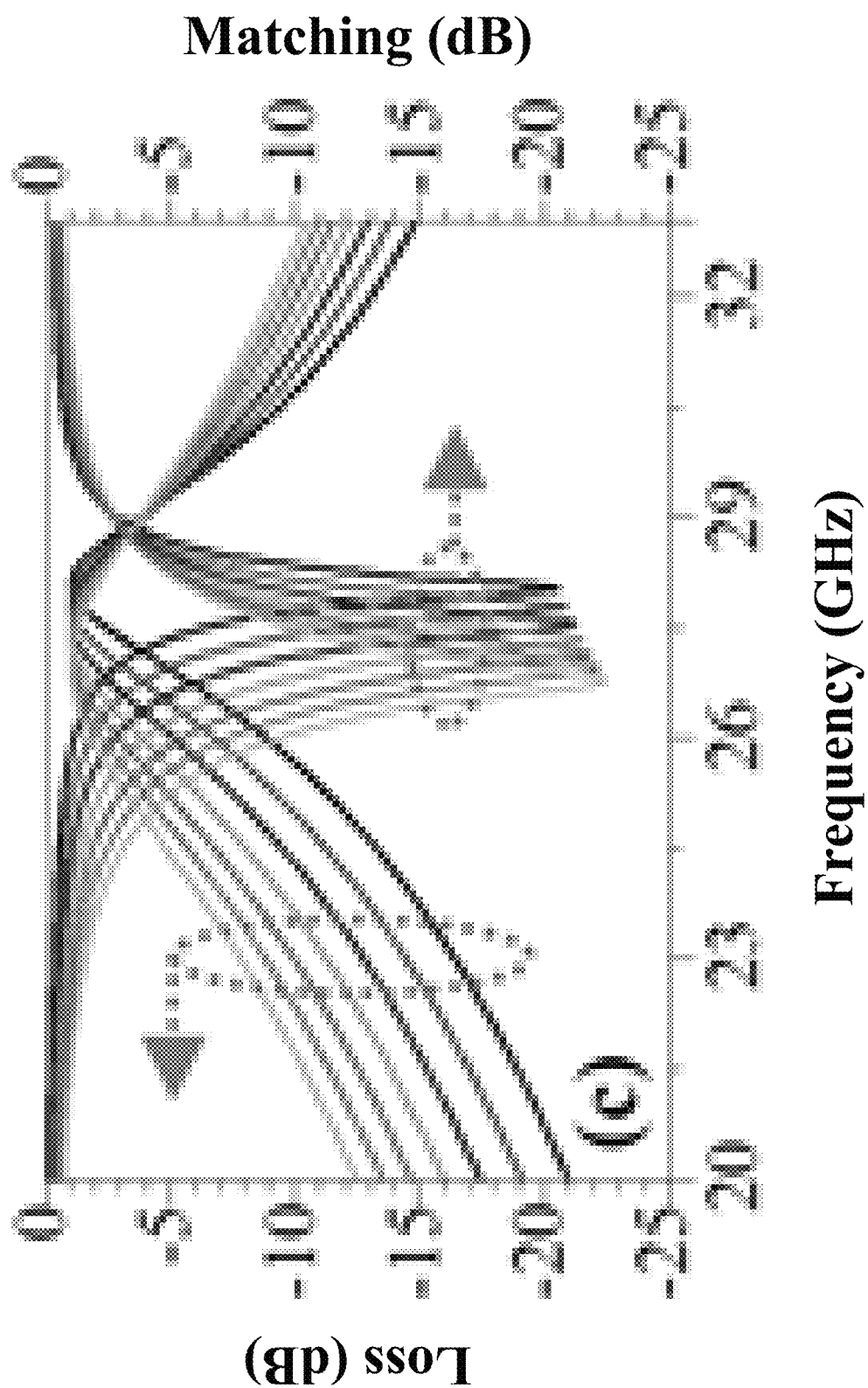
Figure 17D:
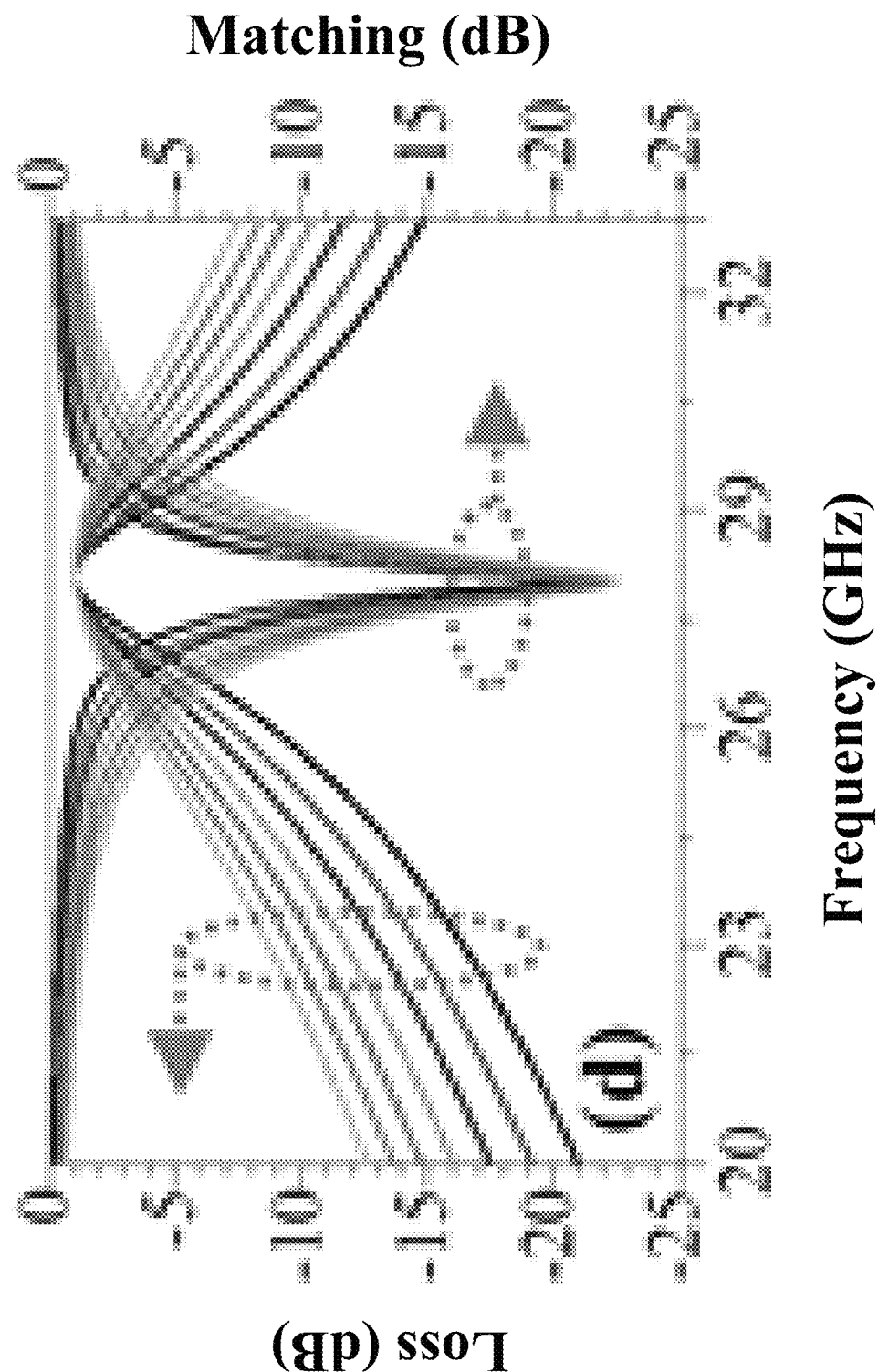

FIGS. 17C and 17D are comparable to FIGS. 17A and 17B, respectively, except that in FIGS. 17A and 17B, $C_s$ and $C_b$ values were selected to cause the center frequencies to fall between 25.9-27 GHz, while in FIG. 17C these values are selected to cause the center frequencies to fall between 26.8-28 GHz in response to changes to $C_s$, and in FIG. 17D the filter response is simulated at 28 GHz.

Figure 17E:
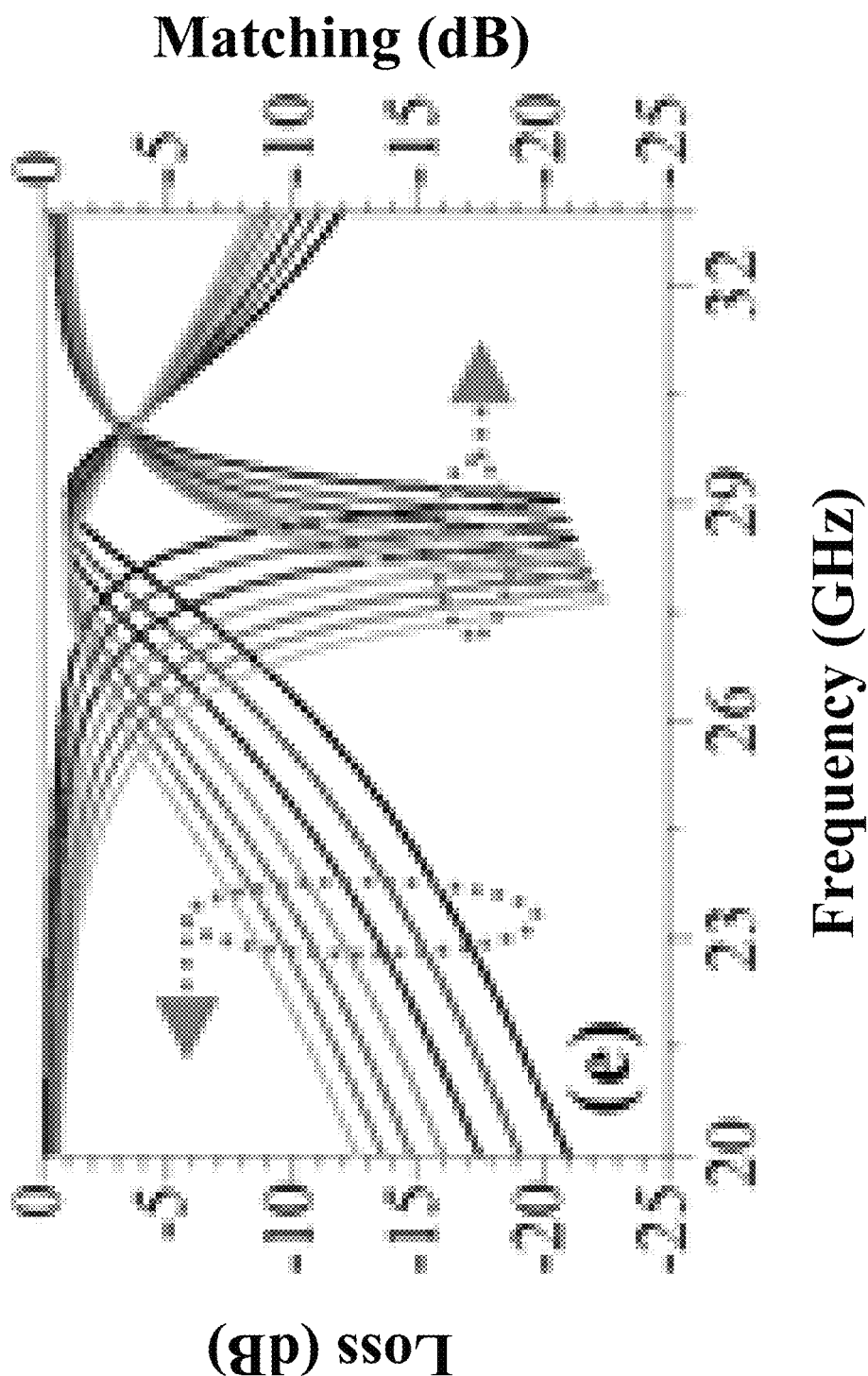
Figure 17F:
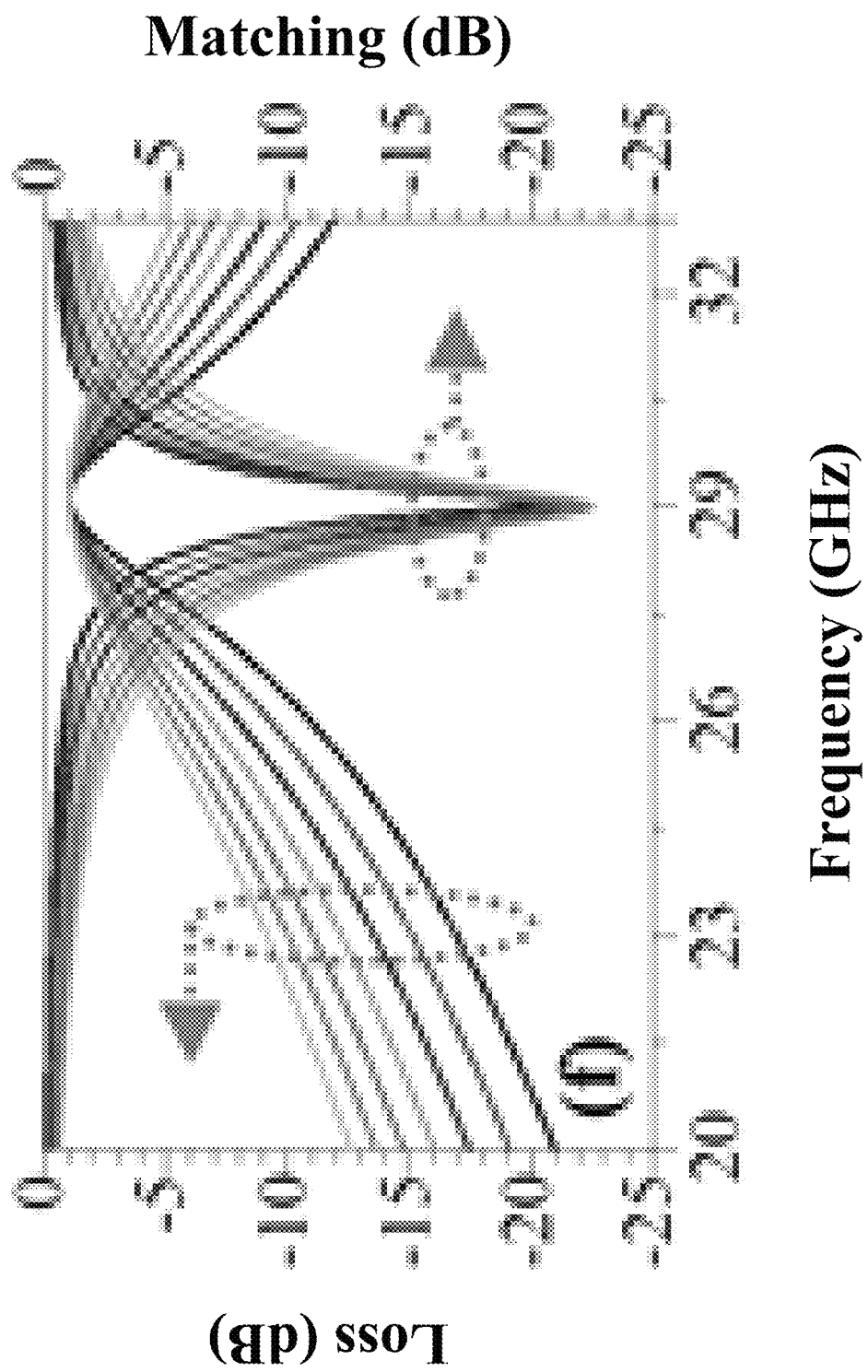

FIGS. 17E and 17F are also comparable to FIGS. 17A and 17B, respectively, except that in FIGS. 17A and 17B, $C_s$ and $C_b$ values were selected to cause the center frequencies to fall between 25.9-27 GHz, while in FIG. 17E these values are selected to cause the center frequencies to fall between 27.8-29 GHz in response to changes to $C_s$, and in FIG. 17F the filter response is simulated at 29 GHz.

Figure 17G:
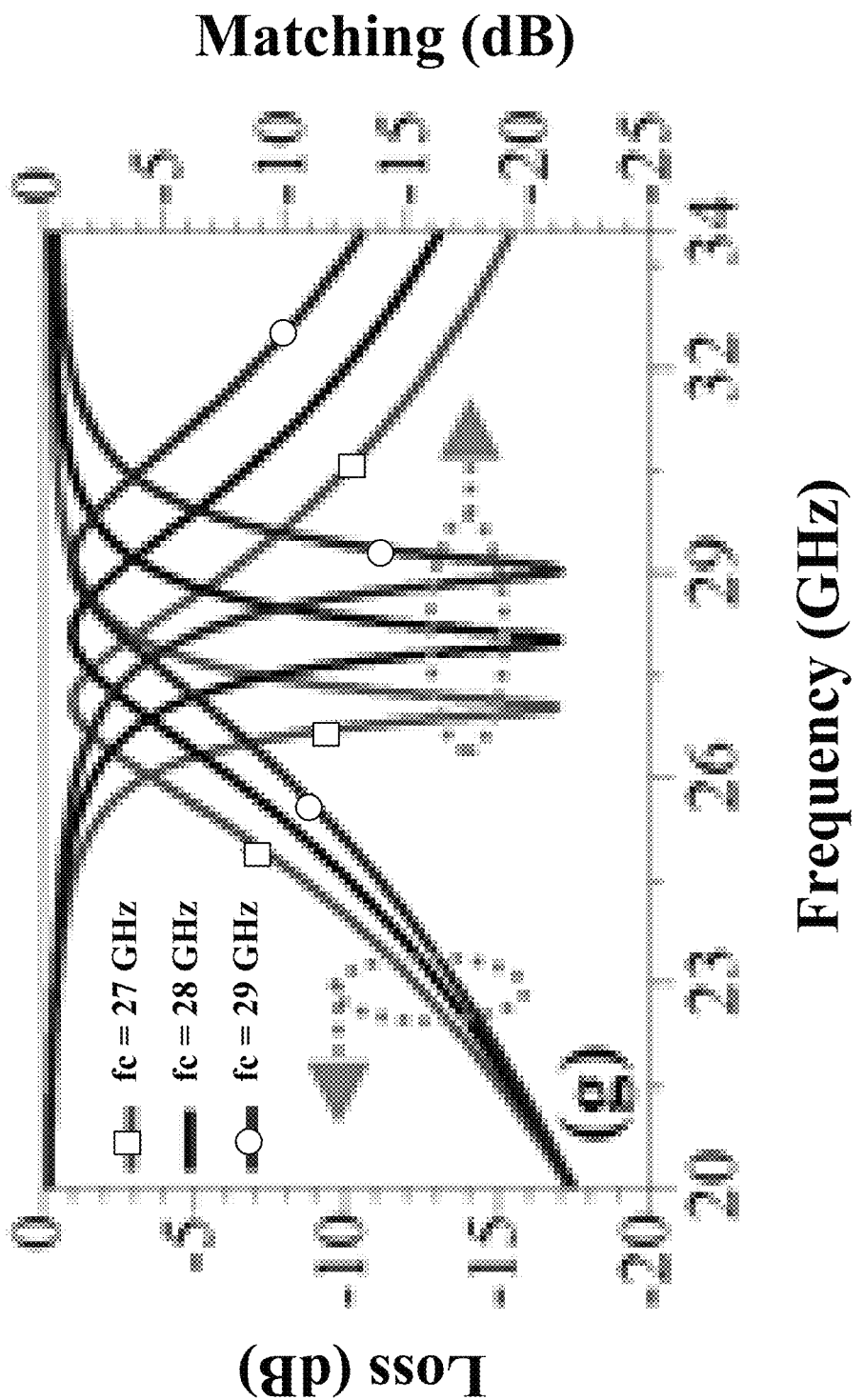
Figure 17H:
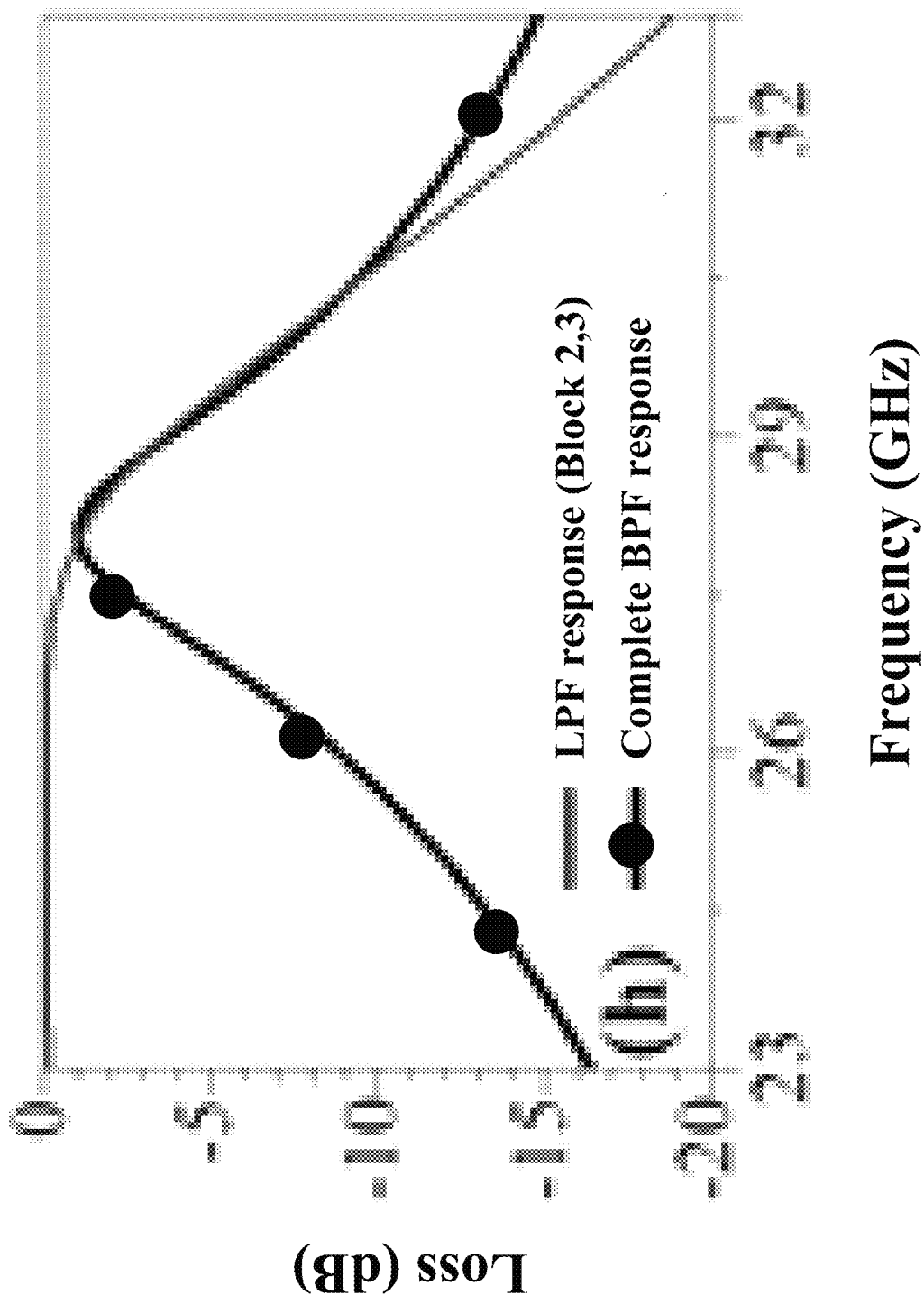

FIG. 17G shows tuning at each of 27 GHz, 28 GHz, and 29 GHz. For each tuned frequency, a different value of $C_b$ is chosen based on the results shown in FIGS. 17A-17F. As can be seen from FIG. 17G, each of the three operational frequencies exhibits good insertion loss of lower than 2.0 dB and good return loss of better than 20 dB. Additionally, FIG. 17H shows insertion loss parameters for both the low pass filter (LPF) section of the filter (corresponding to the high impedance line), and for each band pass filter (BPF) section (corresponding to the combination of high pass and low pass filters yielded by the MEMS arrays). As can be seen from FIG. 17H, relatively low insertion loss is maintained for operational frequencies at or below 29 GHz.

(8) Bias line design: Bias lines may be designed to have high resistance, and a route for each bias line may be planned so as to avoid affecting performance with signal leakage and added parasitics. For example, a 70 nm TiW may be used. The line may further be covered with 0.5 μm of $S_iO_2$ so that it may be routed anywhere without affecting performance.

(9) Reliability testing: The pulse wave its duty cycle used for the reliability testing may be selected to provide accurate results. Additionally, results may be recorded for each tested component using the same testing device in order to ensure consistency. Measurement results for five identical devices have been observed to stay within a tolerance of 15% of one another.

The above example considerations provide for a relatively thin beam construction. However, in other examples, providing a thicker beam and charge pump could improve power handling of the filter. In yet further examples, an even thinner beam could be provided by constructing a multilayer beam with appropriate selection of materials.

The order of the filter, which is the value N, can be increased in order to achieve a desired one or combination of stop-band insertion loss, pass-band return loss, rejection bandwidth, and filter bandwidth. The filter can deliver a first-order response, and the order of the filter can be further increased higher by cascading similarly designed cells.

Figure 18:
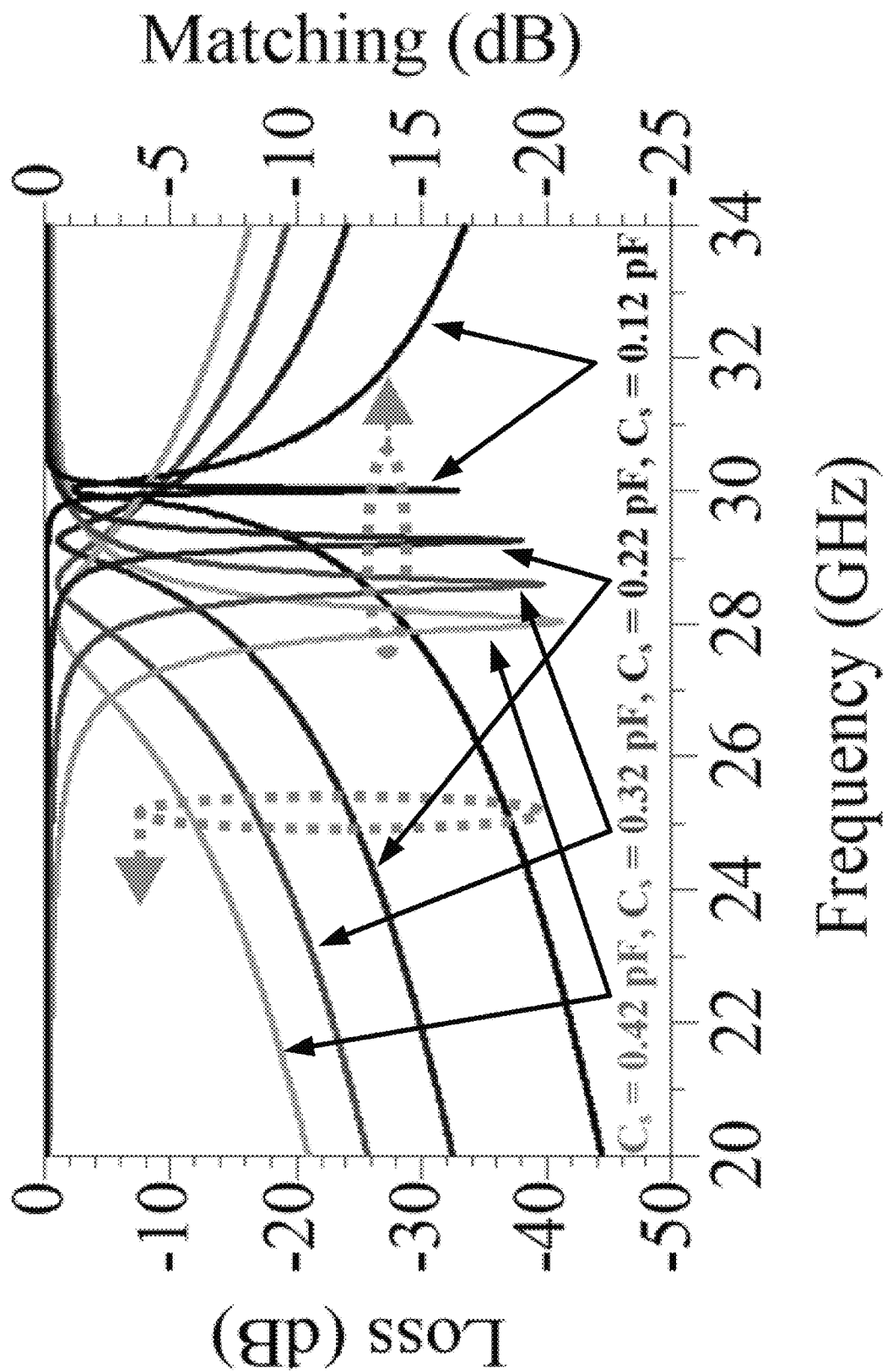
FIG. 18 is a graph illustrating simulated filter responses for example tunable bandpass filters with different switch array capacitances in accordance with aspects of the present disclosure.

Stop-band insertion loss of the filter can be further improved with proper selection of capacitance values. Simulations show that lower $C_s$ values improve stopband rejection but require higher values of $C_b$ to adjust the center frequency to its desired value. For instance, FIG. 18 is a graph showing S-parameters of a filter for different values of $C_s$ ranging from 0.42 pF to 0.12 pF. The parameters were determined for a fixed $C_b$ of 0.16 pF. As can be seen from FIG. 18, a sharp stop-band response (SBR) is produced with shifts between 28 GHz and 30 GHz in response to changes in $C_s$ between 0.42 pF to 0.12 pF. The chosen value of $C_s$ to achieve the sharp SBR can cause an upward shift in resonant frequency, but this can be brought back to a lower resonant frequency, such as 28 GHz, by increasing $C_b$, such as from 0.16 pF to 0.19 pF. One way of increasing $C_b$ is to increase the number of MEMS bridges included in the bridge array. Experiments have shown a maximum achievable $C_b$ is −0..0.18 pF by substantially increasing the number of tuning bridges included in the array. At the same time, increasing the number of bridges may increase the difficulty of fabrication. It may also increase a chance to failure over the lifetime of the filter due to the increased number of elements and, by extension, potential failure points. Additionally, choosing a lower value for $C_s$, such as from 0.42 pF to 0.12 pF, may improve sharpness of SBR, but will also reduce matching by about 5 dB. These factors may be taken into account during the design phase of the filter.

Measured functional parameters, including quality factors of both the switch array Qs, high impedance line in both inactive (QL-up) and active (QL-act) states, and [INVENTORS: Please explain what Q0 is], Za-up, Za-act, Q of an example filter at different center frequencies is shown in Table 7:

TABLE 7

| Frequency | $V_s$ (V) | $C_s$ (pF) | $Q_s$ | $V_b$ (V) | $C_b$ (pF) | $Q_0$ | $Z_{a\text{-}up}$ | $Z_{a\text{-}act}$ | $Q_{L\text{-}up}$ | $Q_{L\text{-}act}$ |
|---|---|---|---|---|---|---|---|---|---|---|
| 27 | 94 | 0.44 | 8.93 | 59 | 0.17 | 137 | 42 | 33 | 29.3 | 10.5 |
| 28 | 98 | 0.46 | 9.33 | 51 | 0.16 | 140 | 41.4 | 34 | 30 | 11 |
| 29 | 96 | 0.45 | 9.14 | 59 | 0.15 | 141.7 | 40.5 | 35.2 | 30.7 | 11.8 |

Additional reliability test measurements are shown in Table 8 below for various center frequencies ($f_c$).

TABLE 8

| $f_c$ (GHz) | $\Delta f_c$ (GHz) | Average Loss (850 MHz band) | Average Loss (3 dB BW) | FBW % | Power Handling |
|---|---|---|---|---|---|
| 27.4 | 1.2 | 0.94 dB | 0.83 dB | 8.2-9.7 | 0.1-1.0 W |
| 28 | 0.86 | 0.74 dB | 0.72 dB | 6.6-7.5 | 0.1-1.0 W |
| 28 | 1.3 | 1.46 dB | 1.46 dB | 7.3-8.6 | 0.1-1.0 W |
| 28.3 | 1.14 | 0.74 dB | 0.7 dB | 7-8.3 | 0.1-1.0 W |
| 29 | 0.9 | 0.7 dB | 0.8 dB | 8.7-9.8 | 0.1-1.0 W |

Figure 19:
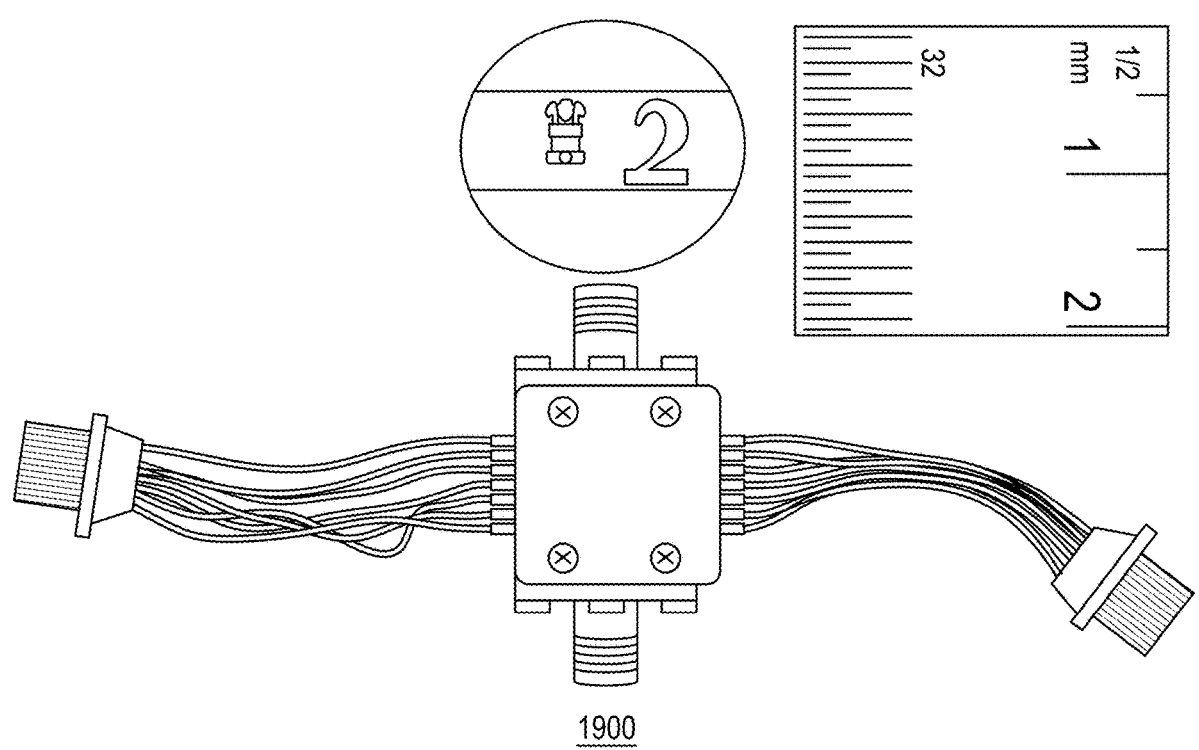
FIG. 19 is a photograph of an example device under test in accordance with an aspect of the present disclosure.

The results in Table 8 include an additional line (third line of the table) showing results collected from measurement of a device under test 1900 shown in FIG. 19. The device 1900 includes a module that measures 1.7 cm by 1.5 cm, and is mounted to a carrier made of a gold-coated brass material. Differences between the simulated results shown in line 2 of the Table and the measured results shown in line 3 are likely due to bond-wire parasitic and cable losses and could likely be addressed by other wiring designs.

The example tunable bandpass filters of the present disclosure are operable across millimeter-wave frequency band, which makes them useful for 5G RFFE products, such as in super-heterodyne radio architectures that use carrier aggregation, phased array antennas and massive MIMO (multiple input, multiple output) features. For example, the tunable bandpass filters may be used in tunable devices that support millimeter-wave frequency communications, including but not limited to tunable millimeter-wave oscillators, tunable millimeter-wave amplifiers, tunable millimeter-wave phase shifters, frequency synthesizers, and so on.

Figure 20:
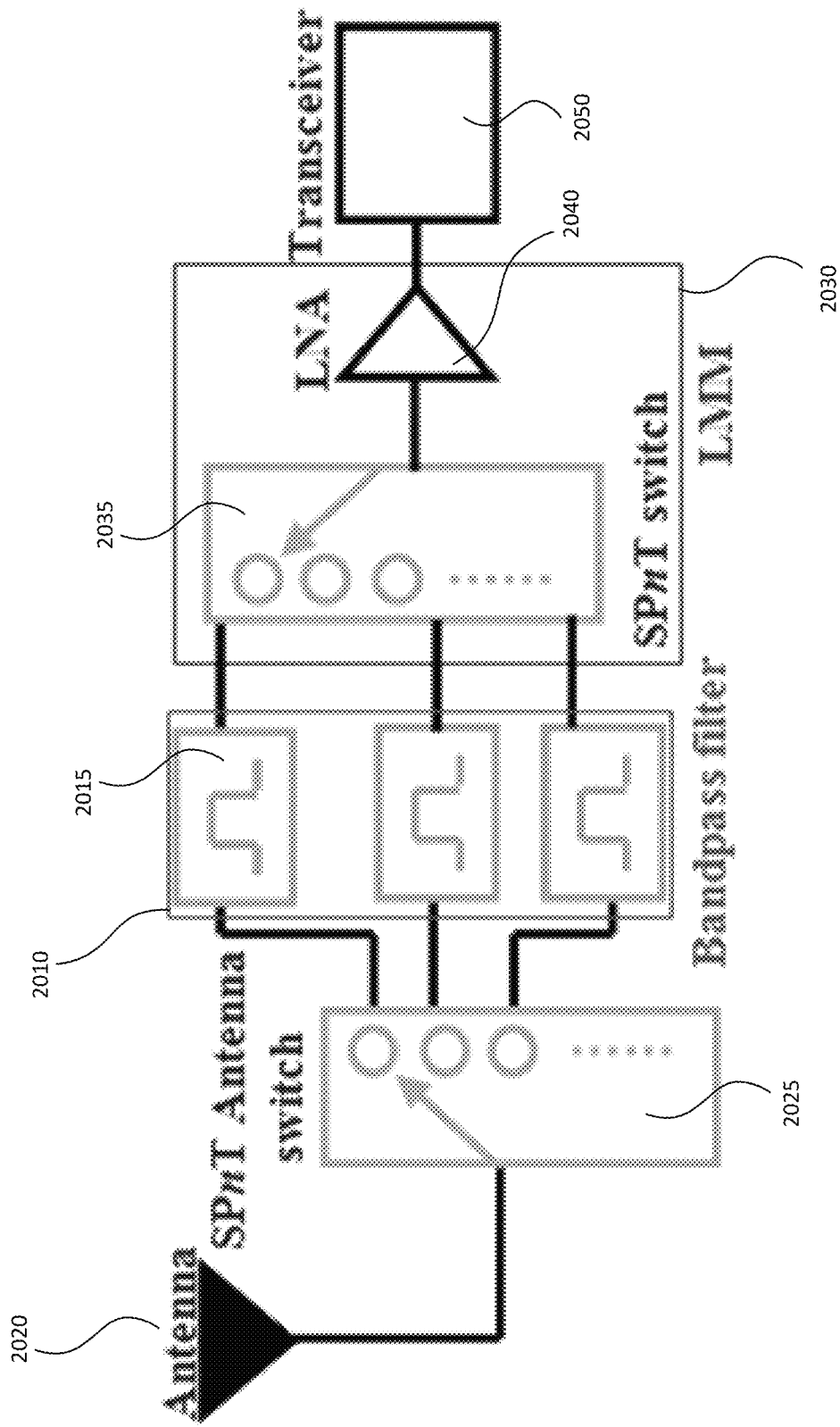
FIG. 20 is an example low noise amplifier multiplex module in accordance with an aspect of the present disclosure.

FIG. 20 illustrates an example application of the tunable bandpass filters in a low-noise amplifier multiplex module (LMM)2000 that includes a filter module 2010 having tunable bandpass filters as described in any of the embodiments of the present disclosure. An input of the filter module 2010 may be connected to an RF antenna 2020 through an antenna switch 2025. Each tunable bandpass filter 2015 of the module 2010 may be connected to a respective output of the antenna switch 2025 by its respective input port. Furthermore, each tunable bandpass filter 2015 of the module 2010 may be connected to a respective input of an LMM 2030 by its respective output port. The respective inputs of the LMM 2030 may be connected to an LMM switch 2035, whereby operation of the multiplexer may be controlled at each of the antenna switch and the LMM switch such that an RF signal received at the RF antenna can be passed through a selected one of the filters 2025 of the filter module 2020 before amplification at a low noise amplifier (LNA) 2040 of the LMM 2030 and being transmitted to a transceiver 2050 connected to an output of the LMM 2030.

In the example of FIG. 20, each of the antenna switch 2025 and LMM switch 2035 may be a single-pole multiple-throw (SPnT, whereby n corresponds to the number of throws or branches in the switch) MEMS switch.

The above-described designs provide sufficient suppression of unwanted harmonics associated with nonlinear active devices while at the same time avoiding contributing to insertion loss as is normally experienced for filters in an RF chain. Thus the total transmit efficiency is sufficiently high, and the total noise figure in the receive path (SNR and data rate) is sufficiently low, for millimeter-wave applications. Additionally, the designs support reconfigurable and multi-band filters continuous tunability at consecutive frequencies and without succumbing to low insertion loss, wide stopband suppression, and without significantly increasing circuit size. Furthermore, because the individual components may be micro-machined, consistency between device components can be ensured before completing the device. Lastly, the use of MEMS-based components within a point of stability allows for the components to maintain their functionality over a large number of operations, such as 1 billion cycles.

The examples provided in the present disclosure address the particular needs of current 5G devices and applications, for which a frequency point of interest is between 27-29 GHz, and more particularly between 27.5-28.35 GHz. However, the concepts and principles of the present disclosure may be applied to other millimeter-wave frequencies, including although not limited to 37-38.6 GHz and 38.6 and 40 GHz frequency bands. These other frequency bands may have utility in other 5G applications, or in future generation communication applications.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A tunable passband filter comprising:
a signal input port configured to receiving an input radio frequency (RF) signal;
a signal output port configured to transmit a filtered output RF signal, wherein the tunable passband filter is configured to filter the input RF signal to yield the filtered output RF signal;
a first high-pass section comprising a first tunable microelectromechanical system (MEMS) switch array and configured to receive the input RF signal from the signal input port, wherein the first tunable MEMS switch array comprises a first plurality of MEMS switches arranged in parallel between a first switch array input junction and a first switch array output junction;
a second high-pass section comprising a second tunable MEMS switch array and configured to transmit the output RF signal to the signal output port, wherein the second tunable MEMS switch array comprises a second plurality of MEMS switches arranged in parallel between a second switch array input junction and a second switch array output junction; and
a low pass section operatively coupled between the first high-pass section and the second high-pass section, and comprising a first tunable MEMS bridge array, a second tunable MEMS bridge array, and a high impedance line, wherein the first tunable MEMS bridge array comprises a first plurality of fixed MEMS bridges arranged in series between the first switch array output junction and a first end of the high impedance line, and wherein the second tunable MEMS bridge array comprises a second plurality of fixed MEMS bridges arranged in series between the second switch array input junction and a second end of the high impedance line.

2. The tunable passband filter of claim 1, wherein the tunable passband filter has a mirror symmetry over a first axis, such that the first tunable MEMS switch array is symmetrical to the second MEMS switch array, the first tunable MEMS bridge array is symmetrical to the second tunable MEMS bridge array, and a midpoint of the high impedance line crosses the first axis.

3. The tunable passband filter of claim 1, wherein each of the first tunable MEMS bridge array and the second tunable MEMS bridge array is a shunt varactor, and wherein the first tunable MEMS bridge array and the second tunable MEMS bridge array are coupled to opposite ends of the high impedance line.

4. The tunable passband filter of claim 1, wherein each tunable MEMS switch array further comprises:
a switch array bias line coupled to a first voltage source and configured to apply a first bias voltage to each of the plurality of MEMS switches within the tunable MEMS switch array, wherein a capacitance of the tunable MEMS switch array varies as a function of the first bias voltage.

5. The tunable passband filter of claim 1, wherein the switch array has a capacitance range of 330-580 fF for a range of first bias voltages from 85 V to 105 V.

6. The tunable passband filter of claim 4, wherein the plurality of MEMS switches are arranged to distribute current equally.

7. The tunable passband filter of claim 4, wherein each one of the plurality of MEMS switches comprises:

a beam coupled to each of the switch array input junction and the switch array output junction, and configured to deflect vertically; and
a plurality of anchors formed on a substrate of the tunable bandpass filter and configured to contribute lateral support to the beam.

8. The tunable passband filter of claim 4, wherein the plurality of MEMS switches consists of four MEMS switches.

9. The tunable passband filter of claim 4, wherein each tunable MEMS bridge array further comprises:
a bridge array bias line coupled to a second voltage source and configured to apply a second bias voltage to each of the plurality of fixed MEMS bridge within the tunable MEMS bridge array, wherein a capacitance of the tunable MEMS bridge array varies as a function of the second bias voltage.

10. The tunable passband filter of claim 9, wherein the plurality of fixed MEMS bridges are parallel plate MEMS bridges including a plurality of beams and an electrode plate, wherein each beam is configured to deflect in a direction towards the electrode plate in response to the second bias voltage, and wherein the electrode plate has a thickness of about 2 μm.

11. The tunable passband filter of claim 10, wherein each beam is anchored to a first side of the tunable MEMS bridge array by a first plurality of springs and to an opposite second side of the tunable MEMS bridge array by a second plurality of springs.

12. The tunable passband filter of claim 11, wherein each spring of the first and second plurality of springs is mounted at a 45 degree incline, has a thickness of 3.5 μm, and has a width of about 10 μm.

13. The tunable passband filter of claim 9, wherein the plurality of fixed MEMS bridges consists of four parallel plate MEMS bridges.

14. The tunable passband filter of claim 1, wherein each tunable MEMS bridge array is a third-order 3 dB ripple Chebyshev low-pass filter.

15. The tunable passband filter of claim 1, wherein the high impedance line has an electrical length of less than one quarter of the wavelength corresponding to the operating frequency of the tunable passband filter.

16. The tunable passband filter of claim 15, wherein the high impedance line has a length of 430 μm and an impedance of 94 ohms.

17. The tunable passband filter of claim 1, further comprising a dielectric layer formed between a transmission path of the tunable passband filter and bias lines for providing bias voltages to the first high-pass section, the second high-pass section, and the low pass section.

18. The tunable passband filter of claim 1, wherein the tunable bandpass filter is tunable between at least 27 GHz to 29 GHz in increments of about 0.5 GHz.

19. The tunable passband filter of claim 1, wherein the tunable MEMS switch arrays have a capacitance range of 400-450 fF and the tunable MEMS bridge array has a capacitance range of 150-170 fF for operating frequencies between 27 GHz and 29 GHz.

20. The tunable passband filter of claim 1, wherein the tunable MEMS switch arrays are configured to maintain a variation of contact resistance of 2.23 ohm or less when operated between 0.1-1 W of power and a variation of 13.3 fF or less when operated between 0.5-1 W of power for a duration of one billion cycles at operating frequencies between 27-29 GHz.

21. The tunable passband filter of claim 1, wherein the tunable MEMS bridge arrays are configured to maintain a variation of capacitance of 2.77 fF or less when operated between 0.1-1 W of power for a duration of one billion cycles at operating frequencies between 27-29 GHz.

22. The tunable passband filter of claim 1, wherein a center frequency of the tunable bandpass filter shifts by 0.49 GHz or less between biasing of the bridge array and biasing of the switch arrays when operating at 0.5 W power, and by 1.63 GHz or less between biasing of the bridge array and biasing of the switch arrays when operating at 1 W power at operating frequencies between 27-29 GHz.

23. The tunable passband filter of claim 1, wherein each individual MEMS switch of each tunable MEMS switch array has a return loss of 30 dB or more, an insertion loss of up to 0.94 dB, and isolation of 25 dB or more, for operating frequencies between 1-30 GHz.

24. The tunable passband filter of claim 23, wherein each tunable MEMS switch array has an average return loss of 21 dB or more, an average insertion loss of up to 0.58 dB, and an average isolation of 30.7 dB or more, for operating frequencies between 27-29 GHz.

25. The tunable passband filter of claim 1, wherein each tunable MEMS bridge array has a return loss of 15 dB or more and an insertion loss of up to 1 dB for operating frequencies between 1-30 GHz.

26. The tunable passband filter of claim 1, wherein the tunable passband filter produces 5 dB of insertion loss over a bandwidth of about 2.7 GHz for a center frequency of about 28.5 GHz for at least one billion cycles of the MEMS switches within the first and second tunable MEMS switch arrays of the tunable passband filter during operation at between 0.5-1 W.

27. The tunable passband filter of claim 26, wherein the tunable passband filter produces 5 dB of insertion loss over a bandwidth of about 4.1 GHz for a center frequency of about 29 GHz for at least one billion cycles of the MEMS switches within the first and second tunable MEMS switch arrays of the tunable passband filter during operation at between 0.5-1 W.

28. The tunable passband filter of claim 1, wherein the tunable bandpass filter is operable across at least one of a frequency band of 37-38.6 GHz or a frequency band of 38.6-40 GHz.

29. A tunable millimeter-wave oscillator comprising a tunable passband filter as recited in claim 1.

30. A tunable synthesizer operable across a range of millimeter-wave frequencies and comprising a tunable passband filter as recited in claim 1.

31. A tunable amplifier module comprising:
a filter module including a plurality of tunable bandpass filters as recited in claim 1;
an antenna switch; and
a low-noise-amplifier multiplexer module (LMM) including an LMM switch and an amplifier coupled to an output of the LMM switch, wherein each tunable bandpass filter of the filter module is connected to a respective output of the antenna switch and to a respective input of the LMM switch.

32. A method of fabricating a tunable passband filter comprising:
constructing a first high-pass section comprising a first tunable MEMS switch array comprising a first plurality of MEMS switches arranged in parallel between a first switch array input junction and a first switch array output junction, wherein a capacitance of the first tunable MEMS switch array varies as a function of a first bias voltage applied to the first plurality of MEMS switches;
providing a second high-pass section comprising a second tunable MEMS switch array comprising a second plurality of MEMS switches arranged in parallel between a second switch array input junction and a second switch array output junction, wherein a capacitance of the second tunable MEMS switch array varies as a function of a fourth bias voltage applied to the second plurality of MEMS switches;
providing a low-pass section comprising:
a high impedance line;
a first tunable MEMS bridge array comprising a first plurality of fixed MEMS bridges arranged in series between the first switch array output junction and a first end of the high impedance line, wherein a capacitance of the first tunable MEMS bridge array varies as a function of a second bias voltage applied to the first plurality of fixed MEMS bridges; and
a second tunable MEMS bridge array comprising a second plurality of fixed MEMS bridges arranged in series between the second switch array input junction and a second end of the high impedance line, wherein a capacitance of the second tunable MEMS bridge array varies as a function of a third bias voltage applied to the second plurality of fixed MEMS bridges,
wherein each of the first high-pass section, the second high-pass section, and the low-pass section are positioned between a signal input port configured to receiving an input radio frequency (RF) signal and a signal output port configured to transmit a filtered output RF signal, wherein the tunable passband filter is configured to filter the input RF signal to yield the filtered output RF signal.

33. The method of claim 32, wherein testing each of the first tunable MEMS switch array, the first tunable MEMS bridge array, the second tunable MEMS bridge array, and the second tunable MEMS switch array is performed at each of 27 GHz, 28 GHz and 29 GHz.

34. The method of claim 32, further comprising:
individually testing each of the first plurality of MEMS switches for operability before constructing the first tunable MEMS switch array;
individually testing each of the first plurality of fixed MEMS bridges for operability before constructing the first tunable MEMS bridge array;
individually testing each of the second plurality of fixed MEMS bridges for operability before constructing the second tunable MEMS bridge array; and
individually testing each of the second plurality of MEMS switches for operability before constructing the second tunable MEMS switch array.

35. The method of claim 34, wherein operability of an individual MEMS switch or bridge comprises actuation of said individual MEMS switch or bridge within a predetermined range of a point of stability.

36. The method of claim 32, further comprising individually testing each of the first tunable MEMS switch array, the first tunable MEMS bridge array, the second tunable MEMS bridge array, and the second tunable MEMS switch array prior to being assembled with one another.

37. The method of claim 36, wherein individually testing each of the first tunable MEMS switch array and the second tunable MEMS switch array comprises continuously varying RF power for operation between 0.1 and 1 W at a controlled bias voltage for biasing the switch array over a duration of 1 billion cycles for the MEMS switches.

38. The method of claim 37, wherein the controlled bias voltage is between 85 V and 105 V.

39. The method of claim 37, wherein the controlled bias voltage is between 40 V and 70 V.

40. The method of claim 32, wherein individually testing each of the first tunable MEMS bridge array and the second tunable MEMS bridge array comprises continuously varying RF power for operation between 0.1 and 1 W at a controlled bias voltage for biasing the switch array over a duration of 1 billion cycles for the MEMS switches.

41. The method of claim 32, further comprising:

in a first testing stage, tuning a passband frequency of the tunable passband filter by biasing at least one of the first and second tunable MEMS bridge arrays while a corresponding at least one of the first and second tunable MEMS switch arrays remain unbiased; and in a second testing stage, adjusting a fractional bandwidth of the tunable passband filter by biasing both the at least one of the first and second tunable MEMS bridge arrays and the at least one of the first and second tunable MEMS switch array.

42. The method of claim 41, wherein, in either the first testing stage or the second testing stage, one or both of the first and second tunable MEMS bridge arrays and the at least one of the first and second tunable MEMS switch arrays remains biased for between one to six hours.

43. The method of claim 32, further comprising individually testing each of the first tunable MEMS switch array, the first tunable MEMS bridge array, the second tunable MEMS bridge array, and the second tunable MEMS switch array prior to being assembled with one another.

* * * * *